(12) United States Patent
Morikado

(10) Patent No.: US 8,017,987 B2
(45) Date of Patent: Sep. 13, 2011

(54) SEMICONDUCTOR MEMORY DEVICE AND METHOD FOR MANUFACTURING THE SAME

(75) Inventor: Mutsuo Morikado, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 104 days.

(21) Appl. No.: 11/962,984

(22) Filed: Dec. 21, 2007

(65) Prior Publication Data

US 2008/0173929 A1     Jul. 24, 2008

(30) Foreign Application Priority Data

Dec. 22, 2006 (JP) ................................. 2006-346171

(51) Int. Cl.
*H01L 29/788* (2006.01)
(52) U.S. Cl. ................................. 257/315; 257/E29.129
(58) Field of Classification Search .................. 257/204, 257/206, 371, 374, 413, E27.062, E27.067, 257/E27.069, E27.108, E29.128, 315, 316
See application file for complete search history.

(56) References Cited

U.S. PATENT DOCUMENTS

| | | | | |
|---|---|---|---|---|
| 5,326,999 A | * | 7/1994 | Kim et al. | 257/315 |
| 5,793,081 A | * | 8/1998 | Tomioka et al. | 257/319 |
| 6,835,978 B2 | * | 12/2004 | Matsui et al. | 257/316 |
| 6,927,449 B2 | * | 8/2005 | Matsui et al. | 257/316 |
| 7,049,653 B2 | * | 5/2006 | Matsui et al. | 257/315 |
| 7,274,075 B2 | * | 9/2007 | Yaegashi | 257/391 |
| 7,563,664 B2 | * | 7/2009 | Ichige et al. | 438/201 |
| 2002/0052073 A1 | * | 5/2002 | Ito et al. | 438/201 |
| 2002/0088976 A1 | * | 7/2002 | Shin et al. | 257/68 |
| 2002/0158273 A1 | * | 10/2002 | Satoh et al. | 257/211 |
| 2006/0138558 A1 | * | 6/2006 | Morikado | 257/377 |
| 2007/0001213 A1 | * | 1/2007 | Om et al. | 257/315 |
| 2008/0048243 A1 | * | 2/2008 | Morikado | 257/316 |
| 2008/0188041 A1 | * | 8/2008 | Datta et al. | 438/151 |
| 2009/0186459 A1 | * | 7/2009 | Chen | 438/261 |

FOREIGN PATENT DOCUMENTS

JP    2002-176114    6/2002

OTHER PUBLICATIONS

Kinam Kim, et al. "Future outlook of NAND Flash Technology for 40nm Node and Beyond", IEEE, 2006, pp. 9-11.

* cited by examiner

*Primary Examiner* — Ha Tran T Nguyen
*Assistant Examiner* — Vongsavanh Sengdara
(74) *Attorney, Agent, or Firm* — Oblon, Spivak, McClelland, Maier & Neustadt, L.L.P.

(57) ABSTRACT

According to an aspect of the present invention, there is provided a semiconductor memory device including: a semiconductor substrate having: first device regions divided by first isolation films and second device regions divided by second isolation films a gate insulating film formed on the semiconductor substrate; a first element including: a first gate formed on the gate insulating film in the first device regions, a first inter-electrode insulating film formed on the first gate and on the first isolation films, and a second gate formed on the first inter-electrode insulating film; and a second element including: a third gate formed on the gate insulating film in the second device regions, and a fourth gate formed on the third gate and on the second isolation films; wherein a thickness of the third gate is larger than a thickness of the first gate.

16 Claims, 76 Drawing Sheets

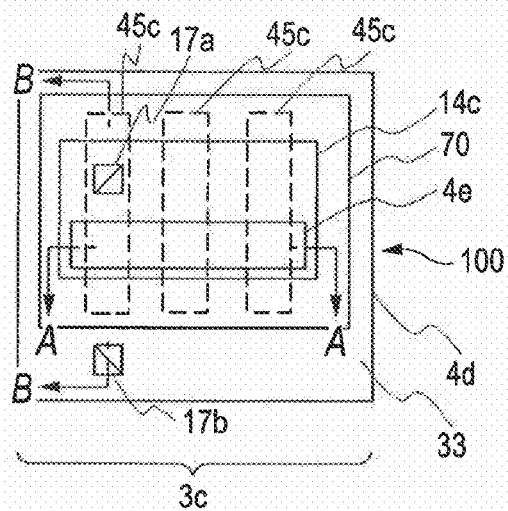
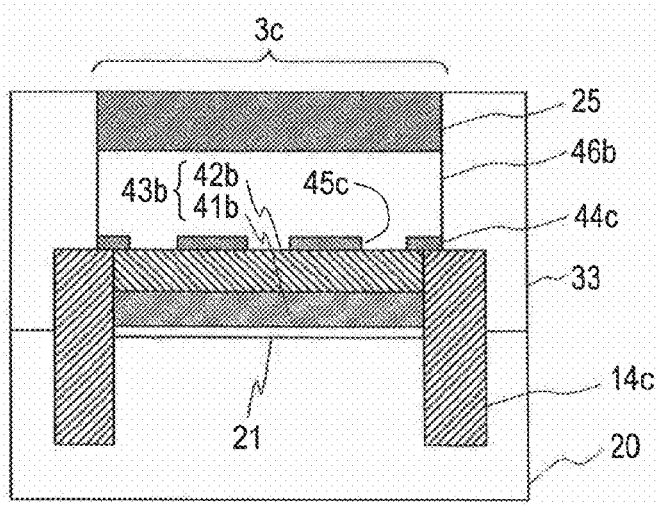
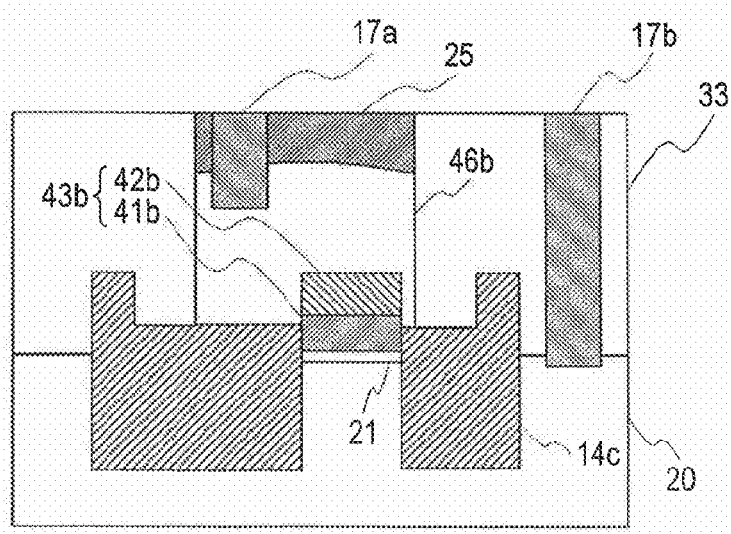

SEMICONDUCTOR MEMORY DEVICE AND METHOD FOR MANUFACTURING THE SAME

CROSS-REFERENCE TO RELATED APPLICATIONS

The entire disclosure of Japanese Patent Application No. 2006-346171 filed on Dec. 22, 2006 including specification, claims, drawings and abstract is incorporated herein by reference in its entirety.

BACKGROUND OF THE INVENTION

1. Field of the Invention

An aspect of the present invention relates to a semiconductor memory device and a method for manufacturing the same.

2. Description of the Related Art

NAND-type nonvolatile memories have a structure in which a plurality of memory cell transistors formed on element regions of a semiconductor substrate is serially connected to each other, and select gate transistors are arranged on both sides of the plurality of memory cell transistors. To simplify the manufacturing process steps for the NAND-type nonvolatile memories, the memory cell transistors and the select gate transistors are fabricated simultaneously (see JP-A-2002-176114, for example).

In the fabrication method, a first electrode layer is formed on a memory cell region and a select gate region of the semiconductor substrate. Then, an inter-electrode insulating film is formed on the first electrode layer. The inter-electrode insulating film of the select gate region is partially removed to form an opening that exposes a lower gate electrode layer, while the inter-electrode insulating film of the memory cell region is not removed. Next, a second electrode layer is formed on the semiconductor substrate so that, in the memory cell region, the first and second electrode layers are electrically isolated, and so that, in the select gate region, the first and second electrode layers are electrically connected through the opening. With this, a memory cell gate electrode having a double-layer gate structure including a floating gate electrode layer and a control gate electrode layer is formed in the memory cell region. Meanwhile, a select gate electrode having a single-layer gate structure in which a lower gate electrode layer and an upper gate electrode layer are electrically connected via the opening is formed in the select gate region.

Through the forming of the opening that exposes the lower gate electrode layer in the select gate region, a natural oxide film is formed on the exposed portion of the lower gate electrode layer, causing a conduction failure between the upper gate electrode layer and the lower gate electrode layer. In order to remove the natural oxide film, the exposed portion of the lower gate electrode layer is cleaned with hydrofluoric acid. However, at the time of removing the natural oxide film from the surface of the lower gate electrode layer, the portion of the element isolation insulating film exposed from the opening is also removed. Thus, there is a possibility that the upper surface of the element isolation insulating film exposed from the opening becomes lower than the surface of the semiconductor substrate. As a result, there is a fear that the lower gate electrode layer of the select gate region and the semiconductor substrate are short-circuited.

In the NAND-type nonvolatile memories, there is a problem, known as inter-cell interference, which is accompanied by miniaturization. To suppress the inter-cell interference, it is effective to decrease the thickness of the floating gate electrode layer of the memory cell transistor (see IEEE Non-Volatile Semiconductor Memory Workshop 2006, pages 9 to 11, for example).

However, when the thin floating gate electrode layer is subjected to the hydrofluoric acid cleaning, the following problems may arise. The removal of the inter-electrode insulating film in the select gate region is carried out on the element isolation insulating film as well as on the lower gate electrode layer. Therefore, the element isolation insulating film where the inter-electrode insulating film is removed is also removed by the hydrofluoric acid cleaning. Here, the element isolation insulating film is formed so as to be lower than the upper surface of the floating gate electrode layer in order to increase the capacitive coupling ratio between the control gate electrode layer and the floating gate electrode layer of the memory cell transistor in the memory cell region. Also, the element isolation insulating film is formed so as to protrude from the surface of the semiconductor substrate in order to prevent the control gate electrode layer of the memory cell transistor and the upper gate electrode layer of the select gate transistor from being short-circuited to the semiconductor substrate in the memory cell region and in the select gate region. In this case, if the thickness of the floating gate electrode layer is decreased in order to suppress the inter-cell interference, the element isolation insulating film is over-etched by the hydrofluoric acid cleaning, decreasing the amount of protrusion and thus lowering the upper surface of the element isolation insulating film to be lower than the surface of the semiconductor substrate. As a result, there is a fear that the lower gate electrode layer of the select gate region and the semiconductor substrate are short-circuited.

SUMMARY OF THE INVENTION

According to an aspect of the present invention, there is provided a semiconductor memory device including: a semiconductor substrate having: first device regions on which circuit elements having a double-layer gate structure is formed, and second device regions on which a circuit elements having a single-layer gate structure is formed; first element isolation insulating films that divide the first device regions with one another; second element isolation insulating films that divide the second device regions with one another; a gate insulating film formed on the semiconductor substrate; a first circuit element including: a first gate electrode layer formed on the gate insulating film in the first device regions, a first inter-electrode insulating film formed on the first gate electrode layer and on the first element isolation insulating films, and a second gate electrode layer formed on the first inter-electrode insulating film; and a second circuit element including: a third gate electrode layer formed on the gate insulating film in the second device regions, and a fourth gate electrode layer formed on the third gate electrode layer and on the second element isolation insulating films; wherein a thickness of the third gate electrode layer is larger than a thickness of the first gate electrode layer.

According to another aspect of the present invention, there is provided a method for manufacturing a semiconductor memory device, the method including: forming a gate insulating film on a semiconductor substrate having a first region in which a first circuit element having a double-layer gate structure is formed and a second region in which a second circuit element having a single-layer gate structure is formed; forming, in the first region, a first gate electrode layer on the gate insulating film; forming, in the second region, a third gate electrode layer having a thickness larger than that of the first gate electrode layer on the gate insulating film; forming, in the first and second regions, the element isolation grooves so as to penetrate through the first and third gate electrode layers and the gate insulating film and so as to reach into the semiconductor substrate; forming, in the first and second regions, first and second element isolation insulating films in the element isolation grooves, respectively; removing upper portions of the first and second element isolation insulating films so that upper surfaces of the first and second element isolation insulating films are aligned with an upper surface of the third gate electrode layer; selectively removing the upper portions of the first element isolation insulating films so that the upper surfaces of the first element isolation insulating films are lower than an upper surface of the first gate electrode layer; forming an inter-electrode insulating film on the first gate electrode layer and on the first element isolation insulating films; removing a natural oxide film formed on a surface of the third gate electrode layer; forming a second gate electrode layer on the inter-electrode insulating film; and forming a fourth gate electrode layer on the third gate electrode layer and on the second element isolation insulating films.

According to still another aspect of the present invention, there is provided a semiconductor memory device including: a semiconductor substrate; a gate insulating film formed on the semiconductor substrate; a double-layer gate electrode including: a first gate electrode that has a first thickness and that is formed on the gate insulating film, a first inter-electrode insulating film formed on the first gate electrode, and a second gate electrode formed on the first inter-electrode insulating film; and a single-layer gate electrode including: a third gate electrode that has a second thickness larger than the first thickness and that is formed on the gate insulating film, and a fourth gate electrode formed on the third gate electrode.

BRIEF DESCRIPTION OF THE DRAWINGS

Embodiments may be described in detail with reference to the accompanying drawings, in which:

FIG. 41A is a top view schematically showing the structure of a capacitor element of a NAND-type nonvolatile memory according to a third embodiment, FIG. 41B is a sectional view taken along the line A-A in FIG. 41A, and FIG. 41C is a sectional view taken along the line B-B in FIG. 41A;

DETAILED DESCRIPTION OF THE INVENTION

Figure 1A:
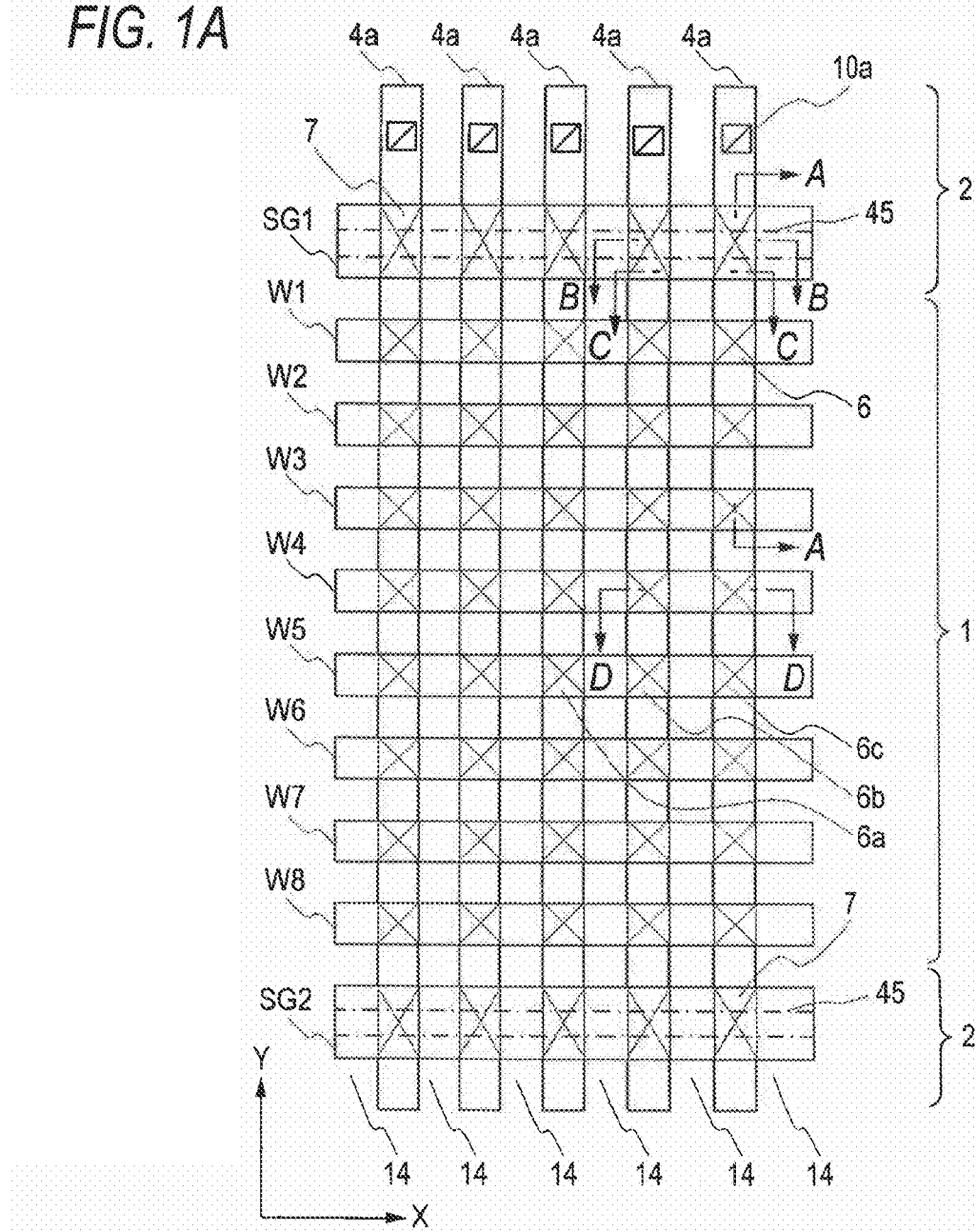
FIG. 1A is a top view schematically showing the structure of a memory cell region and a select gate region of a NAND-type nonvolatile memory according to a first embodiment.

Hereinafter, embodiments of the present invention will be described with reference to the accompanying drawings. In the drawings, identical or similar parts will be denoted by the same or similar reference numerals. Since the drawings are schematically shown, it should be noted that the relationship between thickness and planar dimension, thickness ratios of respective layers or the like are different from the actual ones. It goes without saying that the dimensional relationship and ratio may differ from drawing to drawing.

First Embodiment

A first embodiment is directed to a NAND-type nonvolatile memory in which the thickness of a third gate electrode layer of a select gate transistor and a MOS transistor is larger than the thickness of a first gate electrode layer of a memory cell transistor.

Figure 1B:
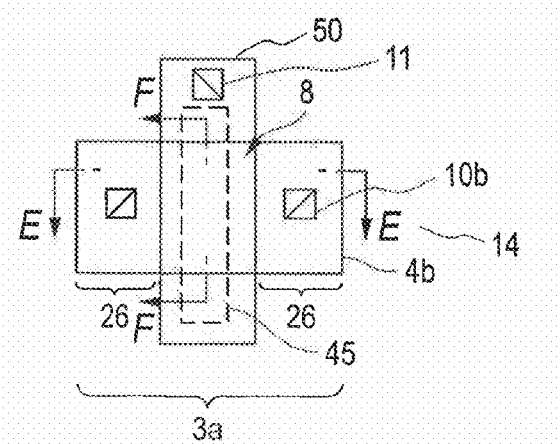
FIG. 1B is a top view schematically showing the structure of a MOS transistor of a peripheral circuit region of the NAND-type nonvolatile memory according to the first embodiment.

FIGS. 1A and 1B are views schematically showing the structure of a NAND-type nonvolatile memory according to the first embodiment, in which FIG. 1A is a top view of a memory cell region and a select gate region, and FIG. 1B is a top view of a peripheral circuit region. As used herein, the term, "memory cell region," refers to a region on which a first circuit element, i.e., a memory cell transistor, is disposed, and is also referred to as a first region. The term, "select gate region," refers to a region on which a second circuit element, i.e., a select gate transistor, is disposed, and is also referred to as a second region. The term, "peripheral circuit region," refers to a region on which a third circuit element, i.e., a peripheral circuit element such as a MOS transistor that is disposed outside the memory cell region and drives the memory cell transistor or the select gate transistor, and is also referred to as a second region. In addition, the term, "third circuit element," refers to a MOS transistor, a resistor element, a capacitor element, and other dummy patterns.

As shown in FIG. 1A, in a memory cell region 1 and a select gate region 2, a plurality of lines of active areas 4a serving as an element forming region is parallely arranged in stripes along the Y direction in the drawing with an element isolation insulating film 14 interposed between adjacent lines. In the memory cell region 1, a plurality of lines of word lines W1, W2, . . . , and W8 is parallely arranged in stripes along the X direction in the drawing, perpendicular to the Y direction. At each intersection of the active areas 4a and the word lines W1, W2, ..., and W8, a memory cell transistor 6 is formed.

In the select gate region 2 close to the word line W1, a select gate SG1 is formed parallel to the word line W1. In the select gate region 2 close to the word line W8, a select gate SG2 is formed parallel to the word line W8. At each intersection of the select gates SG1 and SG2 and the active areas 4a, a select gate transistor 7 for designating a memory cell block to be accessed is disposed. As used herein, the term, "memory cell block," refers to a region that includes the memory cell transistors 6 sandwiched between arbitrary select gate transistors 7. On each of the active areas 4a outside the select gate transistors 7, a contact 10a that connects the memory cell transistor 6 to a bit line (not shown) is disposed. Under each of the select gates SG1 and SG2, an inter-electrode insulating film to be described later is disposed. The inter-electrode insulating film has an opening 45 with a width smaller than that of the select gates SG1 and SG2 and extending the total length of the select gates SG1 and SG2. Although this embodiment describes and illustrates the memory cell blocks each having eight word lines, an arbitrary number, such as 16, 32, or more, of word lines may be provided. Similarly, an arbitrary number, such as five, or more, of active areas 4a may be provided.

Next, the improvement on the inter-cell interference accompanied by the higher integration will be described using the NAND-type nonvolatile memory as an example. As used herein, the term, "inter-cell interference," refers to a phenomenon in which data written to an intended memory cell changes when data is written to other memory cell adjacent to the intended memory cell. For example, for the memory cell transistors 6a, 6b and 6c that are formed at the intersections of the word line W5 and the active areas 4a, the case can be contemplated in which electric charges are injected to the floating gates of the memory cell transistors 6a and 6c in a state that electric charges are not injected to the floating gate of the memory cell transistor 6b. In this case, a high electric field is generated when the electric charges are injected to the memory cell transistors 6a and 6c. The high electric field causes electric charges to be injected to the floating gate of the memory cell transistor 6b, thus changing the data written in the memory cell transistor 6b. Such a phenomenon becomes conspicuous as the distance between memory cells decreases with the miniaturization because the influence of the electric field generated at the time of writing data to the adjacent memory cell increases.

Figure 2A:
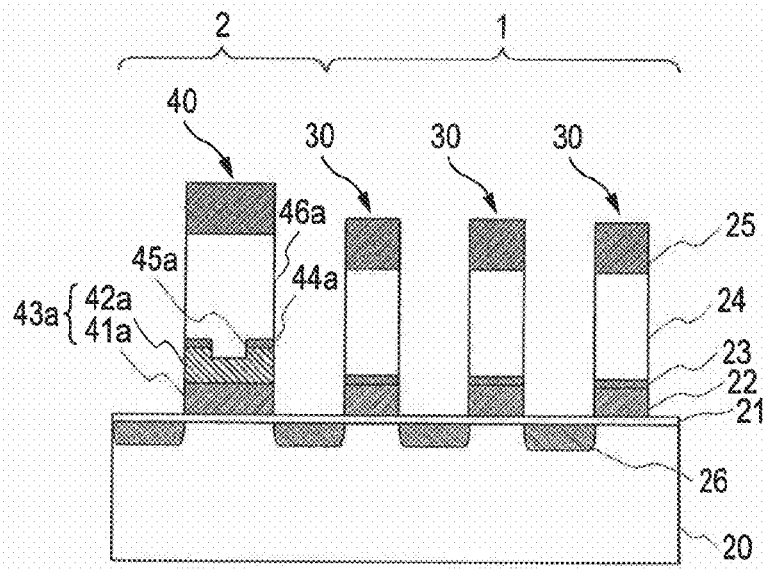
FIG. 2A is a sectional view taken along the line A-A in FIG. 1A.
Figure 2B:
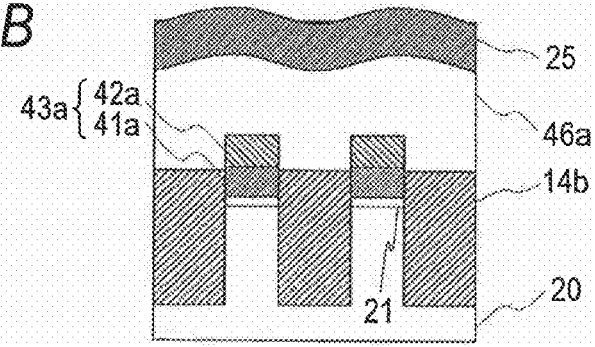
FIG. 2B is a sectional view taken along the line B-B in FIG. 1A.
Figure 2C:
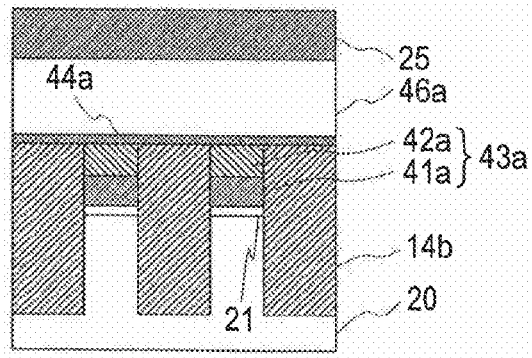
FIG. 2C is a sectional view taken along the line C-C in FIG. 1A.
Figure 2D:
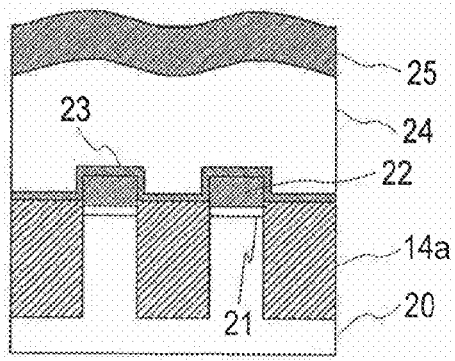
FIG. 2D is a sectional view taken along the line D-D in FIG. 1A.
Figure 3A:
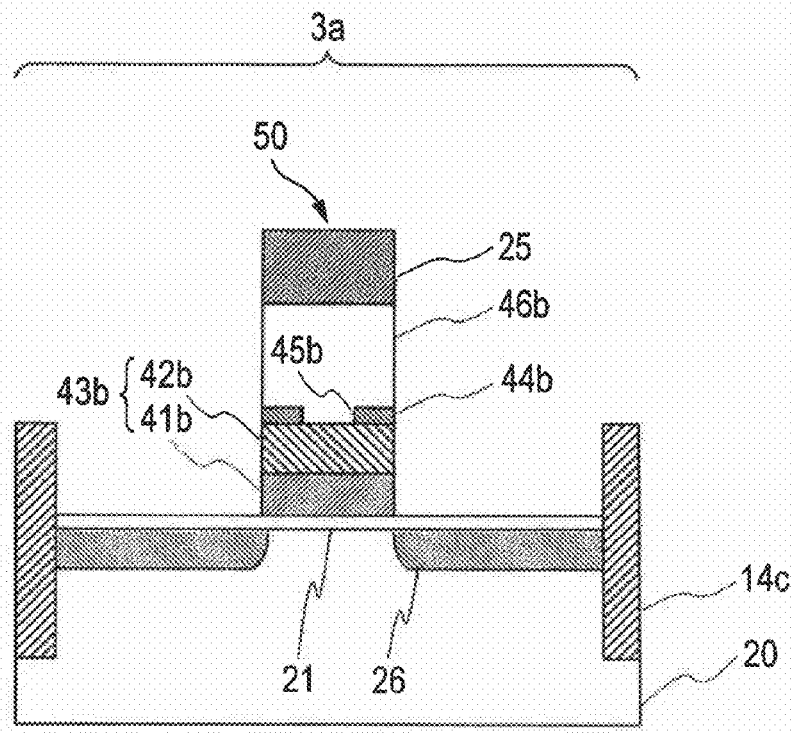
FIG. 3A is a sectional view taken along the line E-E in FIG. 1B.
Figure 3B:
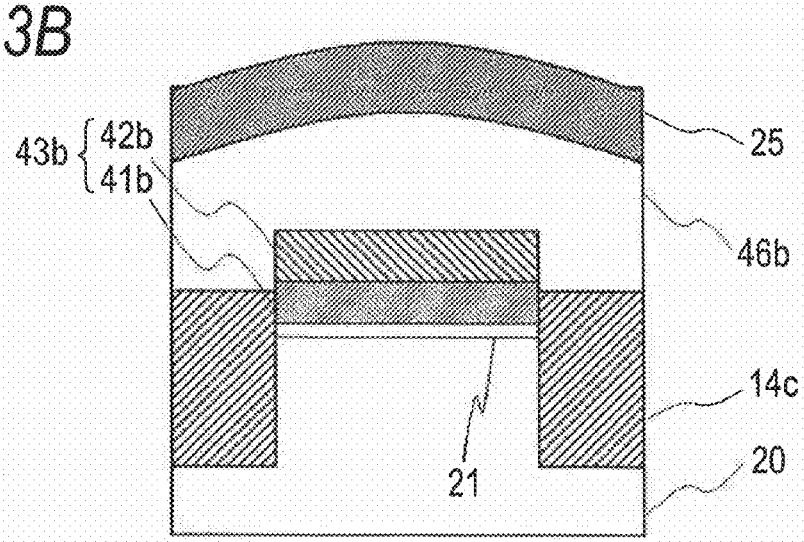
FIG. 3B is a sectional view taken along the line F-F in FIG. 1B.

As shown in FIG. 1B, in a peripheral circuit region 3a, there are provided a single active area 4b surrounded by the element isolation insulating film 14, and a single gate electrode 50 disposed on the active area 4b so as to across the active area 4b and reach the element isolation insulating film 14. At the intersection of the active area 4b and the gate electrode 50, a MOS transistor 8 is formed. On the active area 4b, impurity diffusion layer regions 26 serving as a source/drain region are formed with the gate electrode 50 interposed between adjacent diffusion layer regions. On each of the impurity diffusion layer regions 26, a contact 10b that electrically connects the impurity diffusion layer region 26 to a metal wiring (not shown) is formed. Also, a contact 11 is formed on the gate electrode 50 so that the gate electrode 50 is electrically connected to a metal wiring (not shown) via the contact 11. Within the gate electrode 50, an inter-electrode insulating film to be described later is provided having an opening 45 and continuously formed over the active area 4b and the region of the element isolation insulating film 14. Although this embodiment describes and illustrates only one MOS transistor 8, a plurality of MOS transistors may be provided. The opening may have an arbitrary shape as long as the opening removes at least a portion of an inside of the gate electrode 50. FIGS. 2A to 2D and 3A to 3B are sectional views schematically showing the structure of the NAND-type nonvolatile memory of the first embodiment, in which FIG. 2A is a sectional view taken along the line A-A in FIG. 1A, FIG. 2B is a sectional view taken along the line B-B in FIG. 1A, FIG. 2C is a sectional view taken along the line C-C in FIG. 1A, FIG. 2D is a sectional view taken along the line D-D in FIG. 1A, FIG. 3A is a sectional view taken along the line E-E in FIG. 1B, and FIG. 3B is a sectional view taken along the line F-F in FIG. 1B. Those parts identical or similar to those of FIGS. 1A and 1B will be denoted by the same or similar reference numerals and thus descriptions thereof will be omitted.

As shown in FIGS. 2A to 2D and 3A to 3B, a gate insulating film 21 is formed on a semiconductor substrate 20 of the memory cell region 1, the select gate region 2, and the peripheral circuit region 3a. On the gate insulating film 21 of the memory cell region 1, a plurality of gate electrodes 30 of the memory cell transistors 6 are formed at predetermined intervals. Each of the gate electrodes 30 of the memory cell transistors 6 includes a first gate electrode layer (a floating gate electrode layer) 22 formed on the gate insulating film 21, a first inter-electrode insulating film 23 formed on the first gate electrode layer 22, and a second gate electrode layer (a control gate electrode layer) 24 formed on the first inter-electrode insulating film 23. On the second gate electrode layer 24, an insulating film 25 formed of, for example, a silicon nitride film is formed. With this arrangement, the gate electrodes 30 of the memory cell transistors 6 have a double-layer gate structure in which the first gate electrode layer 22 and the second gate electrode layer 24 are electrically isolated from each other by the first inter-electrode insulating film 23. The impurity diffusion layer regions 26 are formed in the near-surface of the semiconductor substrate 20 with the gate electrodes 30 of the memory cell transistors 6 interposed between adjacent diffusion layer regions.

On the gate insulating film 21 of the select gate region 2, a gate electrode 40 of the select gate transistor 7 is formed. The gate electrode 40 of the select gate transistor 7 includes a lower gate electrode layer (a third gate electrode layer) 43a including a first lower gate electrode layer 41a formed on a gate insulating film 21b and having the same thickness as the first gate electrode layer 22 and a second lower gate electrode layer 42a formed on the first lower gate electrode layer 41a, a second inter-electrode insulating film 44a formed on the second lower gate electrode layer 42a and having the same thickness as the first inter-electrode insulating film 23, and an upper gate electrode layer (a fourth gate electrode layer) 46a formed on the second inter-electrode insulating film 44a and having the same thickness as the second gate electrode layer 24. The second inter-electrode insulating film 44a has an opening 45a that exposes the surfaces of the second lower gate electrode layer 42a and a second element isolation insulating film 14b described later. The width of the opening 45a is smaller than the width of the second lower gate electrode layer 42a. On the surface of the second lower gate electrode layer 42a exposed from the opening 45a, an upper gate electrode layer 46a is formed. The insulating film 25 is formed on the upper gate electrode layer 46a. With this arrangement, the gate electrode 40 of the select gate transistor 7 has a single-layer gate structure in which the upper gate electrode layer 46a and the lower gate electrode layer 43a are electrically connected to each other. The impurity diffusion layer regions 26 are also formed in the near-surface of the semiconductor substrate 20 with the gate electrode 40 of the select gate transistor 7 interposed between adjacent diffusion layer regions.

Here, when comparing the gate electrodes 30 of the memory cell transistors 6 and the gate electrode 40 of the select gate transistor 7 with each other, the height of the second inter-electrode insulating film 44a of the select gate transistor 7 as observed from the upper surface of the semiconductor substrate 20 is higher than the height of the first inter-electrode insulating film 23 of the memory cell transistor 6 by the amount corresponding to the thickness of the second lower gate electrode layer 42a. That is, the thickness of the lower gate electrode layer 43a of the select gate transistor 7 is larger than the thickness of the first gate electrode layer 22 of the memory cell transistor 6.

As shown in FIGS. 2B to 2D, element isolation trenches are formed on portions of the semiconductor substrate 20 outside the active areas 4a and 4b on which an element isolation insulating film 14 is to be formed. The element isolation insulating film 14 is buried in the element isolation trenches so as to protrude from the upper surface of the semiconductor substrate 20. In this embodiment, the element isolation insulating film 14 that isolates the memory cell transistors 6 of the memory cell region 1 from each other is referred to as the first element isolation insulating film 14a, and the element isolation insulating film 14 that isolates the select gate transistors 7 of the select gate region 2 is referred to as the second element isolation insulating film 14b.

As shown in FIG. 2B, in the opening 45a of the second inter-electrode insulating film 44a of the select gate region 2, the upper gate electrode layer (a fourth gate electrode layer) 46a is directly formed on the upper surface of the second element isolation insulating film 14b that includes the upper surface of the lower gate electrode layer 43a. The height of the upper surface of the second element isolation insulating film 14b as observed from the upper surface of the semiconductor substrate 20 is lower than the height of the upper surface of the lower gate electrode layer 43a and higher than the height of the upper surface of the semiconductor substrate 20.

As shown in FIG. 2C, in other areas outside the opening 45a of the second inter-electrode insulating film 44a, the upper gate electrode layer 46a is formed above the upper surface of the second element isolation insulating film 14b and above the upper surface of the lower gate electrode layer 43a, through the second inter-electrode insulating film 44a interposed therebetween. The height of the upper surface of the second element isolation insulating film 14b as observed from the upper surface of the semiconductor substrate 20 is substantially the same as the height of the upper surface of the lower gate electrode layer 43a.

As shown in FIG. 2D, in the memory cell region 1, the height of the upper surface of the first element isolation insulating film 14a as observed from the upper surface of the semiconductor substrate 20 is lower than the height of the upper surface of the first gate electrode layer 22. The first inter-electrode insulating film 23 is formed on the surfaces of the first inter-electrode insulating film 14a and the first gate electrode layer 22, and the second gate electrode layer 24 is formed above the surfaces of the first gate electrode layer 22 and the first element isolation insulating film 14a, through the first inter-electrode insulating film 23 interposed therebetween.

As shown in FIG. 3A, in the peripheral circuit region 3a, the gate electrode 50 of the MOS transistor 8 is formed. The gate electrode 50 of the MOS transistor 8 includes, similar to the gate electrodes 40 of the select gate region 2, a lower gate electrode layer (a third gate electrode layer) 43b including a first lower gate electrode layer 41b formed above the semiconductor substrate 20 with a gate insulating film 21 interposed therebetween and having the same thickness as the first gate electrode layer 22 and a second lower gate electrode layer 42b formed on the first lower gate electrode layer 41b and having the same thickness as the second lower gate electrode layer 42a, a second inter-electrode insulating film 44b formed on the lower gate electrode layer 43b, and an upper gate electrode layer (a fourth gate electrode layer) 46b formed on the second inter-electrode insulating film 44b. On the upper gate electrode layer 46b, the insulating film 25 formed of, for example, a silicon nitride film is formed. The second inter-electrode insulating film 44b has an opening 45b that exposes the surfaces of the second lower gate electrode layer 42b and a second element isolation insulating film 14c described later. The width of the opening 45b is smaller than the width of the second lower gate electrode layer 42b. On the surface of the second lower gate electrode layer 42b exposed from the opening 45b, an upper gate electrode layer 46b is formed. With this arrangement, the gate electrode 50 of the peripheral circuit region 3a has a single-layer gate structure in which the upper gate electrode layer 46b and the lower gate electrode layer 43b are electrically connected to each other. The impurity diffusion layer regions 26 are also formed in the near-surface of the semiconductor substrate 20 with the gate electrode 50 of the MOS transistor 8 interposed between adjacent diffusion layer regions.

As shown in FIG. 3B, an element isolation trenches is formed on a portion of the semiconductor substrate 20 outside the active area 4b of the peripheral circuit region 3a. The element isolation insulating film 14 is buried in the element isolation trenches so as to protrude from the upper surface of the semiconductor substrate 20. In this embodiment, the element isolation insulating film 14 that isolates the memory cell transistor 8 of the MOS transistor 8 is referred to as the second element isolation insulating film 14c. Similar to the case of the select gate region 2, the height of the upper surface of the second element isolation insulating film 14c on which the upper gate electrode layer 46b is formed, as observed from the upper surface of the semiconductor substrate 20, is lower than the height of the upper surface of the lower gate electrode layer 43b.

Figure 4:
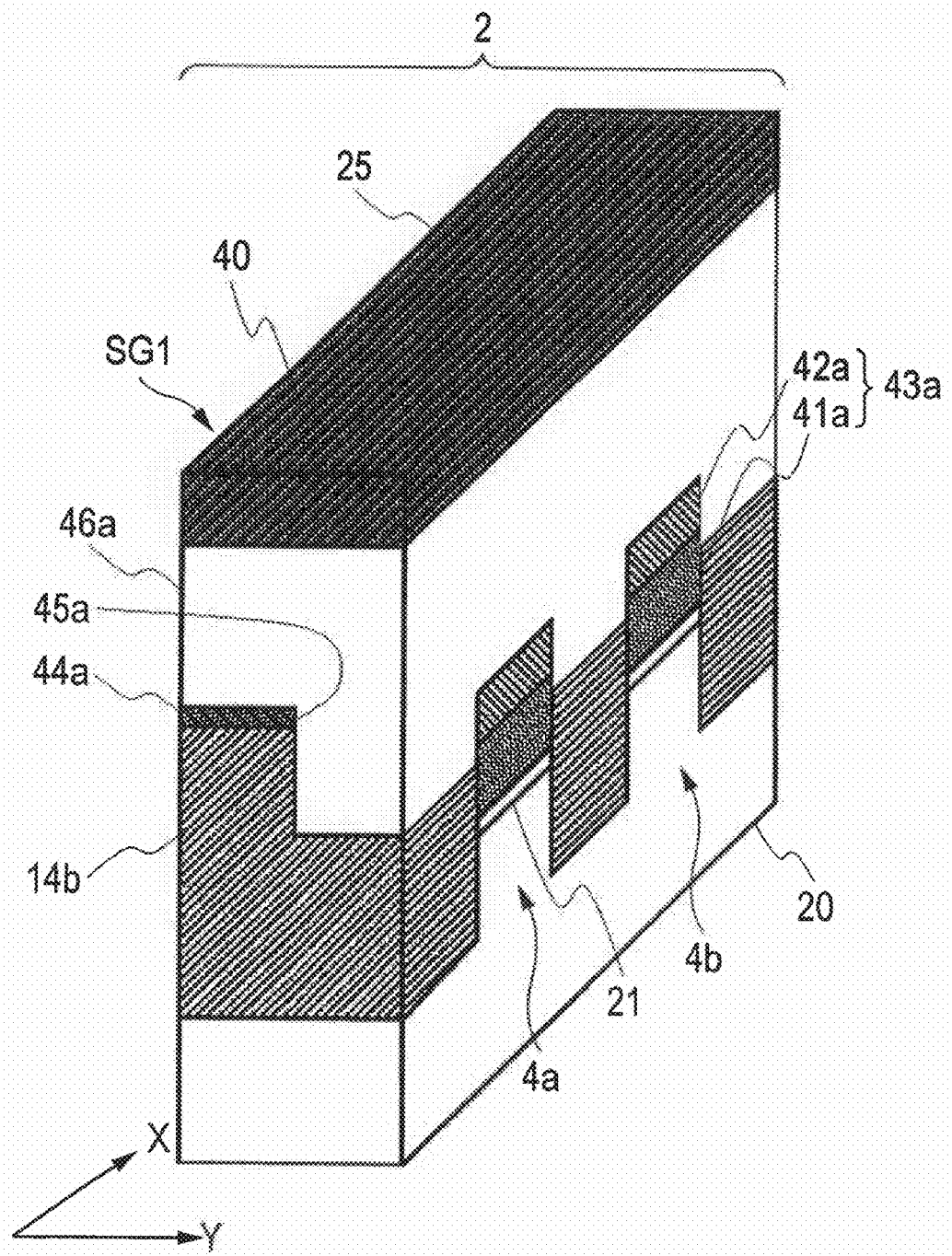
FIG. 4 is a perspective view schematically showing a select gate transistor of the NAND-type nonvolatile memory according to the first embodiment.
Figure 5A:
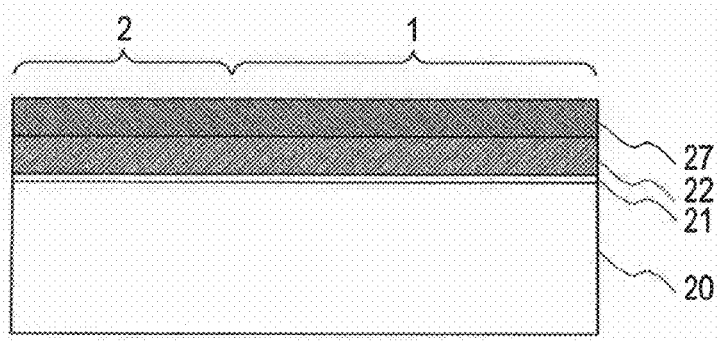
FIGS. 5A to 5D are sectional views schematically showing the fabrication process steps of the NAND-type nonvolatile memory according to the first embodiment.
Figure 5B:
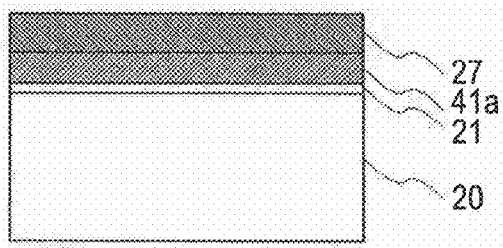
Figure 5C:
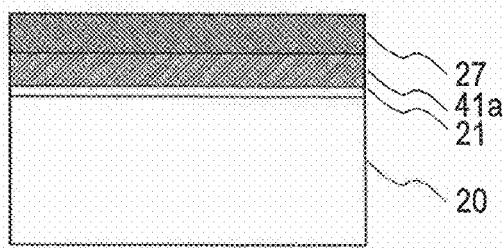
Figure 5D:
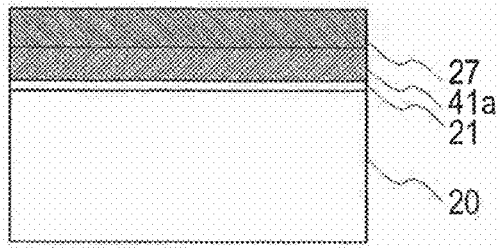
Figure 6A:
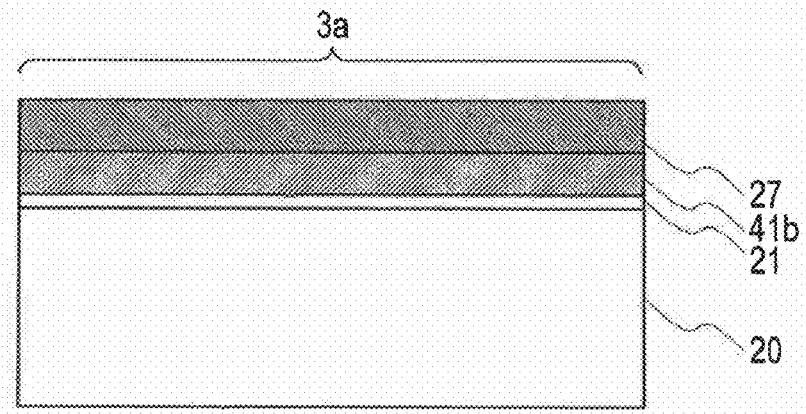
FIGS. 6A and 6B are sectional view schematically showing the fabrication process steps of the NAND-type nonvolatile memory according to the first embodiment.
Figure 6B:
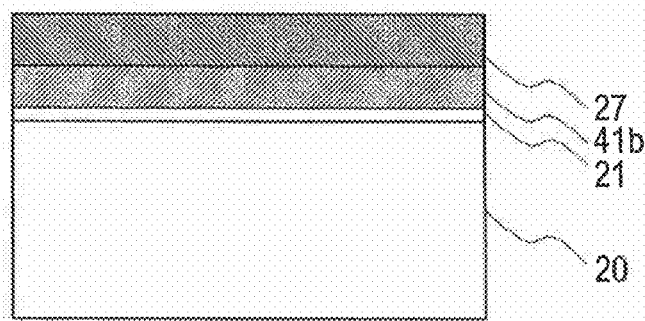
Figure 7A:
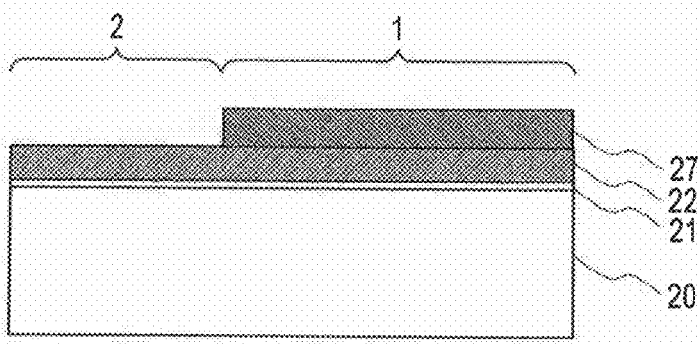
FIGS. 7A to 7D are sectional views schematically showing the fabrication process steps of the NAND-type nonvolatile memory according to the first embodiment, subsequent to those shown in FIGS. 5A to 5D.
Figure 7B:
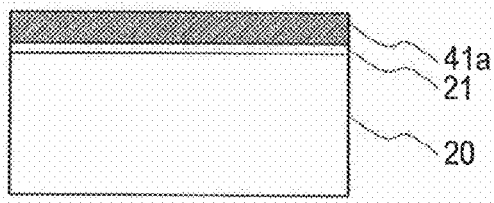
Figure 7C:
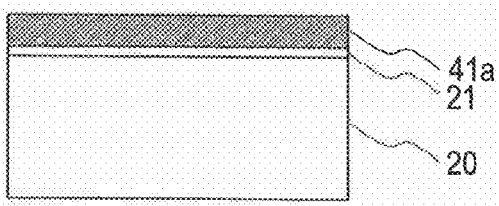
Figure 7D:
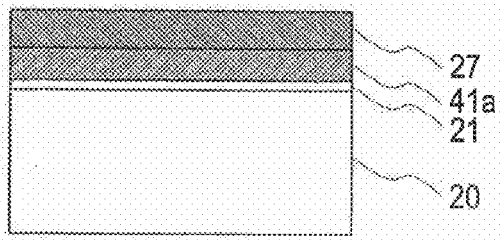
Figure 8A:
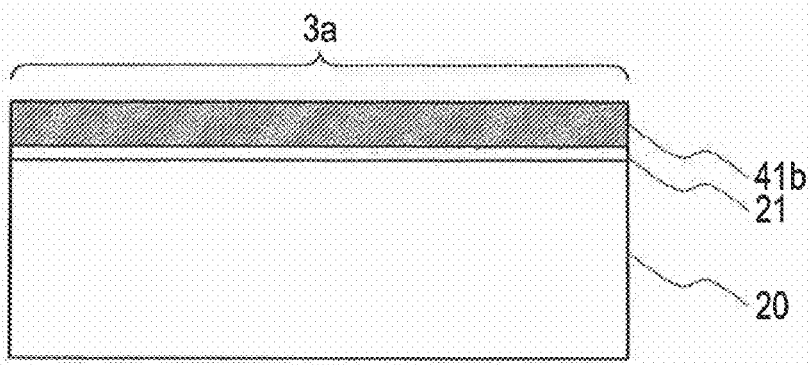
FIGS. 8A and 8B are sectional view schematically showing the fabrication process steps of the NAND-type nonvolatile memory according to the first embodiment, subsequent to those shown in FIGS. 6A and 6B.
Figure 8B:
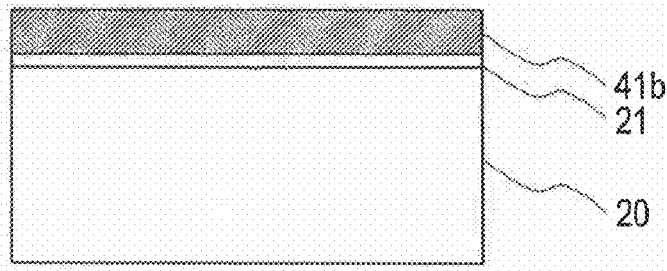
Figure 9A:
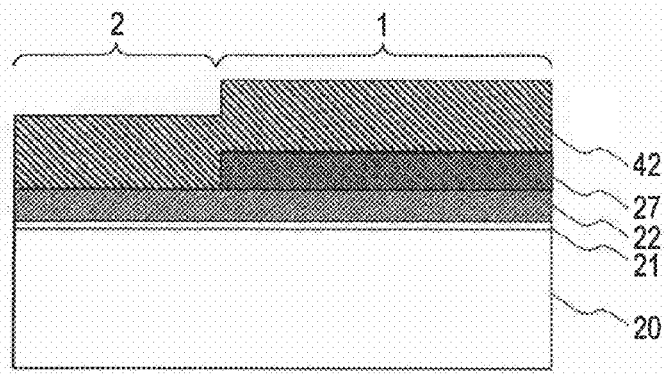
FIGS. 9A to 9D are sectional views schematically showing the fabrication process steps of the NAND-type nonvolatile memory according to the first embodiment, subsequent to those shown in FIGS. 7A to 7D.
Figure 9B:
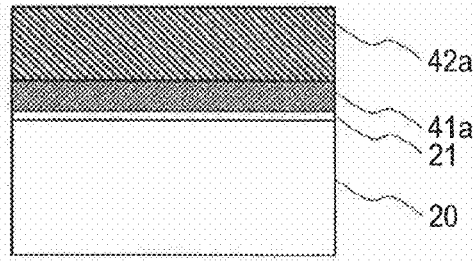
Figure 9C:
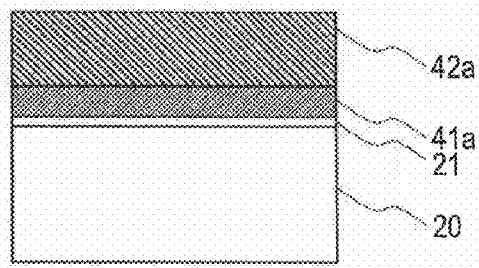
Figure 9D:
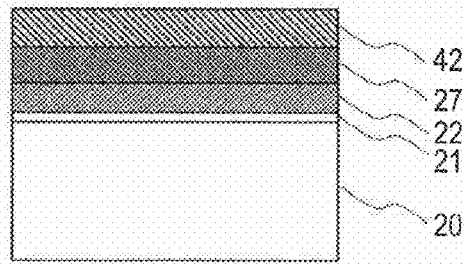
Figure 10A:
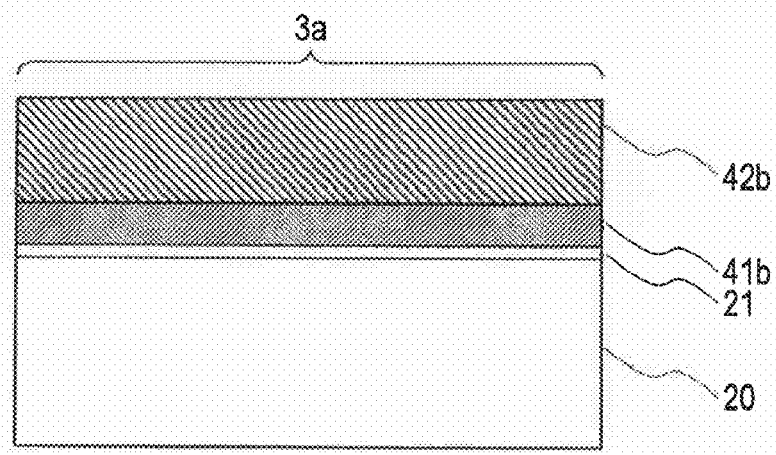
FIGS. 10A and 10B are sectional view schematically showing the fabrication process steps of the NAND-type nonvolatile memory according to the first embodiment, subsequent to those shown in FIGS. 8A and 6B.
Figure 10B:
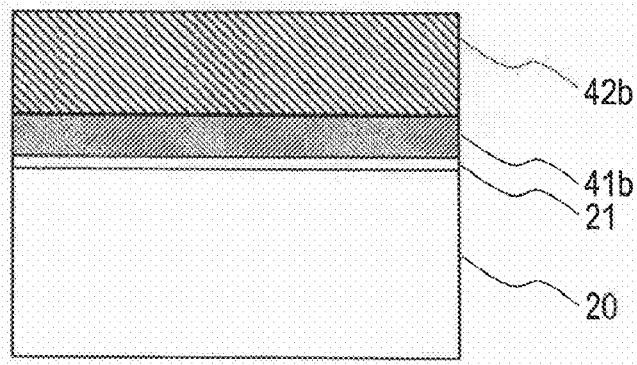
Figure 11A:
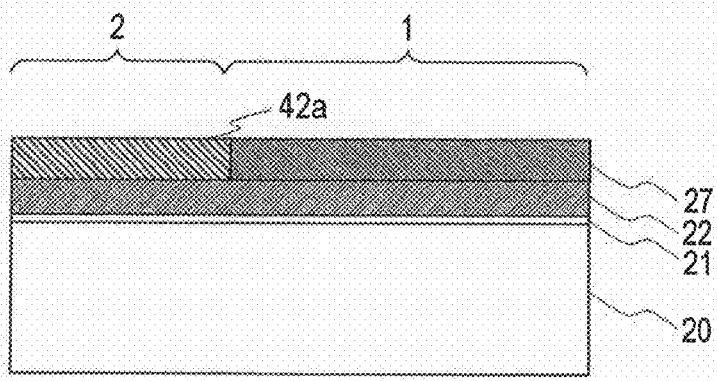
FIGS. 11A to 11D are sectional views schematically showing the fabrication process steps of the NAND-type nonvolatile memory according to the first embodiment, subsequent to those shown in FIGS. 9A to 9D.
Figure 11B:
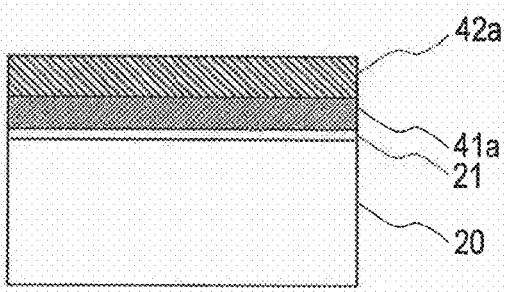
Figure 11C:
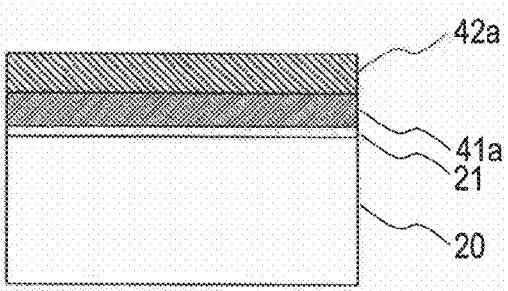
Figure 11D:
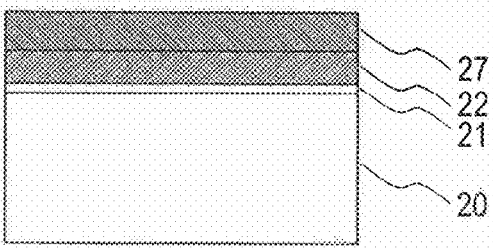
Figure 12A:
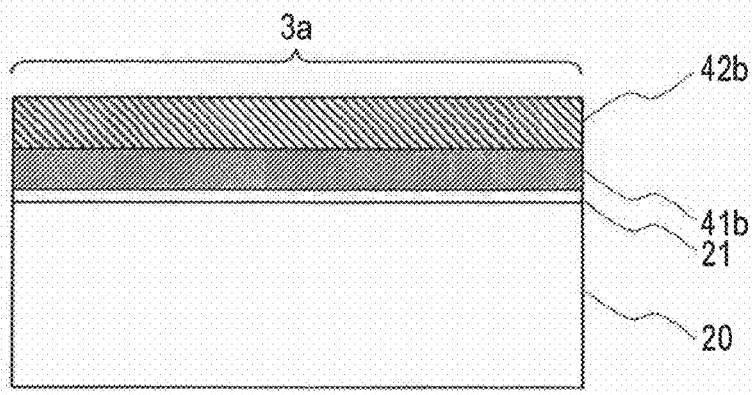
FIGS. 12A and 12B are sectional view schematically showing the fabrication process steps of the NAND-type nonvolatile memory according to the first embodiment, subsequent to those shown in FIGS. 10A and 10B.
Figure 12B:
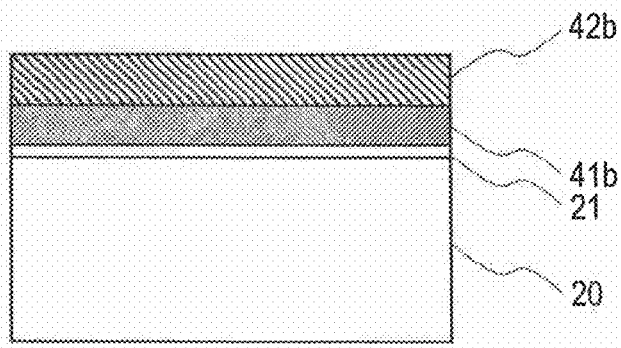
Figure 13A:
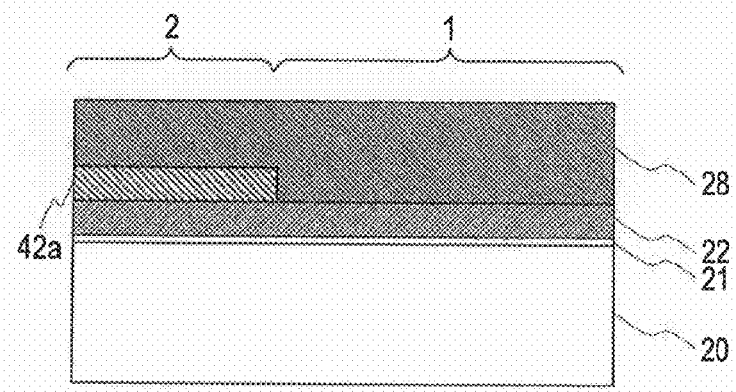
FIGS. 13A to 13D are sectional views schematically showing the fabrication process steps of the NAND-type nonvolatile memory according to the first embodiment, subsequent to those shown in FIGS. 11A to 11D.
Figure 13B:
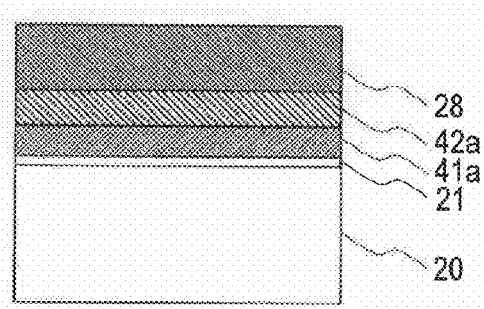
Figure 13C:
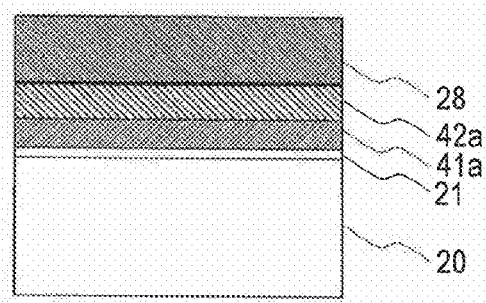
Figure 13D:
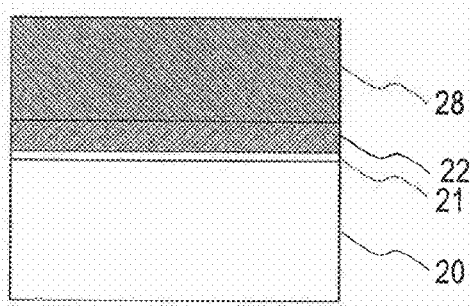
Figure 14A:
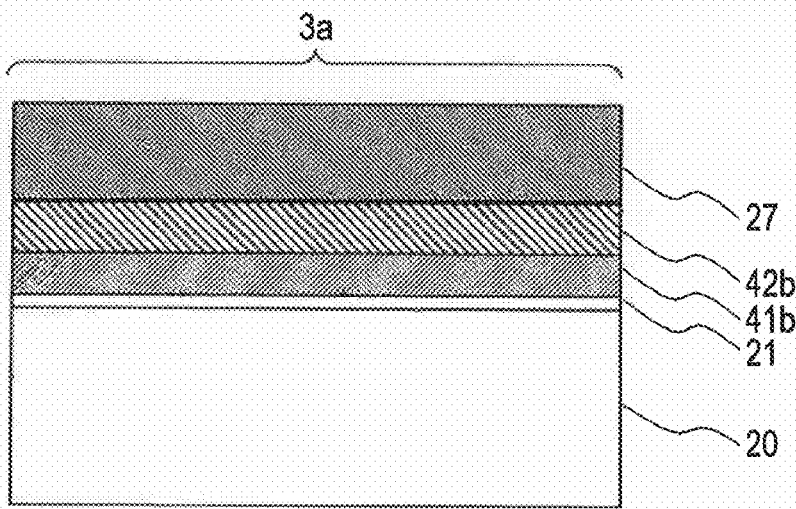
FIGS. 14A and 14B are sectional view schematically showing the fabrication process steps of the NAND-type nonvolatile memory according to the first embodiment, subsequent to those shown in FIGS. 12A and 12B.
Figure 14B:
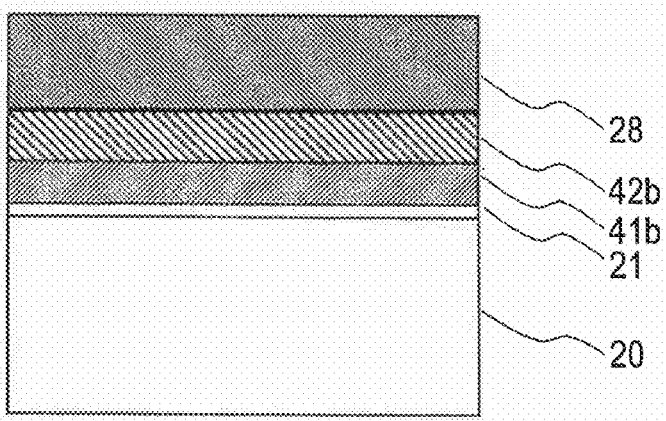
Figure 15A:
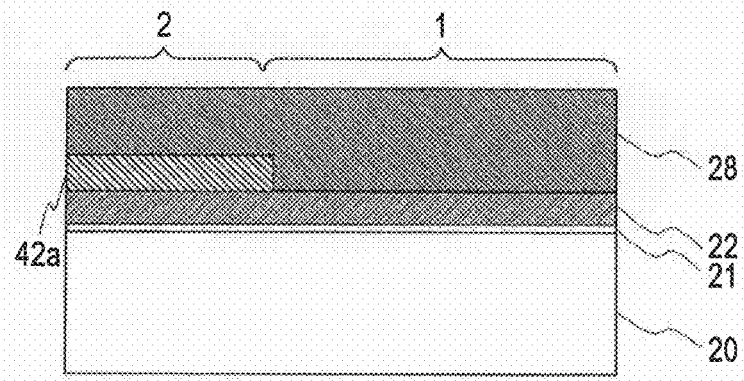
FIGS. 15A to 15D are sectional views schematically showing the fabrication process steps of the NAND-type nonvolatile memory according to the first embodiment, subsequent to those shown in FIGS. 13A to 13D.
Figure 15B:
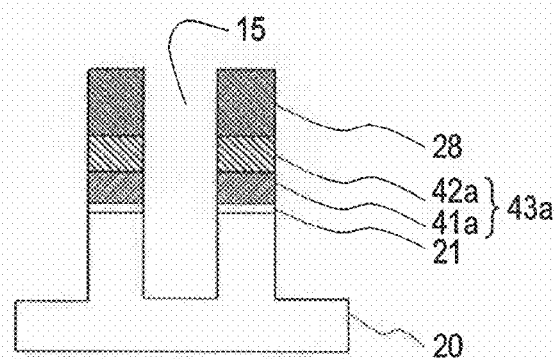
Figure 15C:
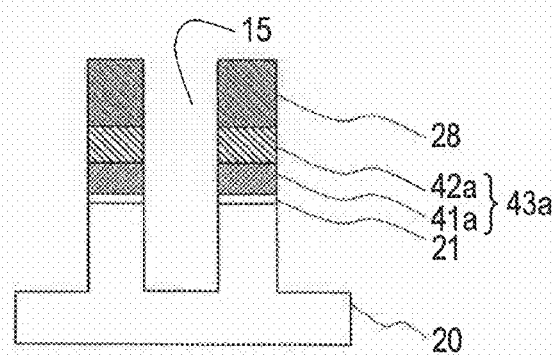
Figure 15D:
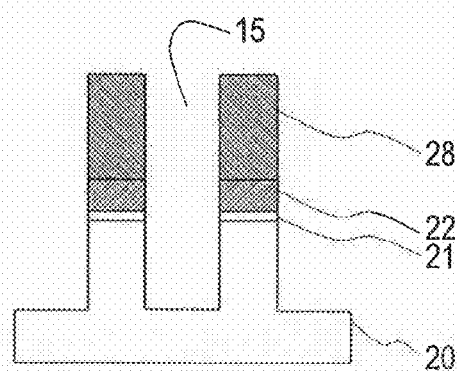
Figure 16A:
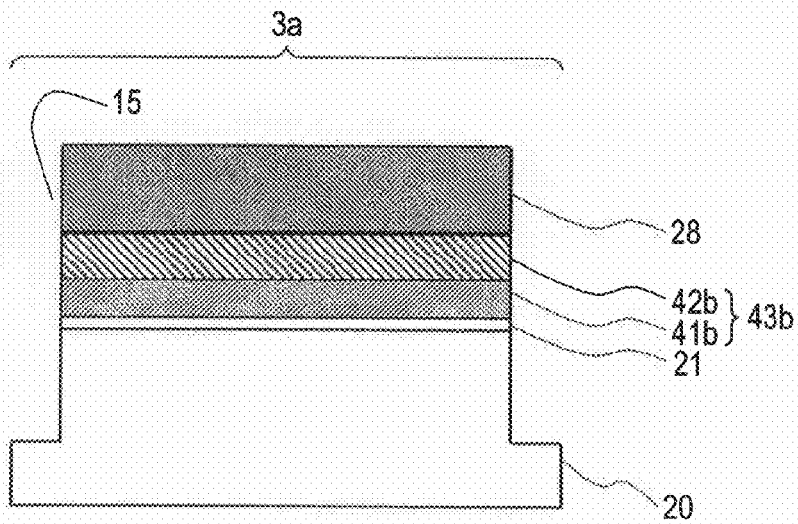
FIGS. 16A and 16B are sectional view schematically showing the fabrication process steps of the NAND-type nonvolatile memory according to the first embodiment, subsequent to those shown in FIGS. 14A and 14B.
Figure 16B:
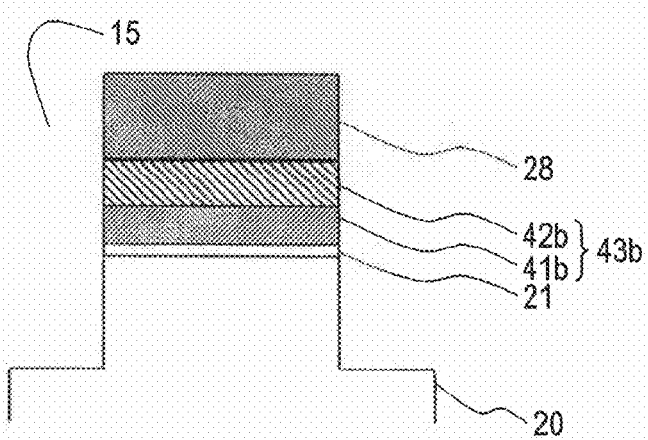
Figure 17A:
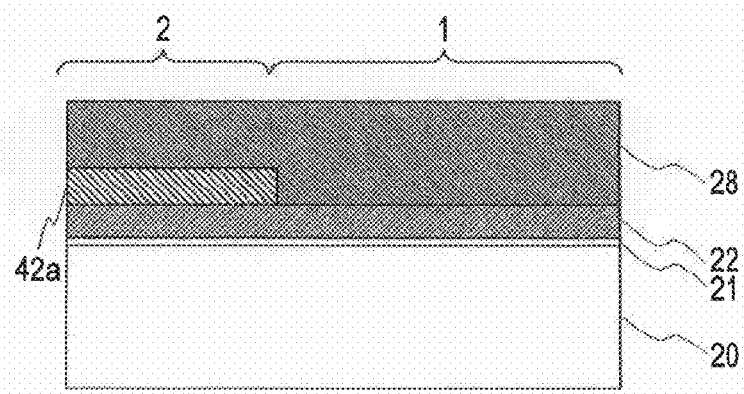
FIGS. 17A to 17D are sectional views schematically showing the fabrication process steps of the NAND-type nonvolatile memory according to the first embodiment, subsequent to those shown in FIGS. 15A to 15D.
Figure 17B:
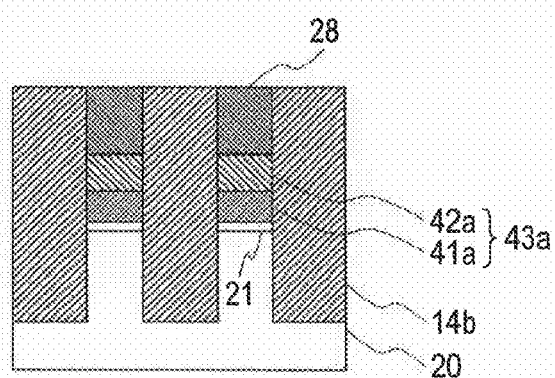
Figure 17C:
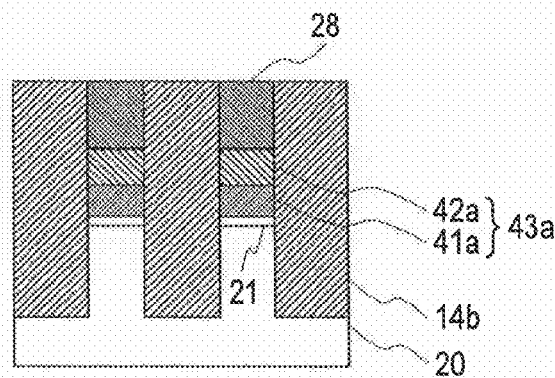
Figure 17D:
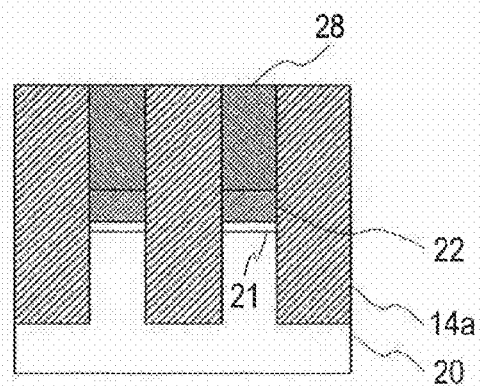
Figure 18A:
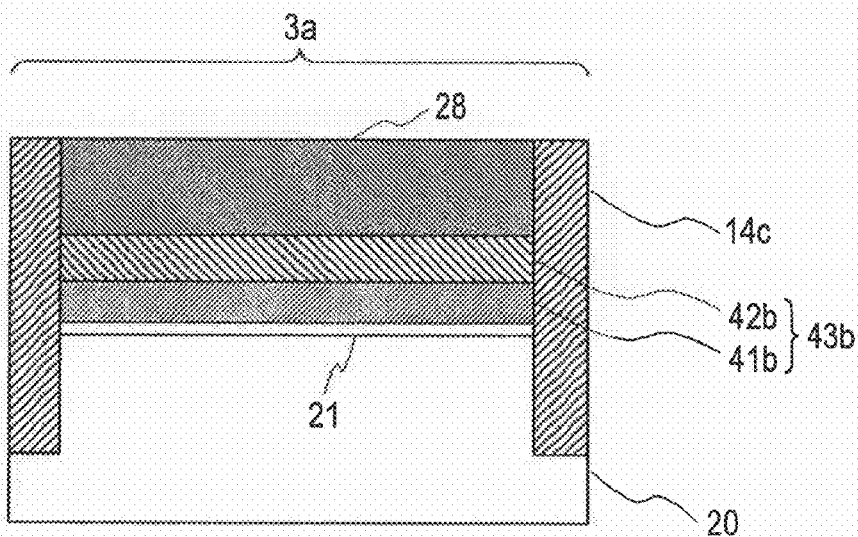
FIGS. 18A and 18B are sectional view schematically showing the fabrication process steps of the NAND-type nonvolatile memory according to the first embodiment, subsequent to those shown in FIGS. 16A and 16B.
Figure 18B:
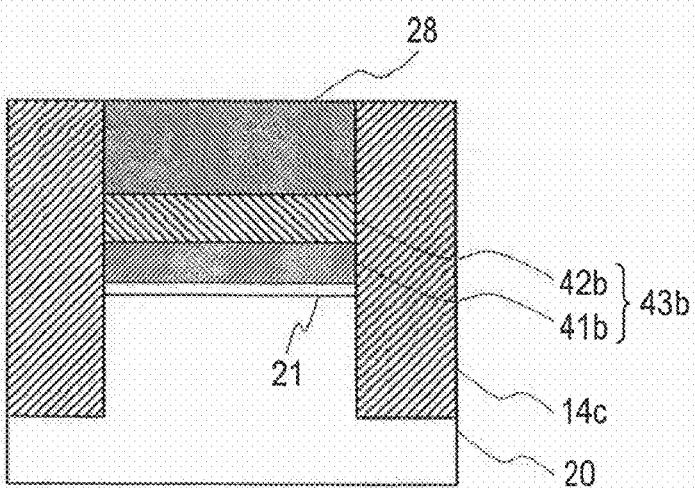
Figure 19A:
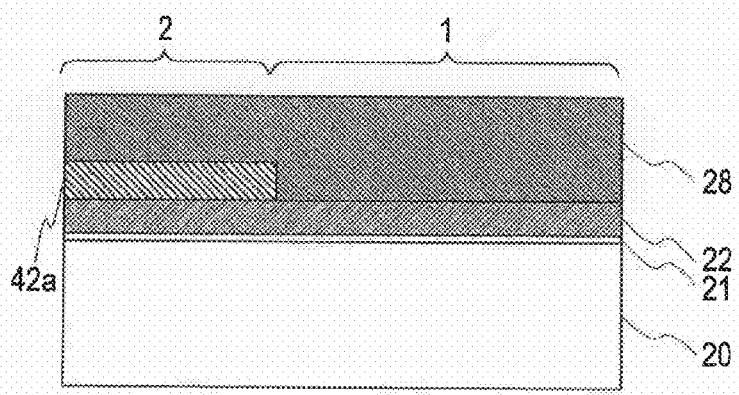
FIGS. 19A to 19D are sectional views schematically showing the fabrication process steps of the NAND-type nonvolatile memory according to the first embodiment, subsequent to those shown in FIGS. 17A to 17D.
Figure 19B:
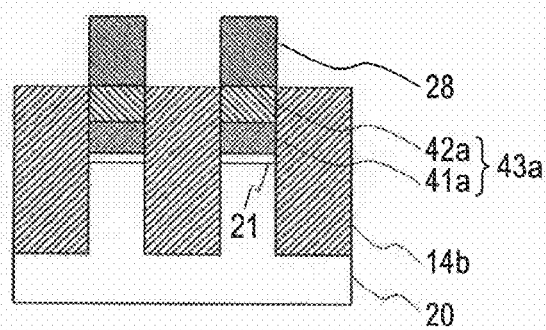
Figure 19C:
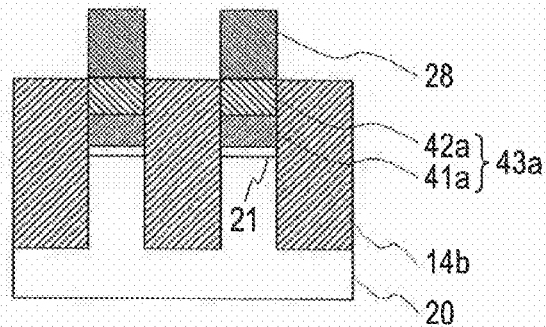
Figure 19D:
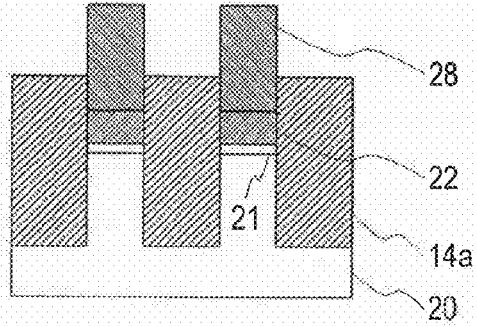
Figure 20A:
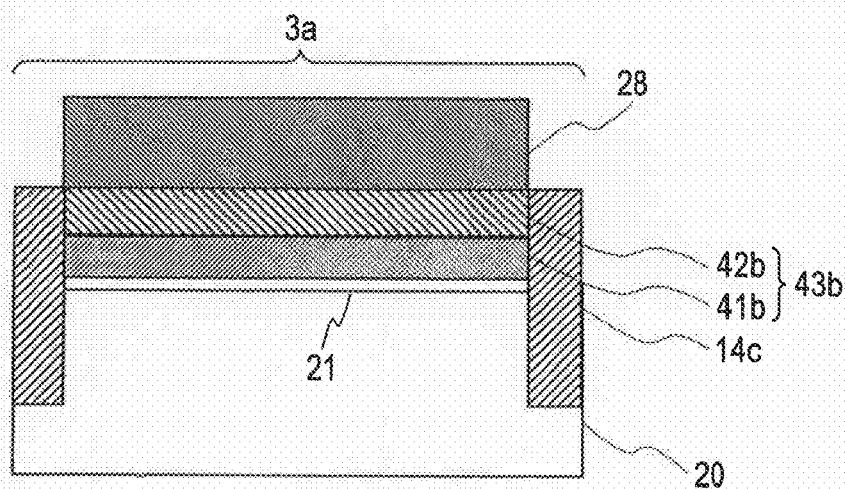
FIGS. 20A and 20B are sectional view schematically showing the fabrication process steps of the NAND-type nonvolatile memory according to the first embodiment, subsequent to those shown in FIGS. 18A and 18B.
Figure 20B:
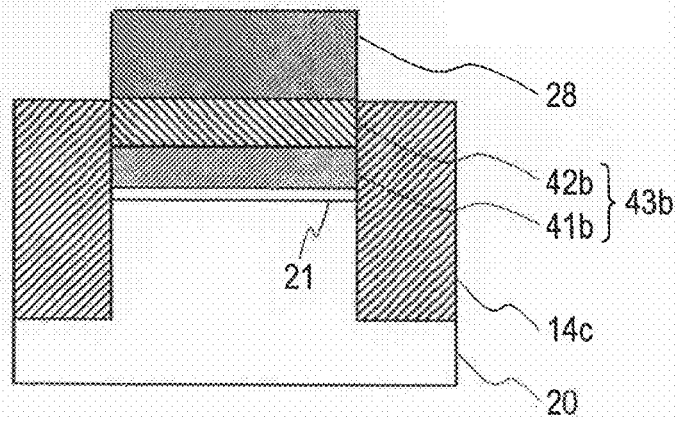

FIG. 4 is a perspective view schematically showing the shape of the second element isolation insulating film 14b of the select gate SG1 shown in FIGS. 1A to 1B and 2A to 2D. In FIG. 4, those parts identical or similar to those of FIGS. 1A to 1B and 2A to 2D will be denoted by the same or similar reference numerals and thus descriptions thereof will be omitted. As shown in FIG. 4, the select gate SG1 extends along the X direction, and the active area 4a extends along the Y direction perpendicular to the X direction. At the intersection of the select gate SG1 and the active area 4a, the select gate transistor 7 is formed. The second inter-electrode insulating film 44a has the opening 45a that exposes the surfaces of the lower gate electrode layer 43a and the second element isolation insulating film 14b. When removing a natural oxide film formed on the surface of the lower gate electrode layer 43a exposed from the opening 45a, the upper surface of the second element isolation insulating film 14b exposed from the opening 45a is removed. In this case, however, the height of the upper surface of the second element isolation insulating film 14b within the opening 45a as observed from the upper surface of the semiconductor substrate 20 becomes lower than the height of the upper surface of the lower gate electrode layer 43a but is higher than the height of the upper surface of the semiconductor substrate 20.

Next, a fabrication method of the NAND-type nonvolatile memory will be described with reference to FIGS. 5A to 36B. FIGS. 5A to 36B are sectional views schematically showing the fabrication process steps of the NAND-type nonvolatile memory.

FIGS. 5A to 5D, 7A to 7D, 9A to 9D, 11A to 11D, 13A to 13D, 15A to 15D, 17A to 17D, 19A to 19D, 21A to 21D, 23A to 23D, 25A to 25D, 27A to 27D, 29A to 29D, 31A to 31D, 33A to 33D, and 35A to 35D are sectional views taken along the lines A-A, B-B, C-C, and D-D in FIG. 1A, respectively, and FIGS. 6A and 6B, 8A and 8B, 10A and 10B, 12A and 12B, 14A and 14B, 16A and 16B, 18A and 18B, 20A and 20B, 22A and 22B, 24A and 24B, 26A and 26B, 28A and 28B, 30A and 30B, 32A and 32B, 34A and 34B, and 36A and 36B are sectional views taken along the lines E-E and F-F in FIG. 1B, respectively.

As shown in FIGS. 5A to 5D and 6A to 6B, on the semiconductor substrate (for example, a silicon substrate) 20, the gate insulating film 21 formed of, for example, a silicon oxide film (herein after referred to as $SiO_2$) is formed to a thickness of about 50 Å to about 100 Å. On the gate insulating film 21, the first gate electrode layer 22 formed of, for example, polycrystalline silicon is formed to a thickness of about 30 Å to about 50 Å. Here, the first gate electrode layer 22 constitutes the first gate electrode layer 22 of the memory cell region 1, and the first lower gate electrode layers 41a and 41b of the select gate region 2 and the peripheral circuit region 3a, respectively. In the following descriptions, the first gate electrode layer 22 of the memory cell region 1 will be referred to as the first gate electrode layer 22, and the first gate electrode layer 22 of the select gate region 2 and the peripheral circuit region 3a will be referred to as the first lower gate electrode layers 41a and 41b. On the first gate electrode layer 22 and the first lower gate electrode layers 41a and 41b, a first mask material 27 formed of, for example, a silicon nitride film (SiN) is formed to a thickness of 20 nm or more.

As shown in FIGS. 7A to 7D and 8A to 8B, a photoresist (not shown) is deposited onto the first mask material 27 and is lithographically patterned so as to cover the memory cell region 1, thereby forming a photoresist pattern that exposes other areas outside the memory cell region 1. Using the photoresist as a mask, the first mask material 27 outside the memory cell region 1 is etched and removed. Thereafter, the photoresist pattern on the memory cell region 1 is removed.

As shown in FIGS. 9A to 9D and 10A to 10B, on the first gate electrode layer 22 and the first mask material 27, the second lower gate electrode layers 42a and 42b formed of, for example, polycrystalline silicon is formed to such a thickness that the upper surfaces thereof are 20 nm or more higher than the upper surface of the first mask material 27 on the first gate electrode layers 41a and 41b.

As shown in FIGS. 11A to 11D and 12A to 12B, the second lower gate electrode layers 42a and 42b are polished by a CMP (Chemical Mechanical Polishing) process until the upper surface of the first mask material 27 is exposed. At this time, as a result of over-etching, the second lower gate electrode layers 42a and 42b are also removed by about 5 nm to about 10 nm.

As shown in FIGS. 13A to 13D and 14A to 14B, on the first mask material 27 and the second lower gate electrode layers 42a and 42b, a second mask material 28 formed of, for example, the same material as the first mask material 27 is formed to a thickness of about 40 nm. As shown in FIGS. 15A to 15D and 16A to 16B, the second mask material 28 is lithographically patterned. Thereafter, using the patterned, second mask material 28 as a mask, the first gate electrode layer 22 and the gate insulating film 21 of the memory cell region 1, the first and second lower gate electrode layers 41a and 42a and the gate insulating film 21 of the select gate region 2, and the first and second lower gate electrode layers 41b and 42b and the gate insulating film 21 of the peripheral circuit region 3a are etched to form the element isolation trenches 15 in respective regions 1, 2 and 3a, reaching into the semiconductor substrate 20.

As shown in FIGS. 17A to 17D and 18A to 18B, the element isolation insulating film 14 formed of, for example, a silicon oxide film ($SiO_2$) is buried in the element isolation trenches 15. Thereafter, using the second mask material 28 as a stopper, the element isolation insulating film 14 is planarized by a CMP process. In this way, in the memory cell region 1, the first element isolation insulating film 14a for isolating the memory cell transistors 6 from each other is formed. In the select gate region 2, the second element isolation insulating film 14b for isolating the select gate transistors 7 from each other is formed. In the peripheral circuit region 3a, the second element isolation insulating film 14c for isolating the MOS transistor 8 from other elements is formed.

As shown in FIGS. 19A to 19D and 20A to 20B, the upper portion of the element isolation insulating film 14 is etched so that the height of the upper surfaces of the first element isolation insulating film 14a and the second element isolation insulating films 14b and 14c as observed from the upper surface of the semiconductor substrate 20 is controlled so as to be the same as the height of the upper surfaces of the second lower gate electrode layers 42a and 42b. In this way, the height of the upper surfaces of the second element isolation insulating films 14b and 14c from the upper surface of the semiconductor substrate 20 is about 40 nm or more.

Figure 21A:
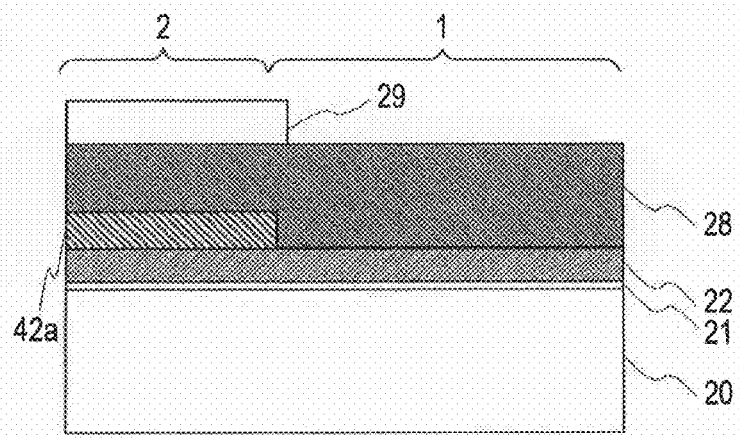
FIGS. 21A to 21D are sectional views schematically showing the fabrication process steps of the NAND-type nonvolatile memory according to the first embodiment, subsequent to those shown in FIGS. 19A to 19D.
Figure 21B:
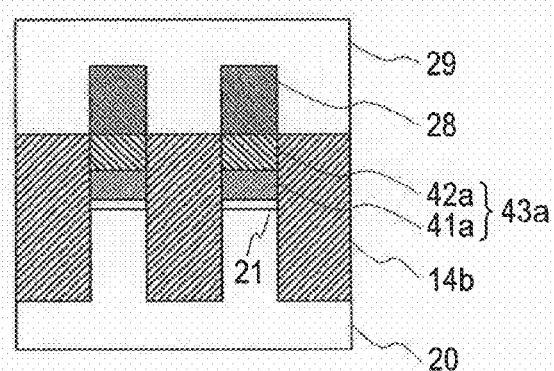
Figure 21C:
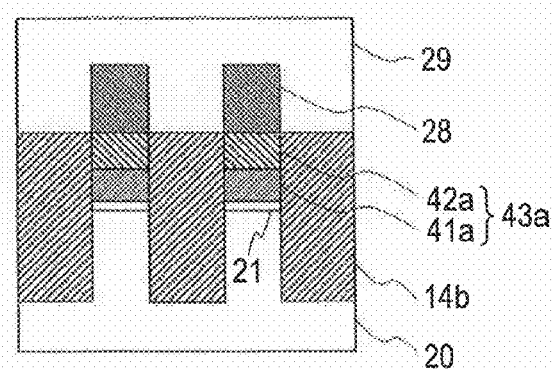
Figure 21D:
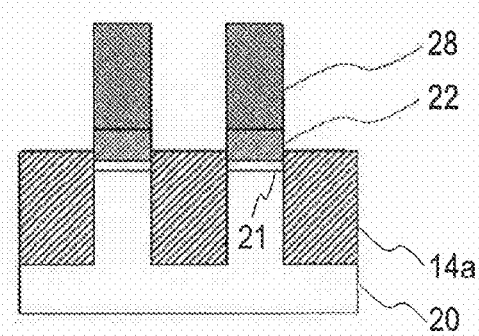
Figure 22A:
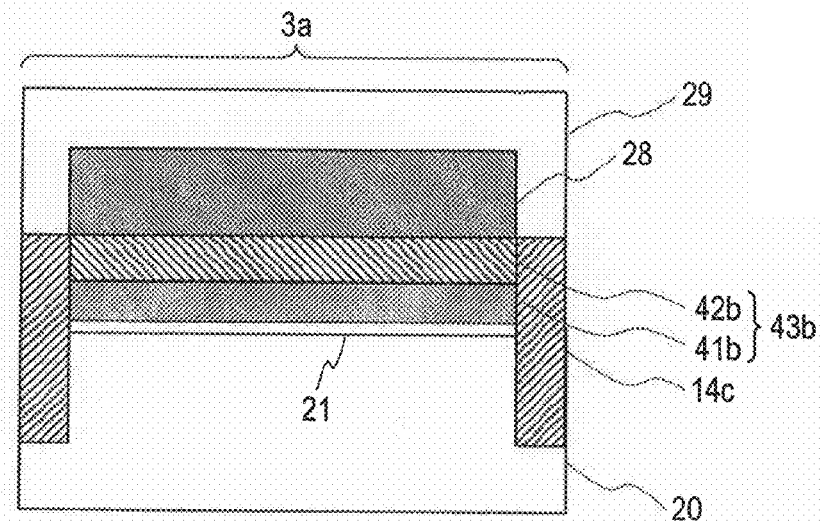
FIGS. 22A and 22B are sectional view schematically showing the fabrication process steps of the NAND-type nonvolatile memory according to the first embodiment, subsequent to those shown in FIGS. 20A and 20B.
Figure 22B:
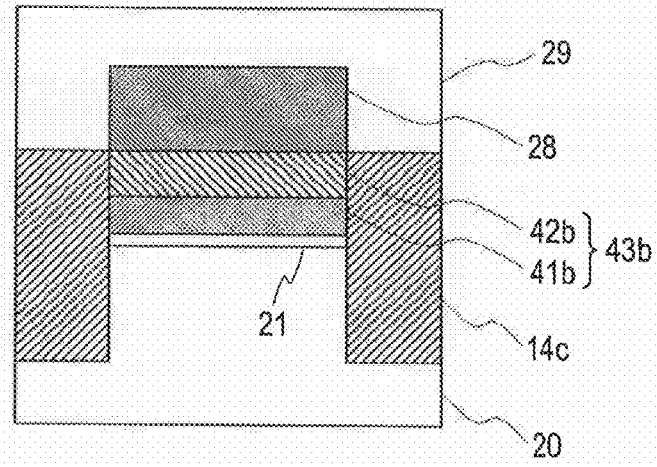
Figure 23A:
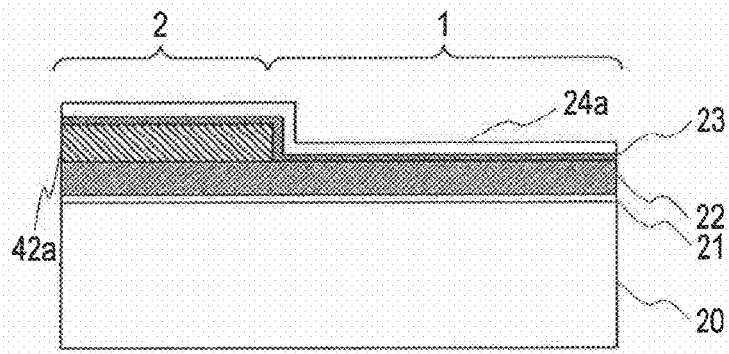
FIGS. 23A to 23D are sectional views schematically showing the fabrication process steps of the NAND-type nonvolatile memory according to the first embodiment, subsequent to those shown in FIGS. 21A to 21D.
Figure 23B:
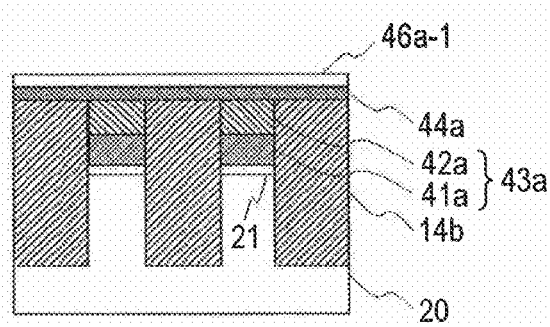
Figure 23C:
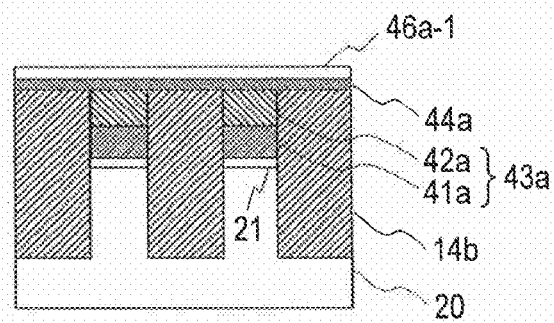
Figure 23D:
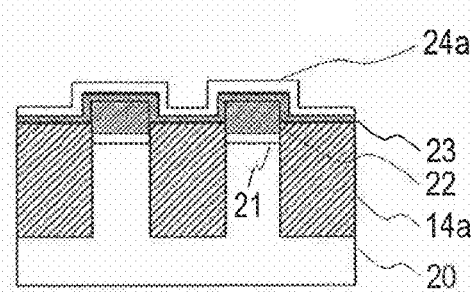
Figure 24A:
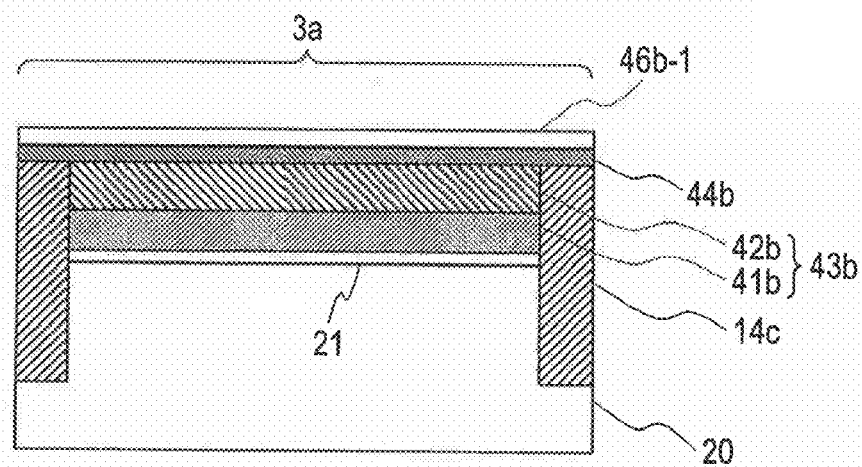
FIGS. 24A and 24B are sectional view schematically showing the fabrication process steps of the NAND-type nonvolatile memory according to the first embodiment, subsequent to those shown in FIGS. 22A and 22B.
Figure 24B:
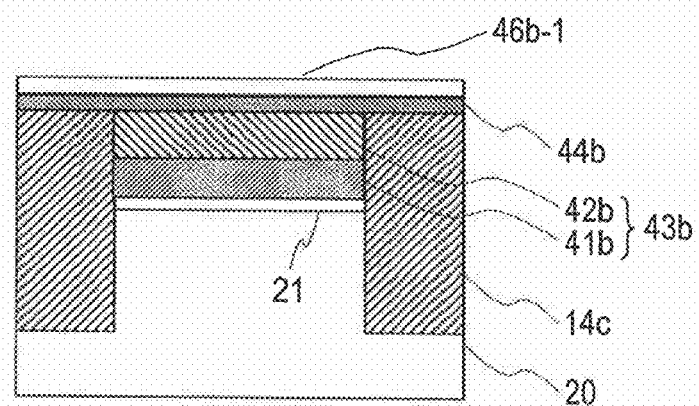
Figure 25A:
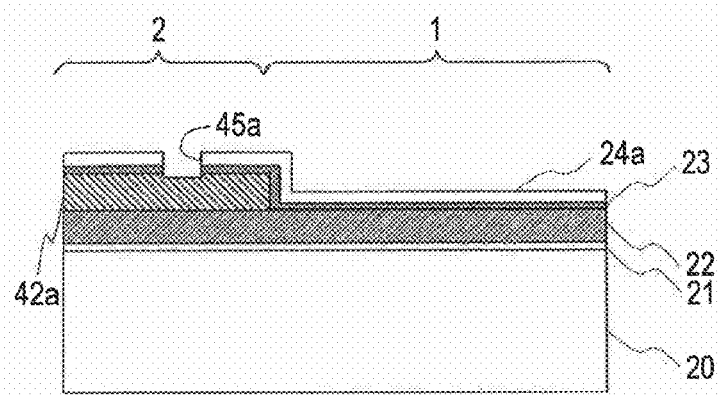
FIGS. 25A to 25D are sectional views schematically showing the fabrication process steps of the NAND-type nonvolatile memory according to the first embodiment, subsequent to those shown in FIGS. 23A to 23D.
Figure 25B:
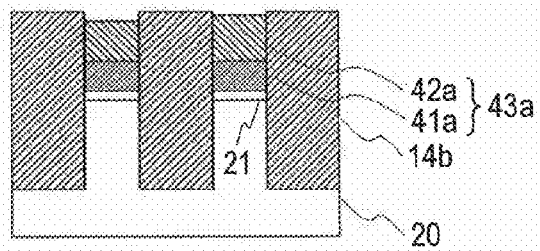
Figure 25C:
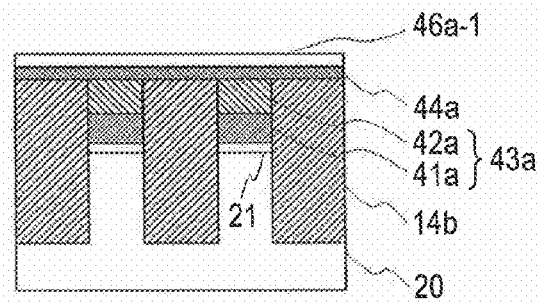
Figure 25D:
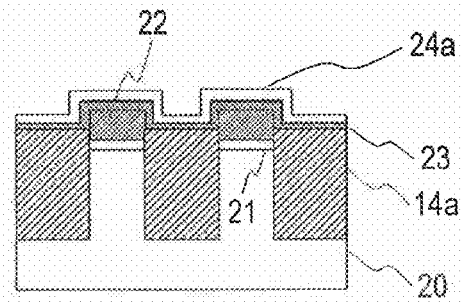
Figure 26A:
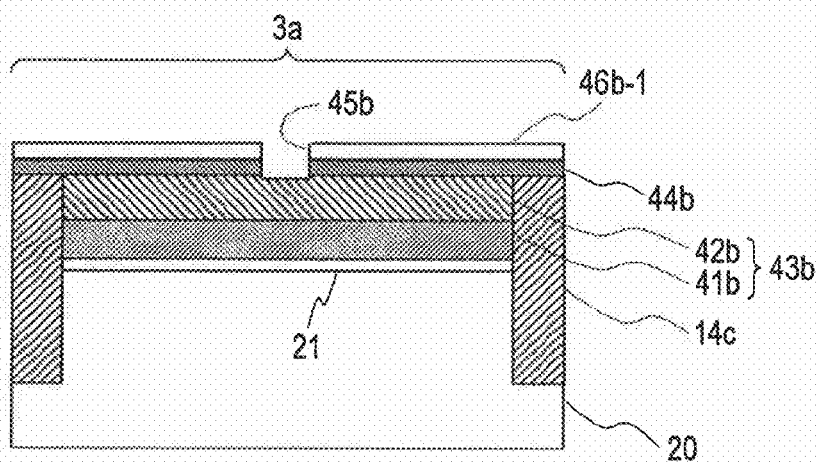
FIGS. 26A and 26B are sectional view schematically showing the fabrication process steps of the NAND-type nonvolatile memory according to the first embodiment, subsequent to those shown in FIGS. 24A and 24B.
Figure 26B:
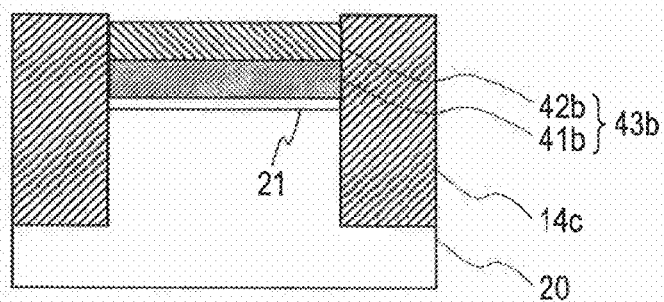

As shown in FIGS. 21A to 21D and 22A to 22B, in a state in which other areas outside the memory cell region 1 are masked with a photoresist 29, the upper portion of the first element isolation insulating film 14a is etched so that the height of the upper surface of the first element isolation insulating film 14a is higher than the height of the upper surface of the semiconductor substrate 20 and lower than the height of the upper surface of the first gate electrode layer 22, as shown in FIG. 21D. In this case, since the second element isolation insulating films 14b and 14c are covered with the photoresist 29, the films are not etched and thus their heights are not changed.

As shown in FIGS. 23A to 23D and 24A to 24B, after removing the photoresist 29 and the second mask material 28, on the first and second element isolation insulating films 14a, 14b and 14c, the first gate electrode layer 22, and the second lower gate electrode layers 42a and 42b, the inter-electrode insulating film 23 formed of, for example, an ONO (Oxide-Nitride-Oxide) film is formed to a thickness of about 12 nm to about 17 nm. Here, the inter-electrode insulating film 23 constitutes the first inter-electrode insulating film 23 of the memory cell region 1, and the second inter-electrode insulating films 44a and 44b of the select gate region 2 and the peripheral circuit region 3a, respectively. In the following descriptions, the inter-electrode insulating film 23 of the memory cell region 1 will be referred to as the first inter-electrode insulating film 23, and the inter-electrode insulating film 23 of the select gate region 2 and the peripheral circuit region 3a will be referred to as the second inter-electrode insulating films 44a and 44b. Subsequently, on the first and second inter-electrode insulating films 23, 44a and 44b, the second gate electrode lower layer 24a formed of, for example, polycrystalline silicon is formed to a thickness of about 30 nm to about 60 nm. Here, the second gate electrode lower layer 24a constitutes a portion of the second gate electrode layer 24 of the memory cell region 1 and portions of the upper gate electrode layers 46a and 46b of the select gate region 2 and the peripheral circuit region 3a, respectively. In the following descriptions, the second gate electrode layer 24 of the memory cell region 1 will be referred to as the second gate electrode lower layer 24a, and the second gate electrode lower layer 24a of the select gate region 2 and the peripheral circuit region 3a will be referred to as the upper gate electrode lower layers 46a-1 and 46b-1, respectively.

As shown in FIGS. 25A to 25D and 26A to 26B, in order to form the openings 45a and 45b in the second inter-electrode insulating films 44a and 44b, a photoresist (not shown) is deposited onto the second gate electrode lower layer 24a and the upper gate electrode lower layers 46a-1 and 46b-1 and is lithographically patterned. Thereafter, using the patterned photoresist as a resist mask, portions of the upper gate electrode lower layer 46a-1 and the second inter-electrode insulating film 44a of the select gate region 2 and portions of the upper gate electrode lower layer 46b-1 and the second inter-electrode insulating film 44b of the peripheral circuit region 3a are removed to form the openings 45a and 45b in the respective regions 2 and 3a, exposing the surfaces of the lower gate electrode layers 43a and 43b and the surfaces of the second inter-electrode insulating films 14b and 14c to the second inter-electrode insulating films 44a and 44b, respectively. Thereafter, the resist mask is removed.

Figure 27A:
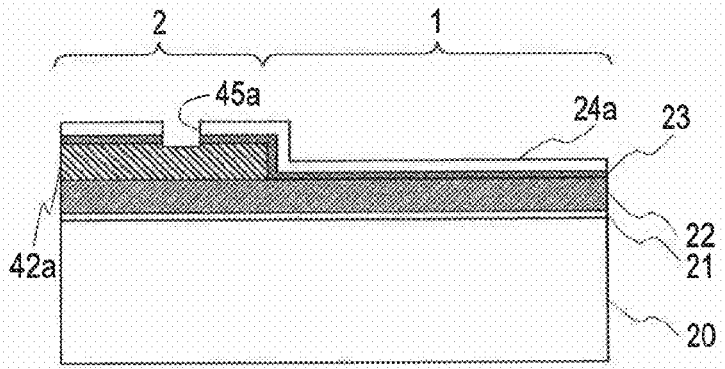
FIGS. 27A to 27D are sectional views schematically showing the fabrication process steps of the NAND-type nonvolatile memory according to the first embodiment, subsequent to those shown in FIGS. 25A to 25D.
Figure 27B:
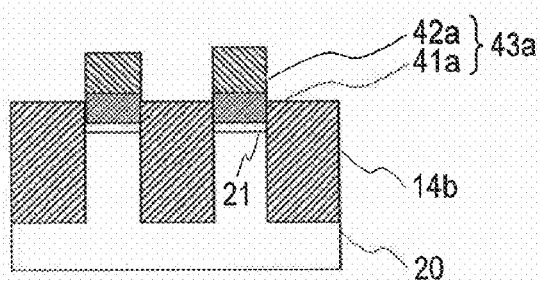
Figure 27C:
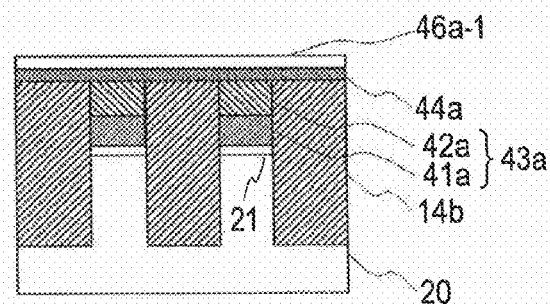
Figure 27D:
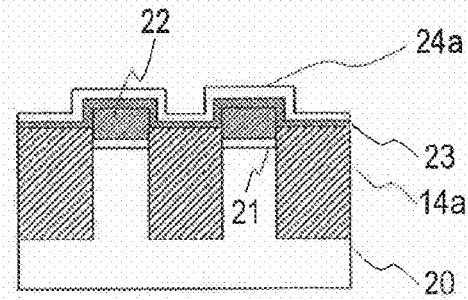
Figure 28A:
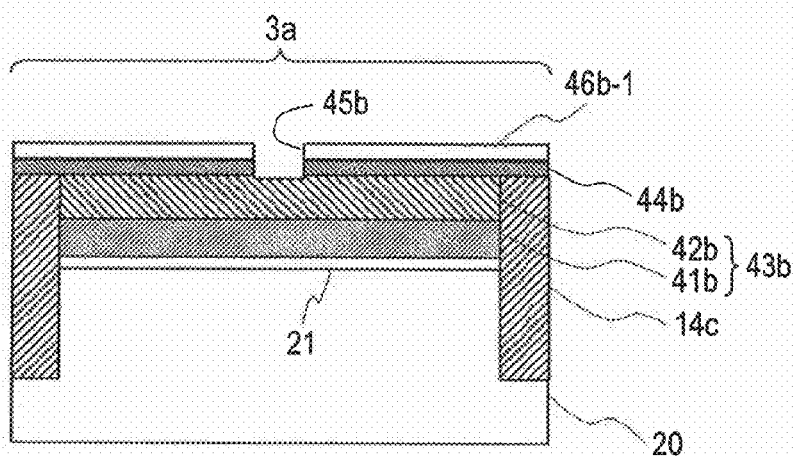
FIGS. 28A and 28B are sectional view schematically showing the fabrication process steps of the NAND-type nonvolatile memory according to the first embodiment, subsequent to those shown in FIGS. 26A and 26B.
Figure 28B:
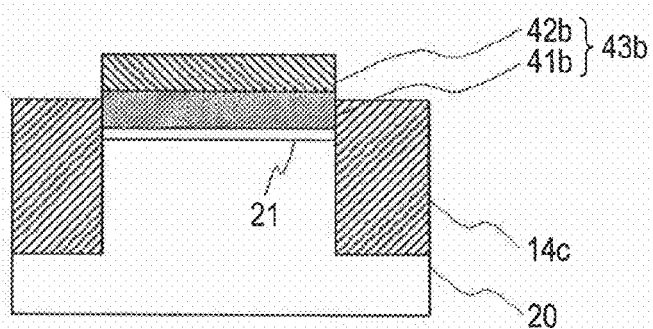
Figure 29A:
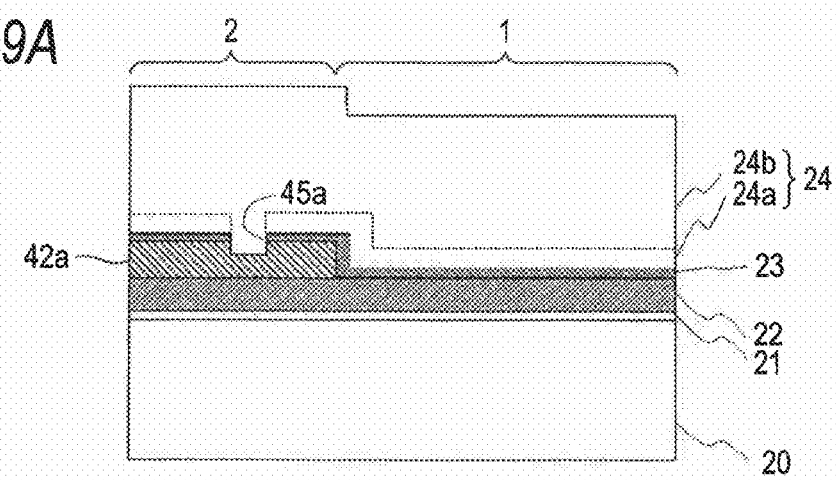
FIGS. 29A to 29D are sectional views schematically showing the fabrication process steps of the NAND-type nonvolatile memory according to the first embodiment, subsequent to those shown in FIGS. 27A to 27D.
Figure 29B:
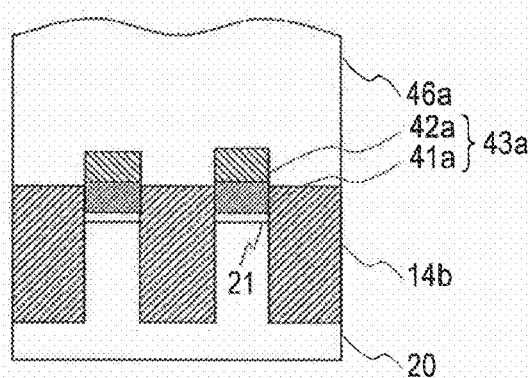
Figure 29C:
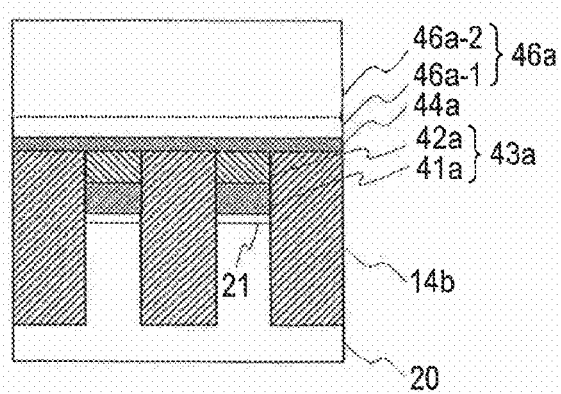
Figure 29D:
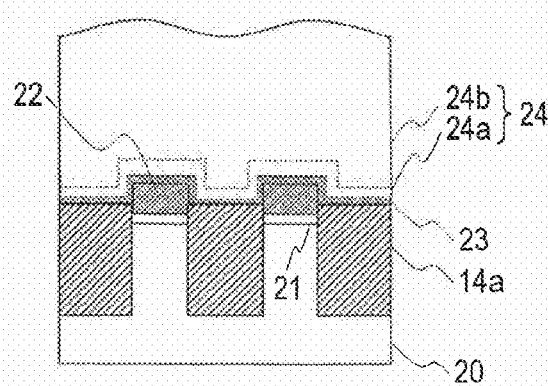
Figure 30A:
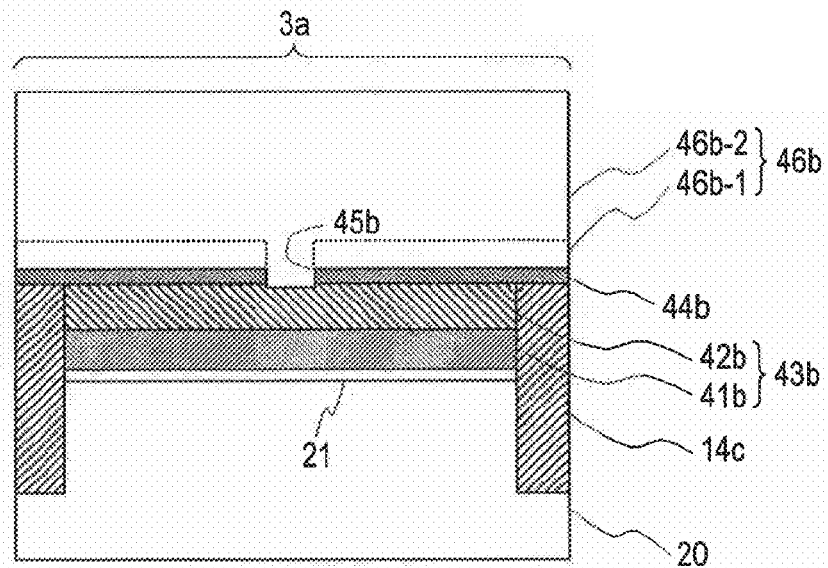
FIGS. 30A and 30B are sectional view schematically showing the fabrication process steps of the NAND-type nonvolatile memory according to the first embodiment, subsequent to those shown in FIGS. 28A and 28B.
Figure 30B:
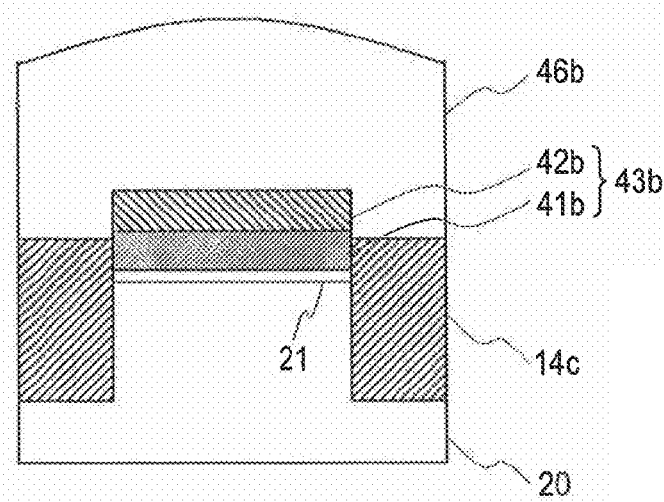
Figure 31A:
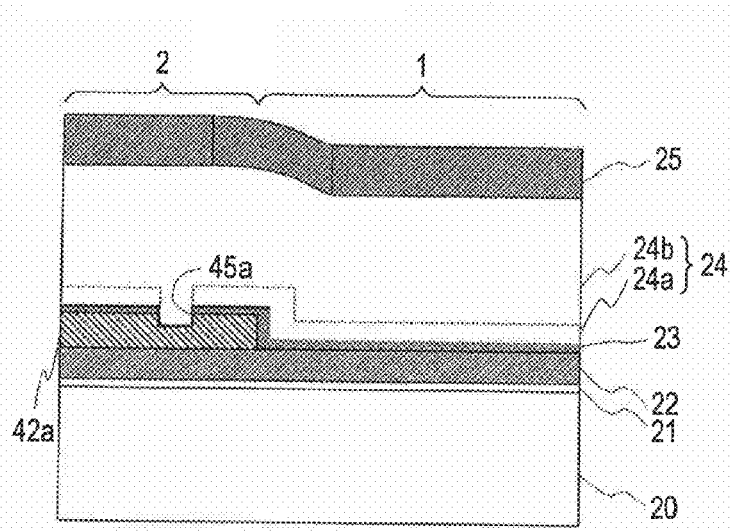
FIGS. 31A to 31D are sectional views schematically showing the fabrication process steps of the NAND-type nonvolatile memory according to the first embodiment, subsequent to those shown in FIGS. 29A to 29D.
Figure 31B:
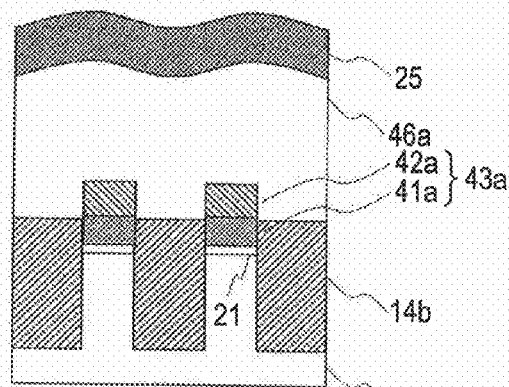
Figure 31C:
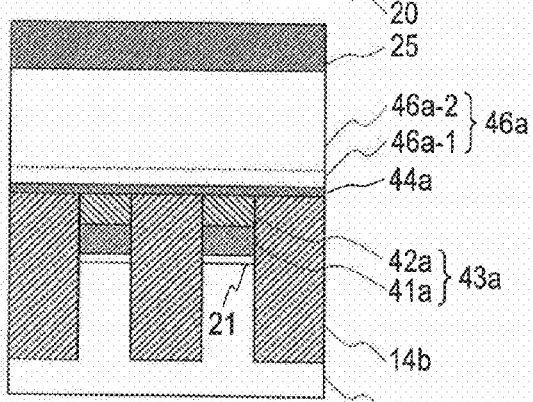
Figure 31D:
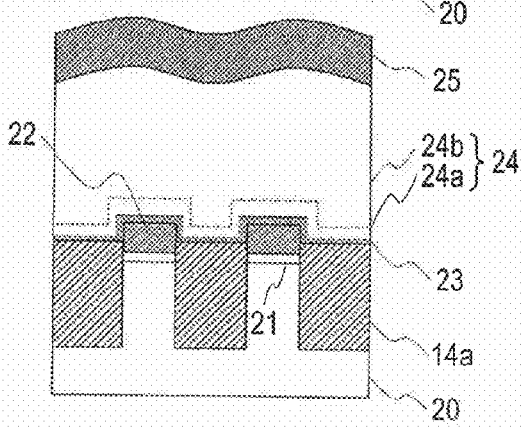
Figure 32A:
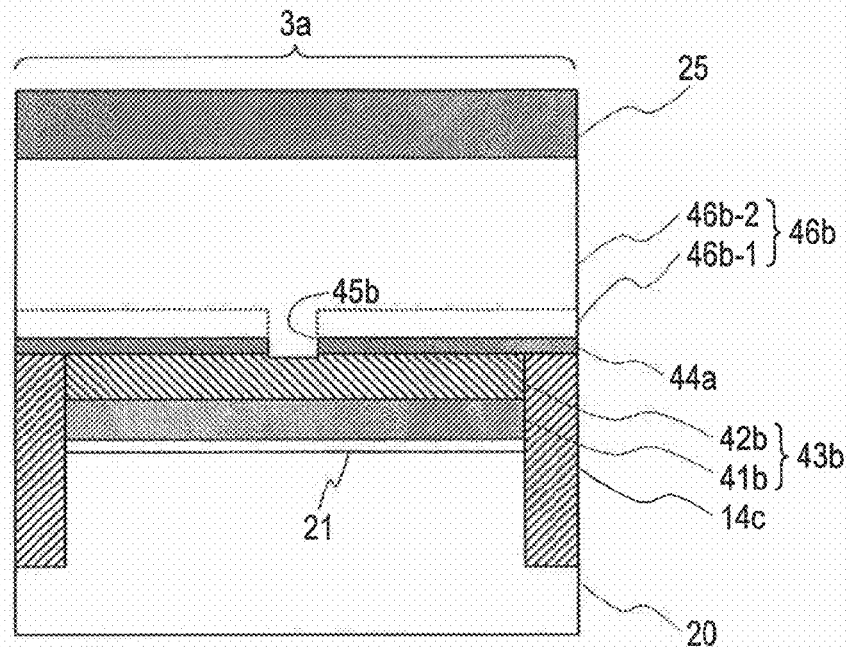
FIGS. 32A and 32B are sectional view schematically showing the fabrication process steps of the NAND-type nonvolatile memory according to the first embodiment, subsequent to those shown in FIGS. 30A and 30B.
Figure 32B:
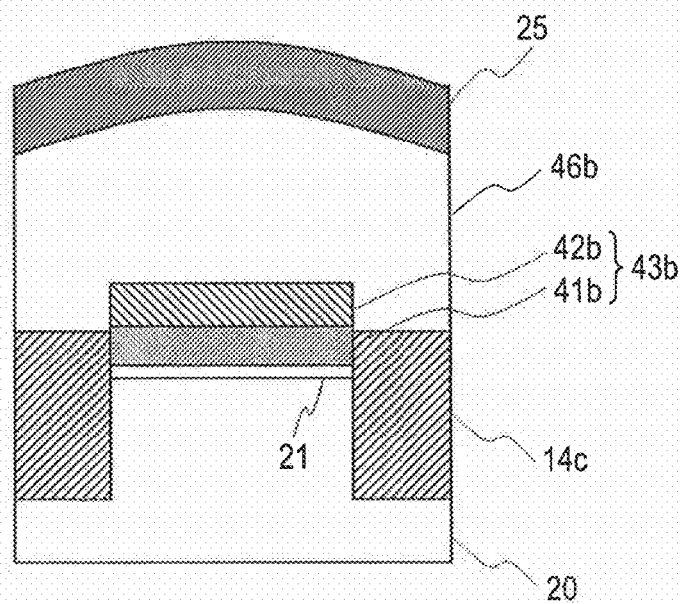
Figure 33A:
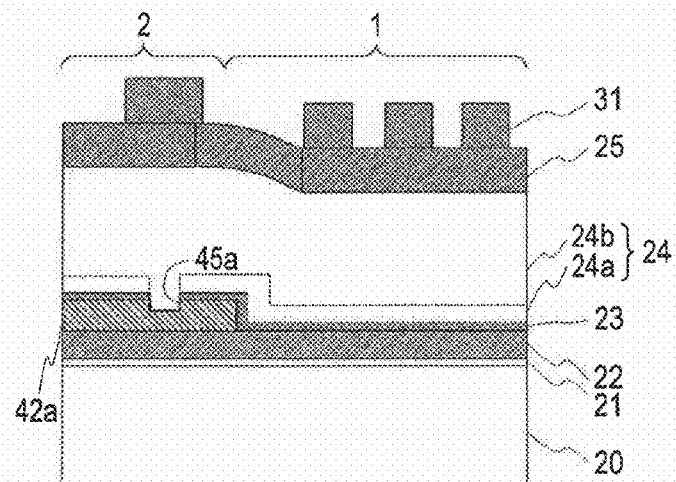
FIGS. 33A to 33D are sectional views schematically showing the fabrication process steps of the NAND-type nonvolatile memory according to the first embodiment, subsequent to those shown in FIGS. 31A to 31D.
Figure 33B:
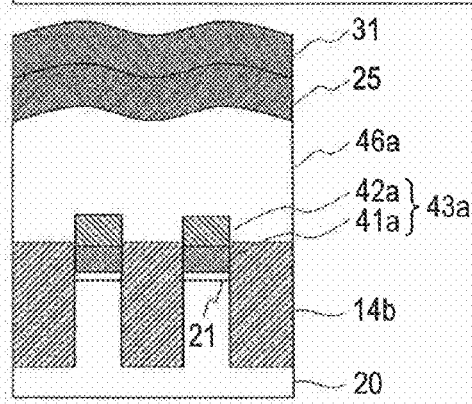
Figure 33C:
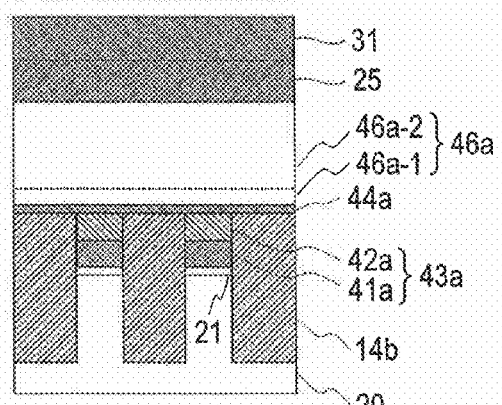
Figure 33D:
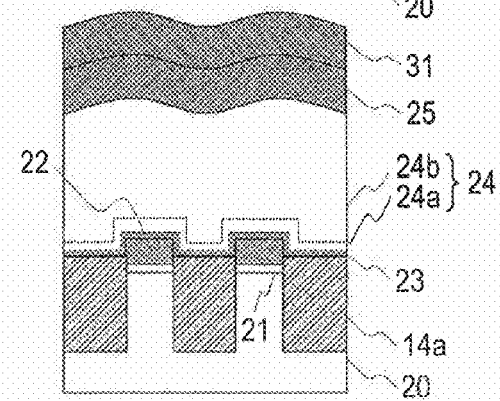
Figure 34A:
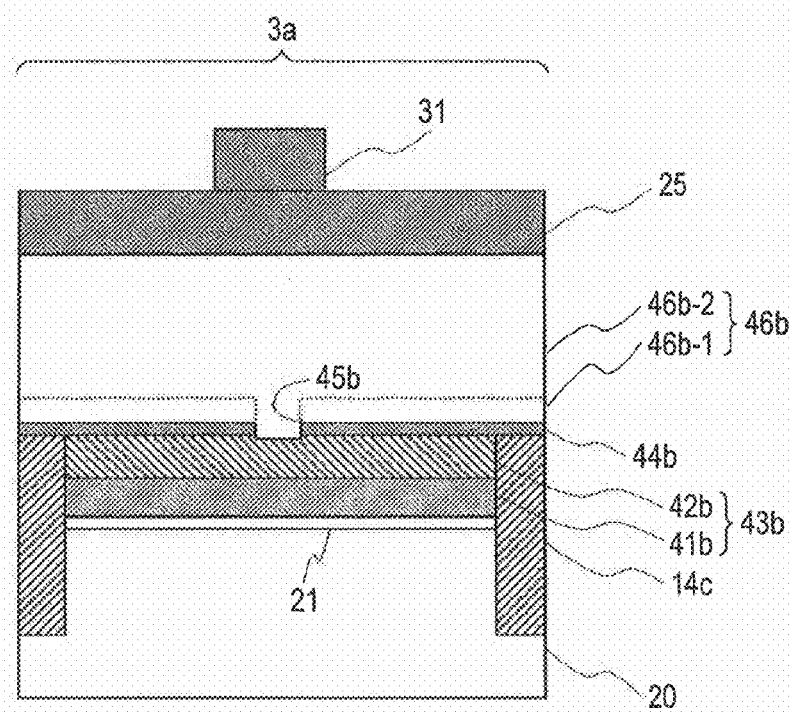
FIGS. 34A and 34B are sectional view schematically showing the fabrication process steps of the NAND-type nonvolatile memory according to the first embodiment, subsequent to those shown in FIGS. 32A and 32B.
Figure 34B:
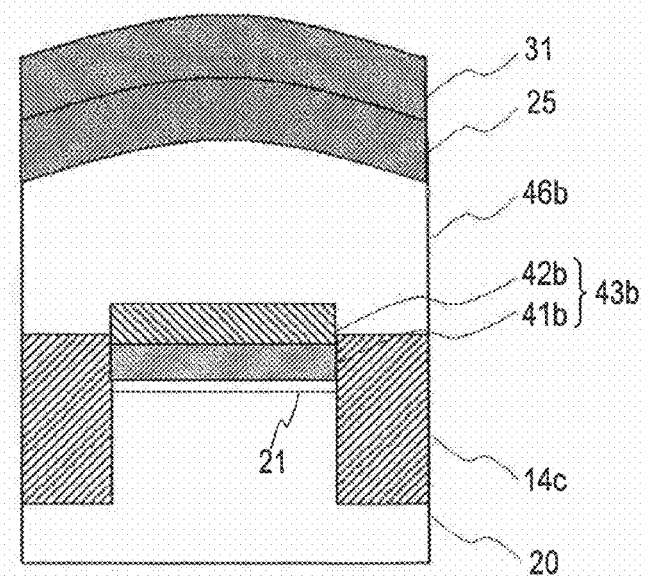
Figure 35A:
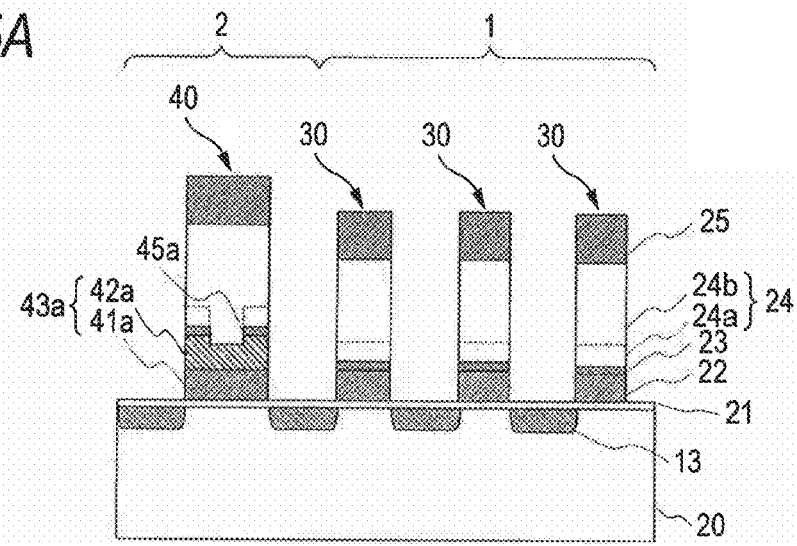
FIGS. 35A to 35D are sectional views schematically showing the fabrication process steps of the NAND-type nonvolatile memory according to the first embodiment, subsequent to those shown in FIGS. 33A to 33D.
Figure 35B:
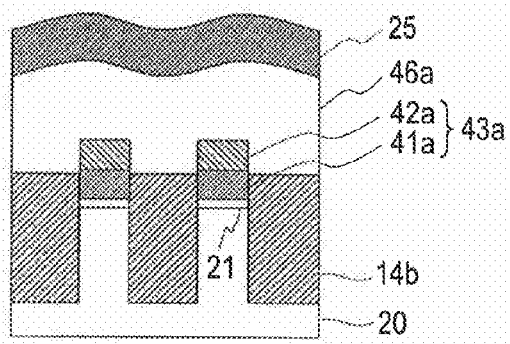
Figure 35C:
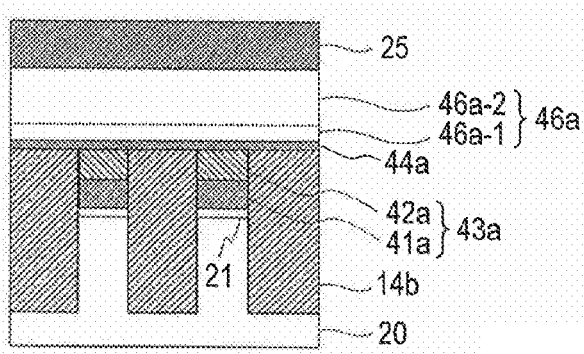
Figure 35D:
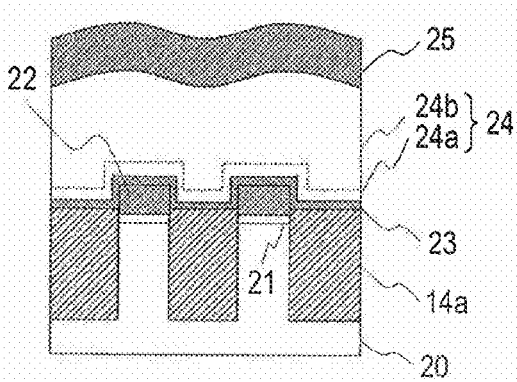
Figure 36A:
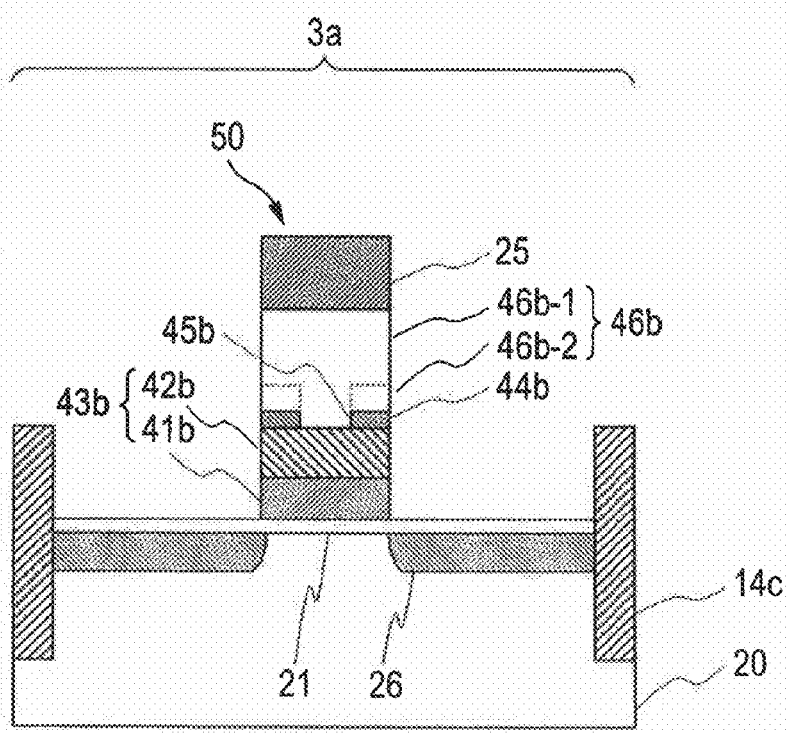
FIGS. 36A and 36B are sectional view schematically showing the fabrication process steps of the NAND-type nonvolatile memory according to the first embodiment, subsequent to those shown in FIGS. 34A and 34B.
Figure 36B:
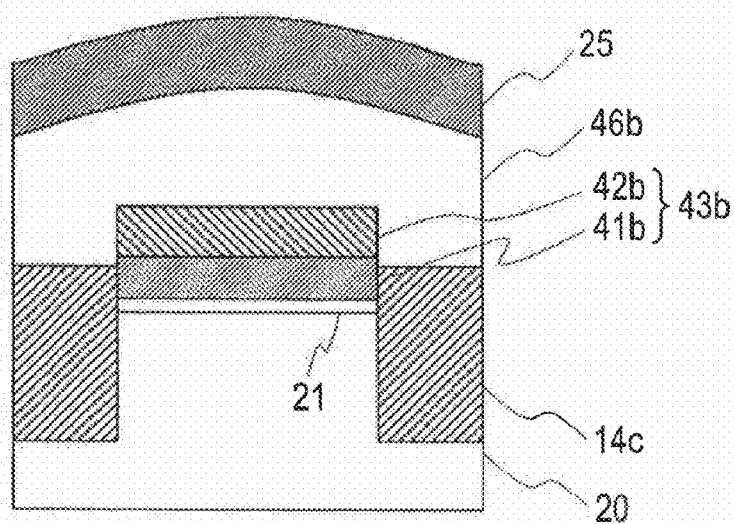

As shown in FIGS. 27A to 27D and 28A to 28B, in order to remove a natural oxide film (not shown), such as $SiO_2$, formed on the surfaces of the lower gate electrode layers 43a and 43b exposed from the openings 45a and 45b of the second inter-electrode insulating films 44a and 44b of the select gate region 2 and the peripheral circuit region 3a, a cleaning treatment is performed using a hydrofluoric acid-based solution, such as a solution of hydrogen fluoride or fluorinated acid. In this case, as shown in FIGS. 27B and 28B, the surfaces of the second element isolation insulating films 14b and 14c formed of $SiO_2$, exposed from the openings 45a and 45b of the second inter-electrode insulating films 44a and 44b are also removed by about 30 nm by the cleaning treatment using the hydrofluoric acid-based solution. However, the height of the upper surfaces of the element isolation insulating films 14b and 14c from the upper surface of the semiconductor substrate 20 is at least 10 nm and is higher than the height of the upper surface of the semiconductor substrate 20. The height of the upper surfaces of the second element isolation insulating films 14b and 14c as observed from the upper surface of the semiconductor substrate 20 may be lower than the height of the upper surfaces of the first lower gate electrode layers 41b and 41c as long as it is higher than the height of the upper surface of the semiconductor substrate 20.

As shown in FIGS. 29A to 29D and 30A to 30B, on the surface of the second gate electrode lower layer 24a, the surfaces of the lower gate electrode layers 43a and 43b exposed from the openings 45a and 45b of the second inter-electrode insulating films 44a and 44b, and the surfaces of the second element isolation insulating films 14b and 14c, the second gate electrode upper layer 24b is formed to a thickness of about 60 nm to about 100 nm. Here, the second gate electrode upper layer 24b constitutes a remaining portion of the second gate electrode layer 24 of the memory cell region 1 and the remaining portions of the upper gate electrode layers 46a and 46b of the select gate region 2 and the peripheral circuit region 3a. In the following descriptions, the second gate electrode upper layer 24b of the memory cell region 1 will be referred to as the second gate electrode upper layer 24b, and the second gate electrode upper layer 24b of the select gate region 2 and the peripheral circuit region 3a will be referred to as the upper gate electrode upper layers 46a-2 and 46b-2, respectively.

As shown in FIGS. 31A to 31D and 32A to 32B, on the second gate electrode layer 24 of the memory cell region 1 and the upper gate electrode layers 46a and 46b of the select gate region 2 and the peripheral circuit region 3a, the insulating film 25 formed of, for example, a silicon nitride film (SiN) is formed to a thickness of about 100 nm to about 200 nm. As shown in FIGS. 33A to 33D and 34A to 34B, a third mask material 31 formed of, for example, a silicon oxide film ($SiO_2$) is formed on the insulating film 25. Thereafter, the third mask material 31 is lithographically patterned.

As shown in FIGS. 35A to 35D and 36A to 36B, using the third mask material 31 as a mask, the insulating film 25, the second gate electrode layer 24, the upper gate electrode layers 46a and 46b, the first and second inter-electrode insulating films 23, 44a and 44b, the first gate electrode layer 22, and the lower gate electrode layers 43a and 43b are anisotropically etched to form the gate electrodes 30, 40, 50 of the memory cell transistors 6, the select gate transistors 7, and the MOS transistor 8, respectively. Thereafter, the third mask material 31 is removed, and using the gate electrodes 30, 40 and 50 as a mask, the impurity diffusion layer regions 26 are formed in the semiconductor substrate 20 by an ion implantation method. In some cases, the third mask material 31 may be completely removed by the anisotropic etching of the insulating film 25 when forming the gate electrodes 30, 40 and 50.

In this way, the memory cell transistors 6 having a double-layer gate structure are formed on the semiconductor substrate 20, wherein each of the memory cell transistors 6 includes the first gate electrode layer 22 formed on the semiconductor substrate 20 with the gate insulating film 21 interposed therebetween and the second gate electrode layer 24 formed on the first gate electrode layer 22 with the first inter-electrode insulating film 23 interposed therebetween. At the same time, the select gate transistors 7 and the MOS transistor 8 having a single-layer gate structure are formed on the semiconductor substrate 20, wherein each of the transistors 7 and 8 includes the lower gate electrode layers (the third gate electrodes) 43a and 43b having a stacked structure of the first lower gate electrode layers 41a and 41b formed on the semiconductor substrate 20 with the gate insulating film 21 interposed therebetween and the second lower gate electrode layers 42a and 42b stacked on the first lower gate electrode layers 41a and 41b, the second inter-electrode insulating films 44a and 44b having the openings 45a and 45b and formed on the lower gate electrode layers 43a and 43b, and the upper gate electrode layers 46a and 46b formed on the second inter-electrode insulating films 44a and 44b and electrically connected to the lower gate electrode layers 43a and 43b.

An inter layer insulating film (not shown) is formed on the entire surface of the semiconductor substrate 20 so as to cover the gate electrodes 30, 40 and 50. Thereafter, the contacts 10a and 10b are penetrated through the inter layer insulating film and the gate insulating film 21 so as to be connected to the surfaces of the impurity diffusion layer regions 26, and the contact 11 is penetrated through the inter layer insulating film and the insulating film 25 so as to be connected to the upper gate electrode layers 46a and 46b. Subsequently, an upper metal wiring (not shown) is formed on the inter layer insulating film for transferring electrical signals. In this way, a NAND-type nonvolatile memory is obtained.

According to this embodiment, the thicknesses of the lower gate electrode layers 43a and 43b of the select gate region 2 and the peripheral circuit region 3a are larger than the thickness of the first gate electrode layer 22 of the memory cell region 1. That is, the lower gate electrode layers 43a and 43b are constructed in a laminated structure in which the second lower gate electrode layers 42a and 42b are stacked on the first lower gate electrode layers 41a and 41b that are the same as the first gate electrode layer 22, so that the thicknesses of the lower gate electrode layers 43a and 43b are larger than the thickness of the first gate electrode layer 22 of the memory cell region 1. In addition, the height of the upper surfaces of the second element isolation insulating films 14b and 14c is controlled so as to be substantially the same as the height of the upper surfaces of the lower gate electrode layers 43a and 43b. When removing the natural oxide film formed on the surfaces of the lower gate electrode layers 43a and 43b exposed from the openings 45a and 45b of the second inter-electrode insulating films 44a and 44b, the upper portions of the second element isolation insulating films 14b and 14c exposed from the openings 45a and 45b are removed. In this case, however, the height of the upper surfaces of the second element isolation insulating films 14b and 14c within the openings 45a and 45b as observed from the upper surface of the semiconductor substrate 20 becomes lower than the height of the upper surfaces of the lower gate electrode layers 43a and 43b but is higher than the height of the upper surface of the semiconductor substrate 20. For this reason, it is possible to prevent the upper gate electrode layers 46a and 46b of the select gate transistors 7 and the MOS transistor 8 from being electrically short-circuited to the semiconductor substrate 20.

The height of the upper surfaces of the second element isolation insulating films 14b and 14c on which the upper gate electrode layers 46a and 46b are formed, as observed from the upper surface of the semiconductor substrate 20 can be increased by increasing the thickness of the second lower gate electrode layers 42a and 42b. That is, even when the first gate electrode layer 22 of the memory cell transistor 6 is made thin, by forming the second lower gate electrode layers 42a and 42b on the first lower gate electrode layers 41a and 41b and by increasing the thicknesses of the second lower gate electrode layers 42a and 42b, it is possible to maintain the height, as observed from the upper surface of the semiconductor substrate 20, of the upper surfaces of the second element isolation insulating films 14b and 14c which are adjacent to the select gate transistors 7 and the MOS transistor 8 of the peripheral circuit region 3a and on which the upper gate electrode layers 46a and 46b are formed. Accordingly, by increasing the thicknesses of the second lower gate electrode layers 42a and 42b, the first gate electrode layer 22 of the memory cell transistor 6 can be made thin enough to suppress the inter-cell interference.

In the above-described embodiment, the lower gate electrode layers 43a and 43b of the select gate transistors 7 and the MOS transistor 8 may be formed in a different manner. That is, after the first gate electrode layer 22 (the first lower gate electrode layers 41a and 41b) and the second lower gate electrode layers 42a and 42b are formed, in a state that other areas outside the memory cell region 1 masked with a resist mask, the second lower gate electrode layer of the memory cell region 1 is removed by an RIE (Reactive Ion Etching) or wet etching process to form the lower gate electrode layers 43a and 43b.

The removal of the natural oxide film from the surfaces of the lower gate electrode layers 43a and 43b exposed from the openings 45a and 45b of the second inter-electrode insulating films 44a and 44b may be performed using any solution other than the hydrofluoric acid-based solution if the solution can etch an oxide film.

On the upper surface of the second gate electrode layer 24 of the memory cell transistors 6 and the upper surfaces of the upper gate electrode layers 46a and 46b of the select gate transistors 7 and the MOS transistor 8, metals such as tungsten may be laminated to decrease the electric resistance of the gate electrodes. For example, polycrystalline silicon is used in the second gate electrode layer 24 and the upper gate electrode layers 46a and 46b, metals such as cobalt, manganese or magnesium are deposited onto the second gate electrode layer 24 and the upper gate electrode layers 46a and 46b, and a heat treatment is performed to form a silicide layer thereon.

The element isolation trenches or the gate electrodes may be formed using a soft mask such as a photoresist.

At the time of forming the second gate electrode layer 24 and the upper gate electrode layers 46a and 46b, the second gate electrode lower layer 24a and the upper gate electrode lower layers 46a-1 and 46b-1, and the second gate electrode upper layer 24b and the upper gate electrode upper layers 46a-2 and 46b-2 may be sequentially formed after the openings 45a and 45b are formed in the second inter-electrode insulating films 44a and 44b.

Figure 37A:
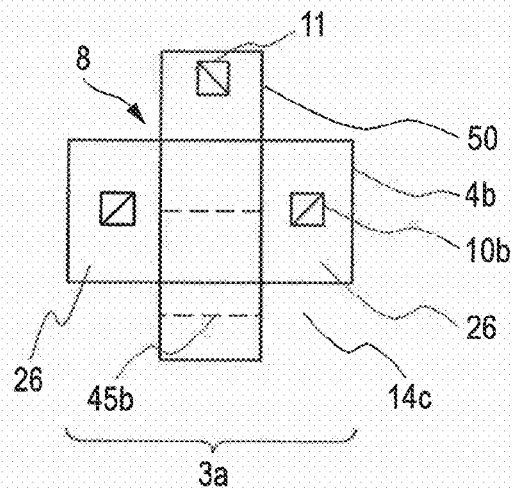
FIGS. 37A to 37C are top views showing a modified example of the NAND-type nonvolatile memory according to the first embodiment.
Figure 37B:
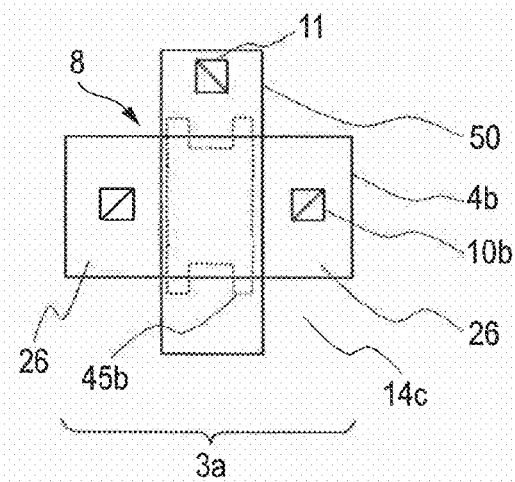
Figure 37C:
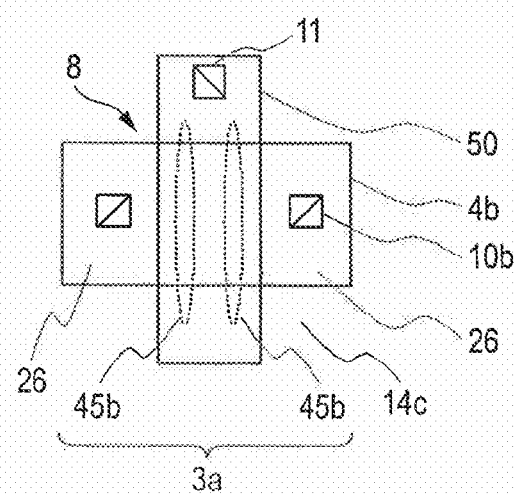
Figure 38A:
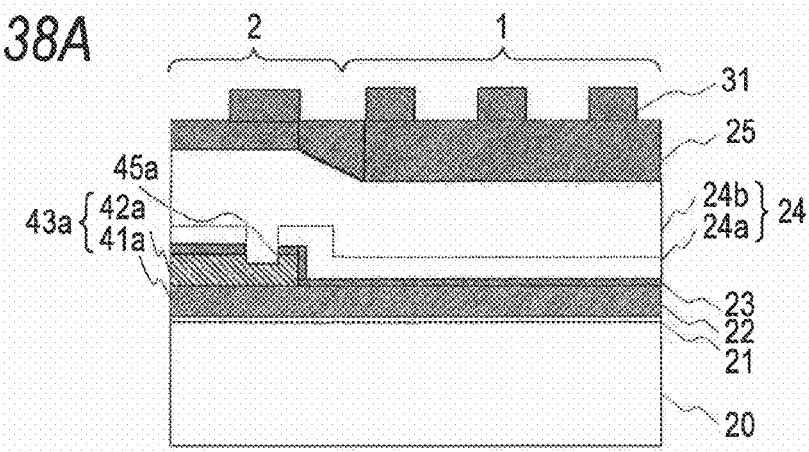
FIGS. 38A to 38D are sectional views schematically showing the memory cell region and the select gate region formed by another fabrication method of the NAND-type nonvolatile memory according to the first embodiment.
Figure 38B:
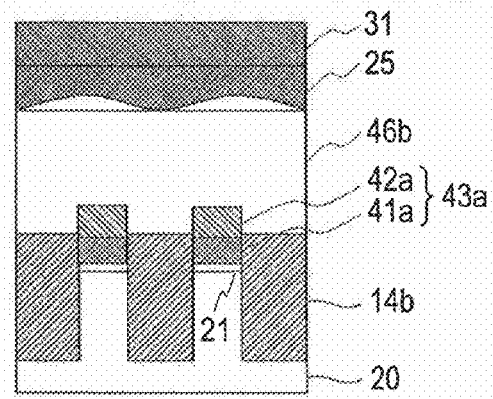
Figure 38C:
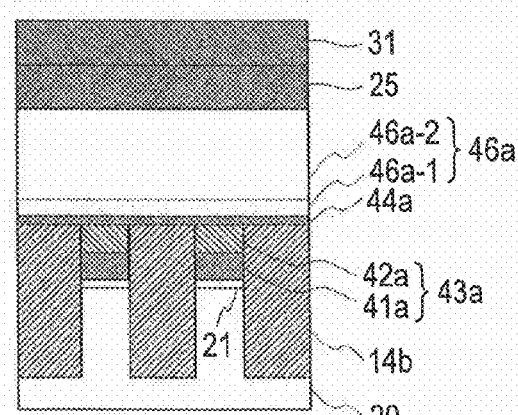
Figure 38D:
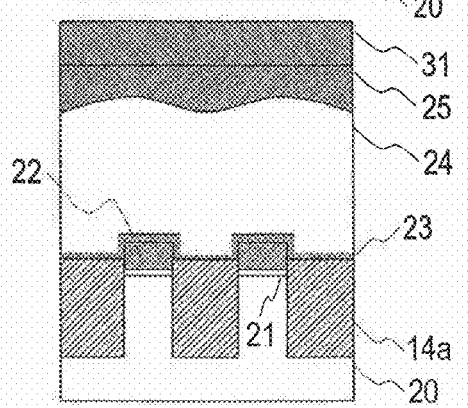
Figure 39A:
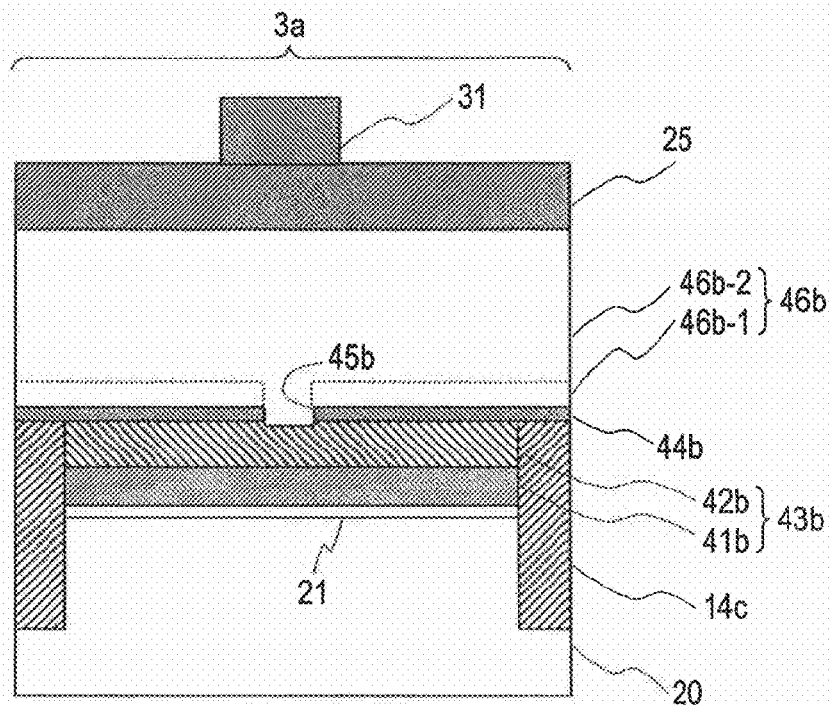
FIGS. 39A and 39B are sectional views schematically showing the peripheral circuit region formed by another fabrication method of the NAND-type nonvolatile memory according to the first embodiment.
Figure 39B:
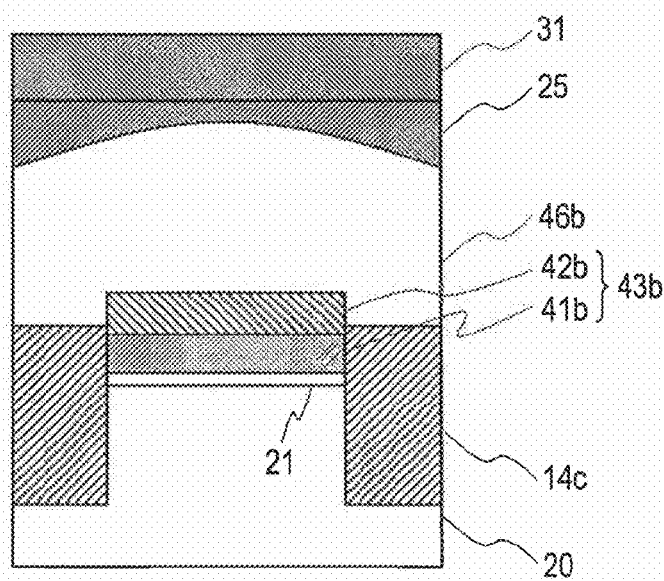

The opening 45b of the second inter-electrode insulating film 44b of the peripheral circuit region 3a may be formed in a different shape. As shown in FIG. 37A, the opening 45b may have the same width as that of the gate electrode 50 (the lower gate electrode layer 43b) and be shaped to expose a portion of the second element isolation insulating film 14c on one side of the active area 4b and a portion of the gate electrode 50. As shown in FIG. 37B, the opening 45b may have an H-letter shape that partially exposes the gate electrode 50 on the active area 4b and the second element isolation insulating film 14c in the vicinity of the active area 4b. As shown in FIG. 37C, the opening 45b may be multiple slits that expose a portion of the gate electrode 50 on the active area 4b and a portion of the second element isolation insulating film 14c in the vicinity of the active area 4b.

During processing of the gate electrodes 30, 40 and 50, as shown in FIGS. 38A to 38D and 39A to 39B, the insulating film 25 may be planarized by a CMP process before forming the third mask material 31 on the insulating film 25. In this case, it is possible to improve the lithography margin and the process margin in patterning the gate electrodes.

The active area 4b of the peripheral circuit region 3a may be provided with a plurality of MOS transistors 8, and alternatively, a plurality of active areas 4b may be provided so that a plurality of MOS transistors 8 may be formed. The type of the MOS transistor 8 may be either N-type or P-type.

In the fabrication method of the above-described embodiment, the element isolation insulating film 14 is formed after forming the gate insulating film 21. However, a so-called post-gate process may be employed in which the element isolation insulating film 14 is formed before forming the gate insulating film 21.

The first gate electrode layer 22 may be formed of a material different from that of the second gate electrode layer 24.

Even when the height of the upper surface of the element isolation insulating film 14a of the memory cell region 1 as observed from the upper surface of the semiconductor substrate 20 is decreased to be lower than the height of the upper surface of the semiconductor substrate 20, by controlling the thickness of the second lower gate electrode layer 42a, it is possible to provide the same advantages as provided by this embodiment.

Second Embodiment

A second embodiment is directed to a NAND-type non-volatile memory in which a resistor element is constructed in a single-layer gate structure similar to the MOS transistor, the resistor element formed in a peripheral circuit region different from the peripheral circuit region on which the MOS transistor is formed.

Figure 40A:
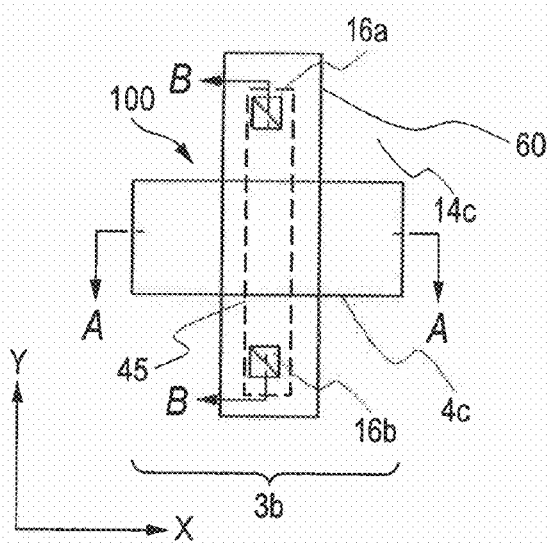
FIG. 40A is a top view schematically showing the structure of a resistor element of a NAND-type nonvolatile memory according to a second embodiment.
Figure 40B:
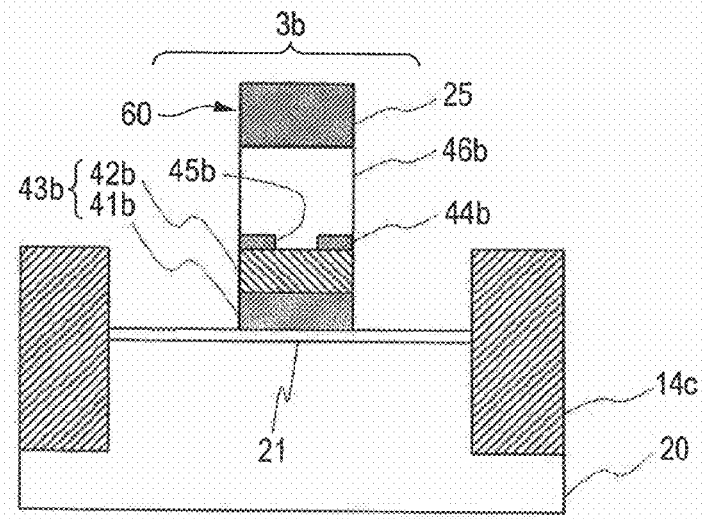
FIG. 40B is a sectional view taken along the line A-A in FIG. 40A.
Figure 40C:
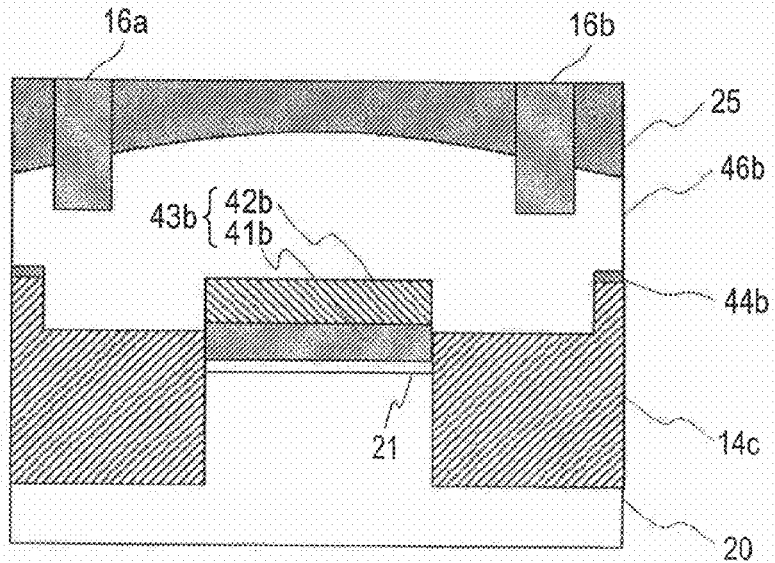
FIG. 40C is a sectional view taken along the line B-B in FIG. 40A.

FIGS. 40A to 40C are views schematically showing the structure of a resistor element of a NAND-type nonvolatile memory according to the second embodiment, in which FIG. 40A is a top view schematically showing the structure of the resistor element, FIG. 40B is a sectional view taken along the line A-A in FIG. 40A, and FIG. 40C is a sectional view taken along the line B-B in FIG. 40A. Those parts identical or similar to those of the first embodiment will be denoted by the same or similar reference numerals, and thus only characteristic portions of this embodiment will be described.

As shown in FIG. 40A, in this embodiment, a resistor element 100 is formed a peripheral circuit region 3b different from the peripheral circuit region 3a on which the MOS transistor is formed. The resistor element 100 includes a gate electrode 60 formed on an active area 4c surrounded by the second element isolation insulating film 14c and extending along the Y direction in the drawing onto the second element isolation insulating film 14c while dividing the active area 4c into left and right regions, and contacts 16a and 16b provided at both end portions of the gate electrode 60, respectively, for giving electric potential to the gate electrode 60.

As shown in FIGS. 40B and 40C, the gate electrode 60 includes the lower gate electrode layer 43b formed on the semiconductor substrate 20 with the gate insulating film 21 interposed therebetween and having a stacked structure of the first and second lower gate electrode layers 41b and 42b, i.e., having substantially the same structure as the MOS transistor 8 of the first embodiment, the second inter-electrode insulating film 44b having the opening 45b and formed on the lower gate electrode layer 43b, the upper gate electrode layer 46b formed on the second inter-electrode insulating film 44b, and the insulating film 25 formed on the upper gate electrode layer 46b.

The opening 45b of the second inter-electrode insulating film 44b extends over the lower gate electrode layer 43b and the second element isolation insulating film 14b. The height of the upper surface of the second element isolation insulating film 14b on which the second inter-electrode insulating film 44b is formed, as observed from the upper surface of the semiconductor substrate 20 is substantially the same as the height of the upper surface of the lower gate electrode layer 43b, The height of the upper surface of the second element isolation insulating film 14b on which the upper gate electrode layer 46b is formed, as observed from the upper surface of the semiconductor substrate 20 is lower than the height of the upper surface of the lower gate electrode layer 43b and higher than the height of the upper surface of the semiconductor substrate 20.

The contacts 16a and 16b are disposed at both end portions of the gate electrode 60, respectively, and are penetrated through the insulating film 25, reaching into the upper gate electrode layer 46b.

The structures of the memory cell transistors 6, the select gate transistors 7 and the MOS transistor 8 are the same as those of the first embodiment. The fabrication method of the resistor element is the same as that of the NAND-type nonvolatile memory of the first embodiment, and thus descriptions thereof will be omitted.

According to this embodiment, it is possible to provide the same advantages as provided by the first embodiment. Besides, by constructing the lower and upper gate electrode layers 43b and 46b as a resistor body and providing the contacts 16a and 16b at both end portions of the gate electrode 60, it is possible to obtain a resistor element in an easy manner.

In this embodiment, the resistance of the resistor element can be easily changed by changing the distance between the contacts 16a and 16b and the number of contacts, the thickness of the second lower gate electrode layer 42b, the shape of the opening 45b of the second inter-electrode insulating film 44b, or the shape of the gate electrode 60.

A plurality of resistor elements may be provided in series or parallel and be connected to the upper metal wiring, thereby making various resistor elements.

Third Embodiment

A third embodiment is directed to a NAND-type nonvolatile memory in which a capacitor element is constructed in a single-layer gate structure similar to the MOS transistor, the resistor element formed in a peripheral circuit region different from the peripheral circuit region on which the MOS transistor is formed.

FIGS. 41A to 41C are views schematically showing the structure of a capacitor element of a NAND-type nonvolatile memory according to a third embodiment, in which FIG. 41A is a top view showing the structure of the capacitor element, FIG. 41B is a sectional view taken along the line A-A in FIG. 41A, and FIG. 41C is a sectional view taken along the line B-B in FIG. 41A. Those parts identical or similar to those of the first embodiment will be denoted by the same or similar reference numerals, and thus only characteristic portions of this embodiment will be described.

As shown in FIG. 41A, in this embodiment, a capacitor element 110 is formed in a peripheral circuit region 3c different from the peripheral circuit region 3a on which the MOS transistor is formed. The capacitor element 110 includes the second element isolation insulating film 14c disposed within a first active area 4d, a gate electrode 70 having a second active area 4e surrounded by the second element isolation insulating film 14c and formed on the second element isolation insulating film 14c and the second active area 4e so as to cover the second element isolation insulating film 14c and the second active area 4e, a contact 17a formed in the gate electrode 70 on the second element isolation insulating film 14c, an inter-gate insulating film 33 formed of, for example, SiN or BPSG (Boron Phosphorous Silicon Glass) and provided on the first active area 4d on which the gate electrode 70 is not formed, and a contact 17b for giving electric potential to the gate electrode 70 and the semiconductor substrate 20.

As shown in FIGS. 41B and 41C, the gate electrode 70 includes the lower gate electrode layer 43b formed on the semiconductor substrate 20 with the gate insulating film 21 interposed therebetween and having a stacked structure of the first and second lower gate electrode layers 41b and 42b, i.e., having substantially the same structure as the MOS transistor 8 of the first embodiment, a second inter-electrode insulating film 44c extending over the lower gate electrode layer 43b and the second element isolation insulating film 14c and having three openings 45c arranged parallel with each other, and the upper gate electrode layer 46b formed on the second inter-electrode insulating film 44c. The lower and upper gate electrode layers 43b and 46b are constructed in a single-layer gate structure by being electrically connected to each other by the openings 45c of the second inter-electrode insulating film 44c.

The contact 17a is penetrated through the insulating film 25 within the opening 45, reaching into the upper gate electrode layer 46b. Meanwhile, the contact 17b is penetrated through the gate insulating film 21, reaching the surface of the semiconductor substrate 20. In this way, the capacitor element 110 is constructed in which the gate electrode 70 functions as one terminal of the capacitor, the semiconductor substrate 20 functions as the other terminal of the capacitor, and the gate insulating film 21 formed on the second active area 4e functions as an insulator The fabrication method of the capacitor element is the same as that of the NAND-type nonvolatile memory of the first embodiment, and thus descriptions thereof will be omitted.

According to this embodiment, it is possible to provide the same advantages as provided by the first embodiment. Besides, by providing the contact 17a to the gate electrode 70 and providing the contact 17b to the semiconductor substrate 20, it is possible to obtain a capacitor element in an easy manner.

In this embodiment, the capacitance of the capacitor element may be easily changed by changing the thickness of the gate insulating film 21 or the size of the second active area 4e.

A plurality of capacitor elements may be provided in series or parallel and be connected to the upper metal wiring, thereby making various capacitor elements.

The openings 45c may be provided in a singular form and may have other shapes such as an elliptical shape, other than a rectangular shape. In addition, the openings 45c may not contain the contact 17a.

The contact 17a provided to the gate electrode 70 and the contact 17b provided to the semiconductor substrate 20 may be provided in a plural form.

Fourth Embodiment

A fourth embodiment is directed to, as similarly to the first embodiment, the NAND-type nonvolatile memory in which the second inter-electrode insulating films between the lower gate electrode layers and the upper gate electrode layers of the select gate region and the peripheral circuit region are removed.

Figure 42A:
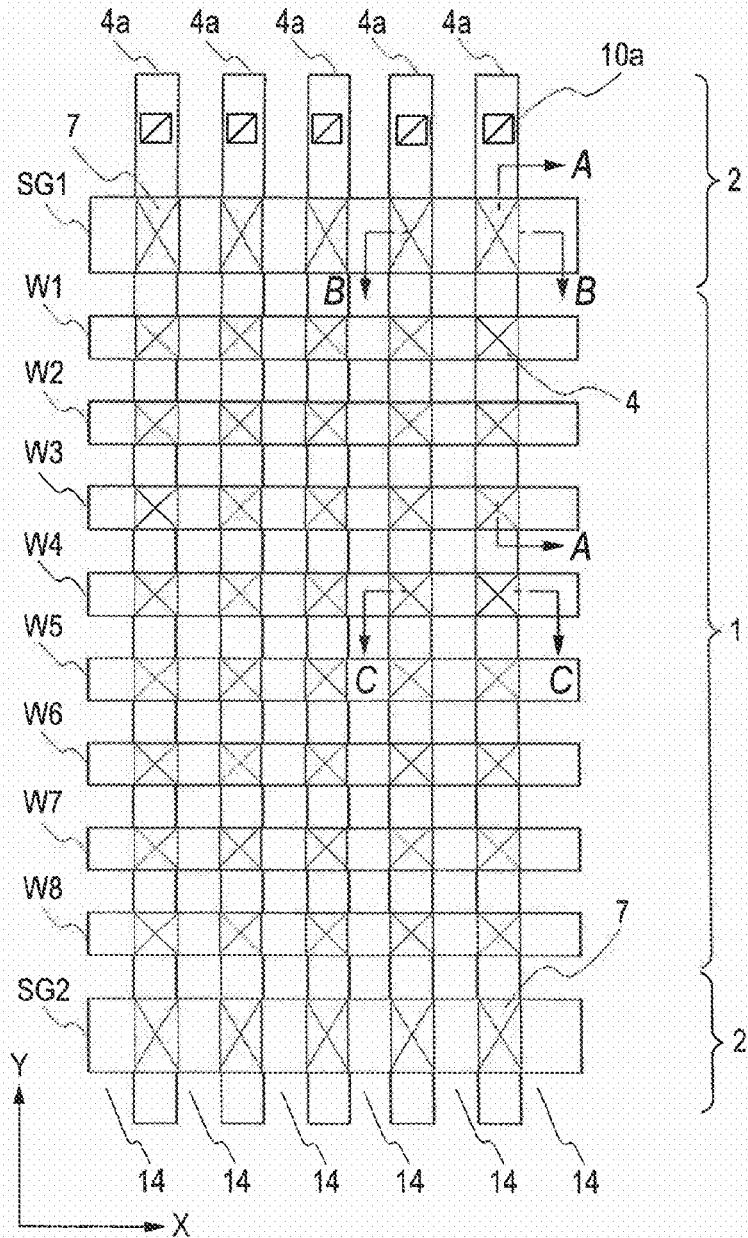
FIG. 42A is a top view schematically showing the structure of a memory cell region and a select gate region of a NAND-type nonvolatile memory according to a fourth embodiment.
Figure 42B:
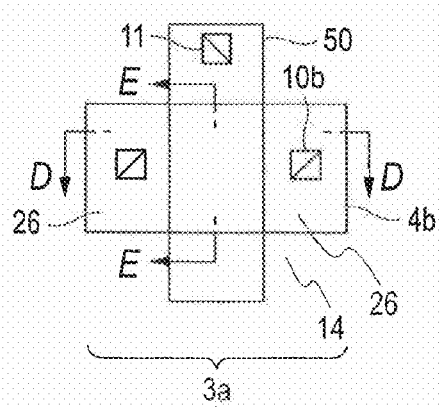
FIG. 42B is a top view schematically showing the structure of a MOS transistor of a peripheral circuit region of the NAND-type nonvolatile memory according to the fourth embodiment.
Figure 43A:
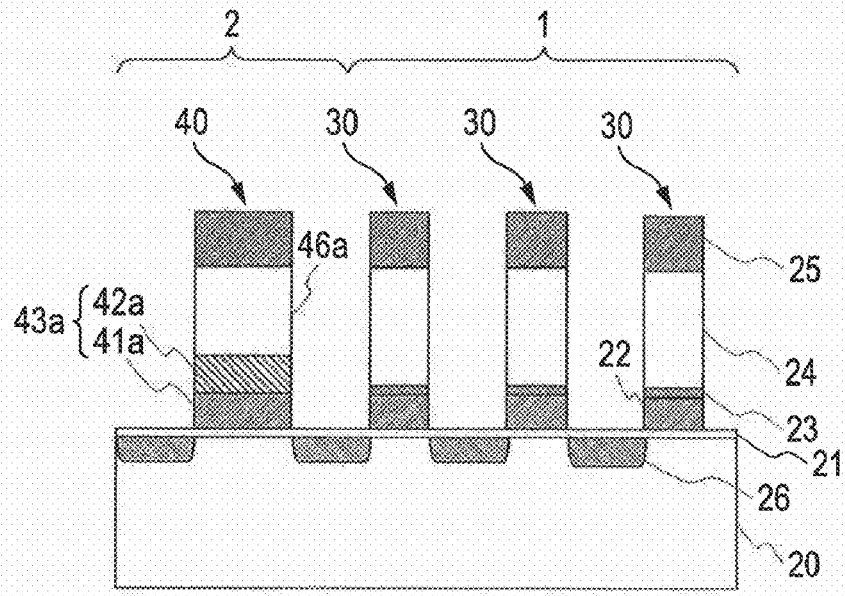
FIG. 43A is a sectional view taken along the line A-A in FIG. 42A.
Figure 43B:
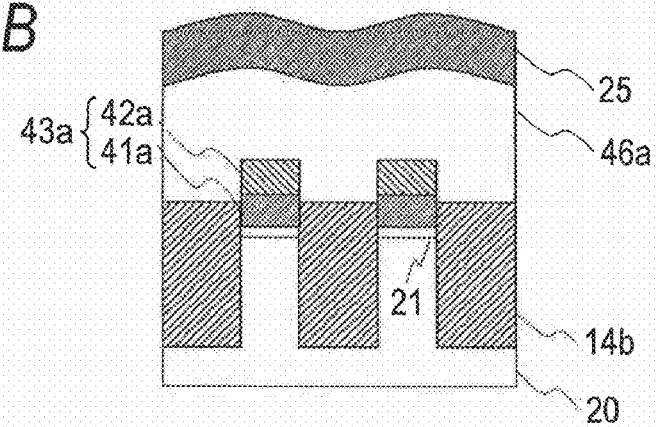
FIG. 43B is a sectional view taken along the line B-B in FIG. 42A.
Figure 43C:
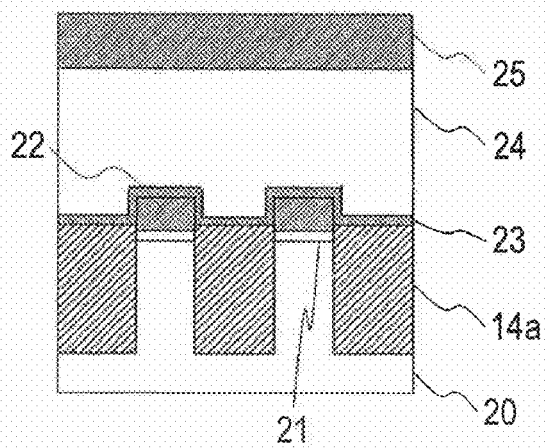
FIG. 43C is a sectional view taken along the line C-C in FIG. 42A.
Figure 44A:
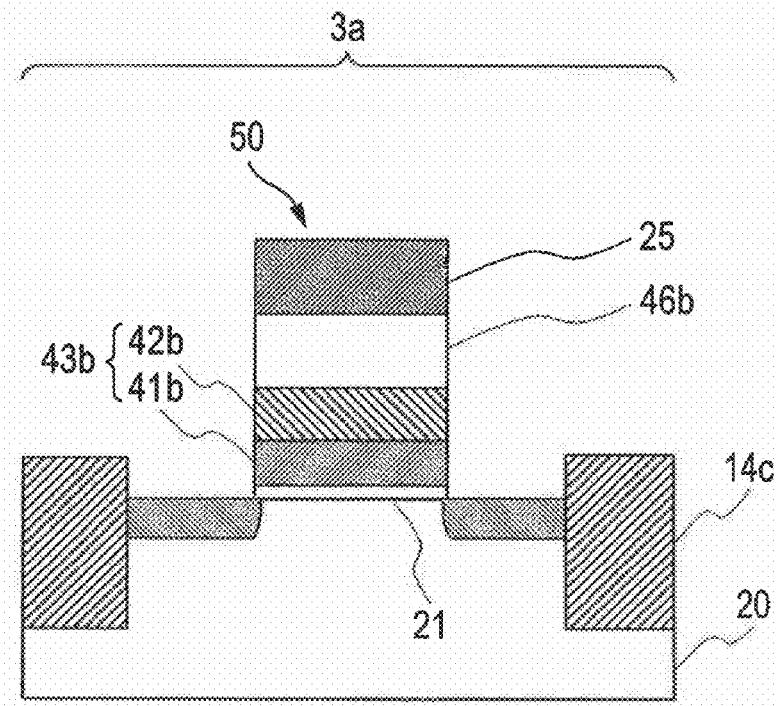
FIG. 44A is a sectional view taken along the line D-D in FIG. 42B.
Figure 44B:
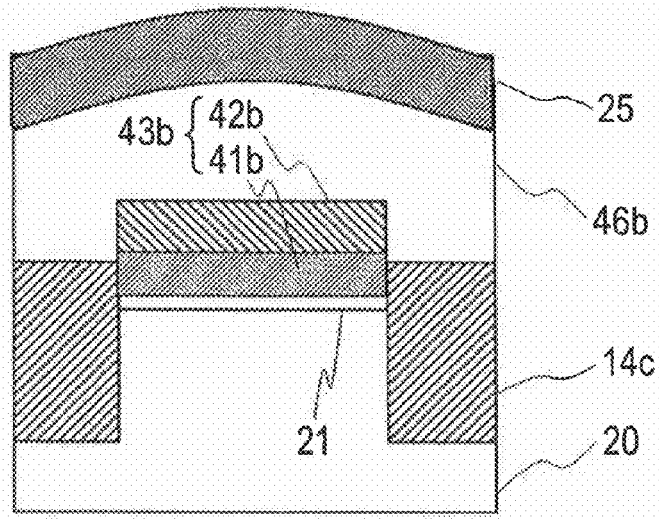
FIG. 44B is a sectional view taken along the line E-E in FIG. 42B.
Figure 45A:
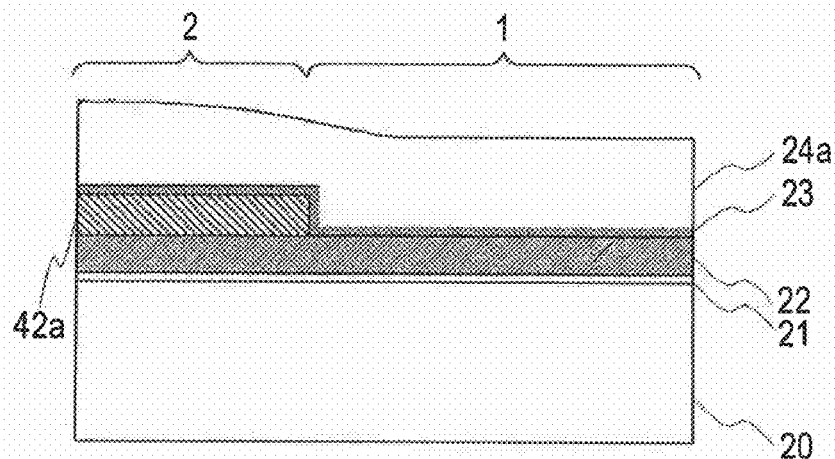
FIGS. 45A to 45C are sectional views schematically showing the fabrication process steps of the NAND-type nonvolatile memory according to the fourth embodiment.
Figure 45B:
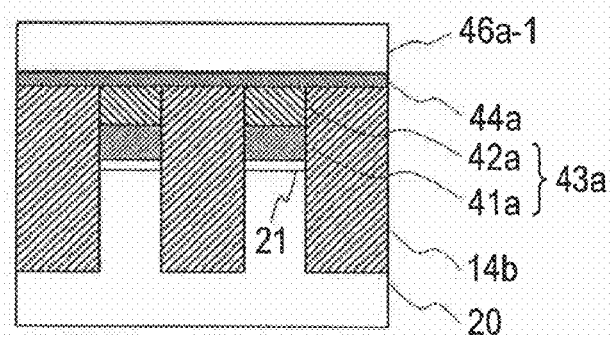
Figure 45C:
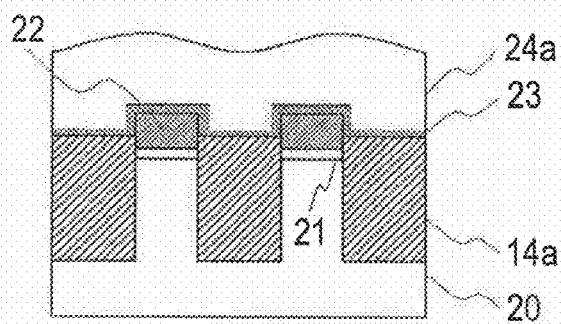
Figure 46A:
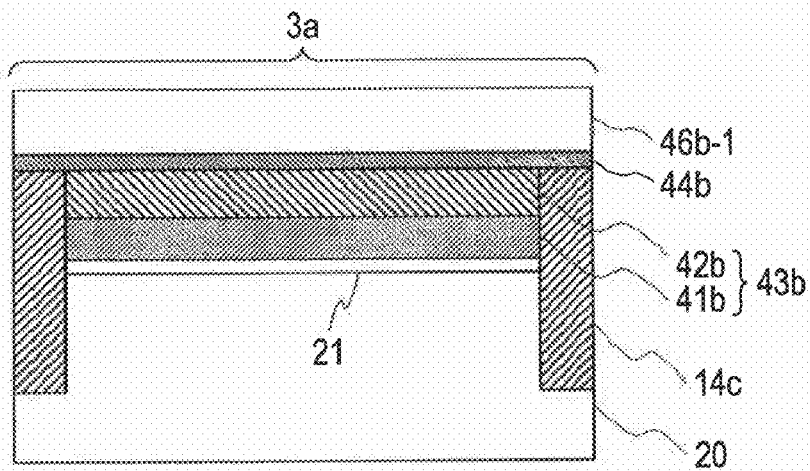
FIGS. 46A and 46B are sectional view schematically showing the fabrication process steps of the NAND-type nonvolatile memory according to the fourth embodiment.
Figure 46B:
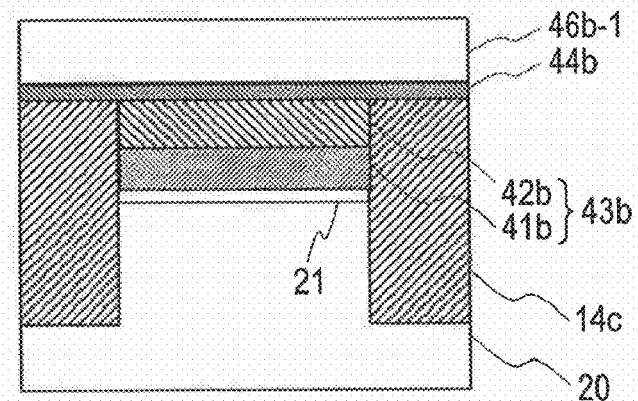

FIGS. 42A to 44B are views schematically showing the structure of a NAND-type nonvolatile memory according to the fourth embodiment, in which FIG. 42A is a top view of a memory cell region and a select gate region, FIG. 42B is a top view schematically showing the structure of a MOS transistor of a peripheral circuit region, FIG. 43A is a sectional view taken along the line A-A in FIG. 42A, FIG. 43B is a sectional view taken along the line B-B in FIG. 42A, FIG. 43C is a sectional view taken along the line C-C in FIG. 42A, FIG. 44A is a sectional view taken along the line D-D in FIG. 42B, and FIG. 44B is a sectional view taken along the line E-E in FIG. 42B. Those parts identical or similar to those of the first embodiment will be denoted by the same or similar reference numerals, and thus only characteristic portions of this embodiment will be described.

As shown in FIGS. 43A to 43C, in the memory cell region 1, the first inter-electrode insulating film 23 is formed between the first gate electrode layer 22 and the second gate electrode layer 24. However, as shown in FIGS. 43A to 43C and 44A to 44B, in the select gate region 2 and the peripheral circuit region 3a, the upper gate electrode layers 46a and 46b are directly formed on the lower gate electrode layers 43a and 43b that include the first lower gate electrode layers 41a and 41b formed on the gate insulating films 21b and 21c and having the same thickness as the first gate electrode layer 22 and the second lower gate electrode layers 42a and 42b formed on the first lower gate electrode layers 41a and 41b, such that the height of the upper gate electrode layers 46a and 46b are substantially the same as the height of the upper surface of the second gate electrode layer 24 of the memory cell region 1. That is, in the select gate region 2 and the peripheral circuit region 3a, the second inter-electrode insulating films 44a and 44b which are formed between the lower gate electrode layers 43a and 43b and the upper gate electrode layers 46a and 46b are removed. Other structures are the same as those of the first embodiment.

Next, a fabrication method of the NAND-type nonvolatile memory will be described with reference to FIGS. 45A to 56B.

FIGS. 45A to 56B are sectional views schematically showing the fabrication process steps of the NAND-type nonvolatile memory according to the fourth embodiment. FIGS. 45A to 45C, 47A to 47C, 49A to 49C, 51A to SiC, 53A to 53C, and 55A to 55C are sectional views taken along the lines A-A, B-B, and C-C in FIG. 42A, respectively, and FIGS. 46A and 46B, 48A and 48B, 50A and 50B, 52A and 52B, 54A and 54B, and 56A and 56B are sectional views taken along the lines D-D and E-E in FIG. 42B, respectively. Those parts identical or similar to those of the first embodiment will be denoted by the same or similar reference numerals and thus detailed descriptions thereof will be omitted.

In a manner similar to the first embodiment, a series of process steps from the step of forming the gate insulating film 21 on the semiconductor substrate 20 to the step of forming the second gate electrode lower layer 24a on the first and second inter-electrode insulating films 23, 44a and 44b are performed. In this embodiment, however, the thickness of the second lower gate electrode layers 42a and 42b are 10 nm or more larger than the thicknesses of the second inter-electrode insulating films 44a and 44b.

As shown in FIGS. 45A to 45C and 46A to 46B, on the first element isolation insulating film 14a, the second element isolation insulating films 14b and 14c, the first gate electrode layer 22, and the second lower gate electrode layers 42a and 42b, the first and second inter-electrode insulating films 23, 44a and 44b formed of, for example, an ONO film are formed to a thickness of about 12 nm to about 17 nm. Subsequently, on the first and second inter-electrode insulating films 23, 44a and 44b, the second gate electrode lower layer 24a formed of, for example, polycrystalline silicon and the first and upper gate electrode lower layers 46a-1 and 46b-1 are formed. In this case, the upper surface of the second gate electrode lower layer 24a and the first and upper gate electrode lower layers 46a-1 and 46b-1 are formed so as to be about 10 nm to about 50 nm higher than the upper surfaces of the lower gate electrode layers 43a and 43b.

Figure 47A:
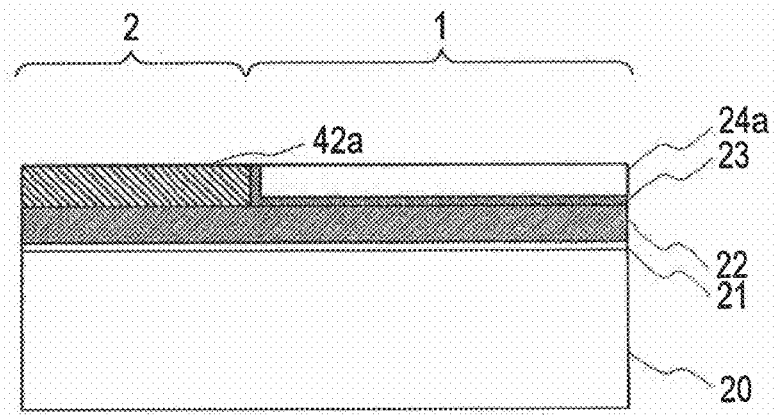
FIGS. 47A to 47C are sectional views schematically showing the fabrication process steps of the NAND-type nonvolatile memory according to the fourth embodiment, subsequent to those shown in FIGS. 45A to 45C.
Figure 47B:
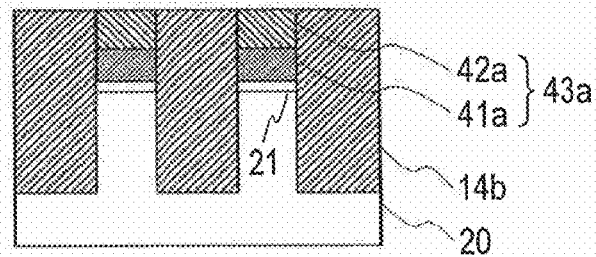
Figure 47C:
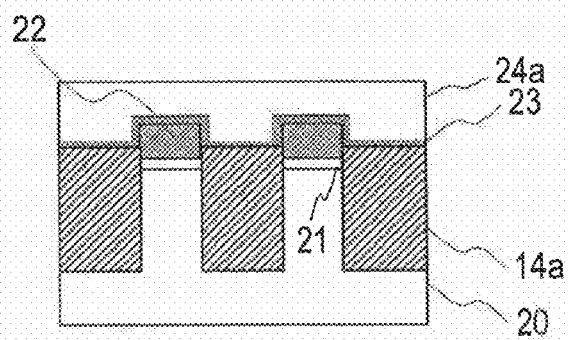
Figure 48A:
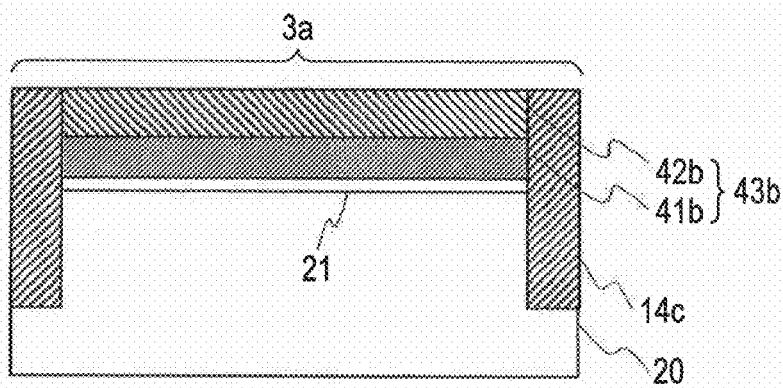
FIGS. 48A and 48B are sectional view schematically showing the fabrication process steps of the NAND-type nonvolatile memory according to the fourth embodiment, subsequent to those shown in FIGS. 46A and 46B.
Figure 48B:
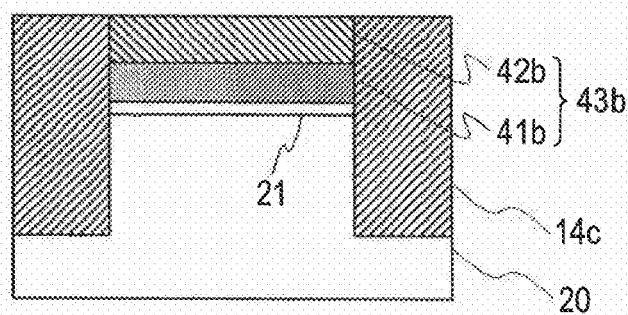

As shown in FIGS. 47A to 47C and 48A to 48B, using the second element isolation insulating films 14b and 14c as a stopper, a CMP process is performed to remove the second gate electrode lower layer 24a and the second inter-electrode insulating films 44a and 44b formed on the upper surfaces of the second element isolation insulating films 14b and 14c in the select gate region 2 and the peripheral circuit region 3a, thereby exposing the upper surfaces of the lower gate electrode layers 43a and 43b and the second element isolation insulating films 14b and 14c. In this case, the first inter-electrode insulating film 23 of the memory cell region 1 shown in FIGS. 47A and 47C is not removed because the second gate electrode lower layer 24a functions as a protective film. The upper surface of the second gate electrode lower layer 24a of the memory cell region 1 is planarized.

Figure 49A:
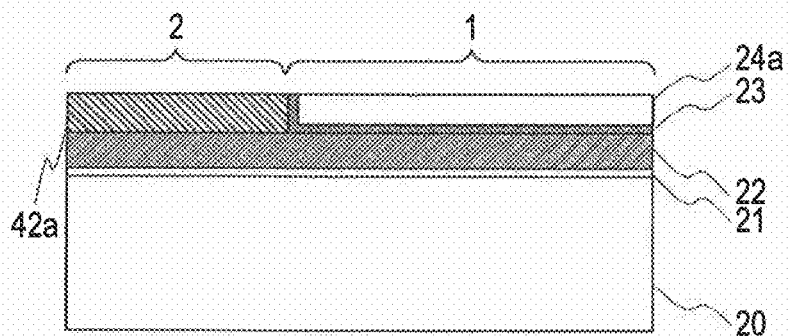
FIGS. 49A to 49C are sectional views schematically showing the fabrication process steps of the NAND-type nonvolatile memory according to the fourth embodiment, subsequent to those shown in FIGS. 47A to 47C.
Figure 49B:
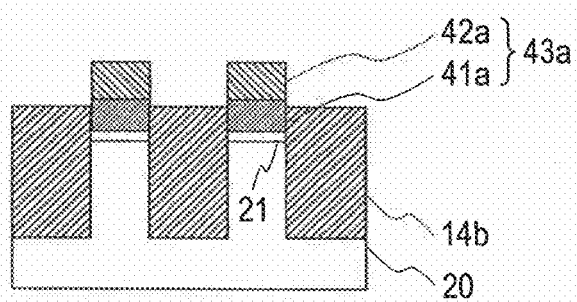
Figure 49C:
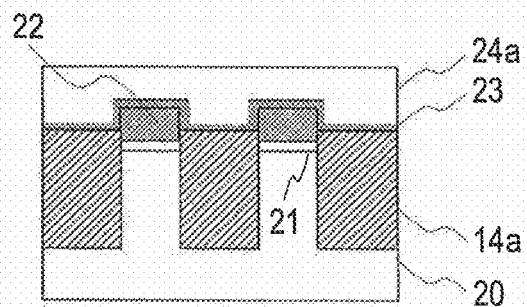
Figure 50A:
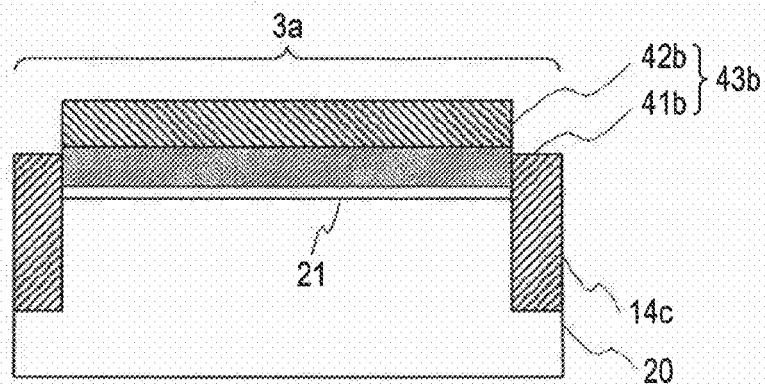
FIGS. 50A and 50B are sectional view schematically showing the fabrication process steps of the NAND-type nonvolatile memory according to the fourth embodiment, subsequent to those shown in FIGS. 48A and 48B.
Figure 50B:
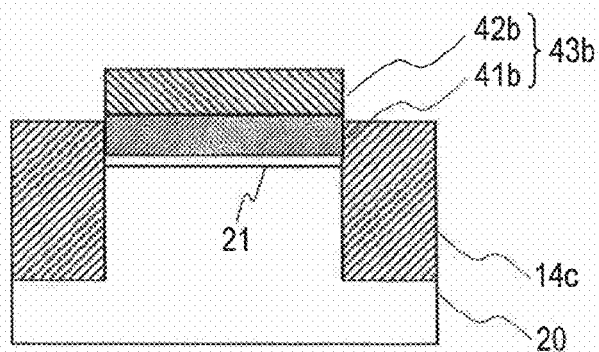
Figure 51A:
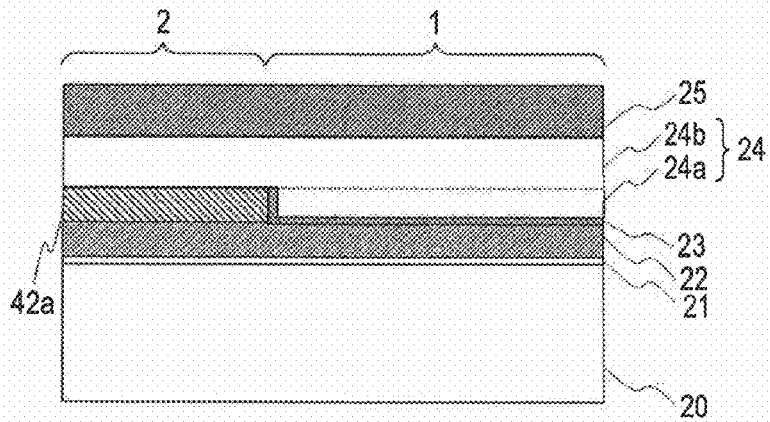
FIGS. 51A to 51C are sectional views schematically showing the fabrication process steps of the NAND-type nonvolatile memory according to the fourth embodiment, subsequent to those shown in FIGS. 49A to 49C.
Figure 51B:
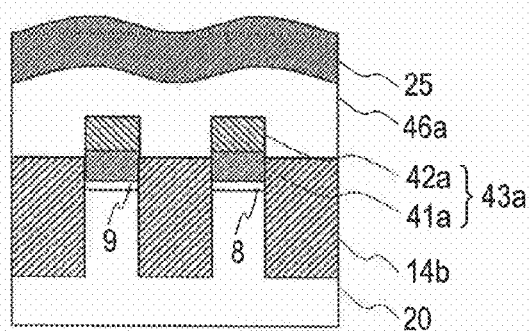
Figure 51C:
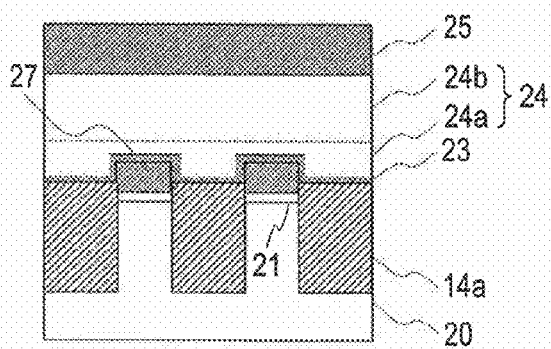
Figure 52A:
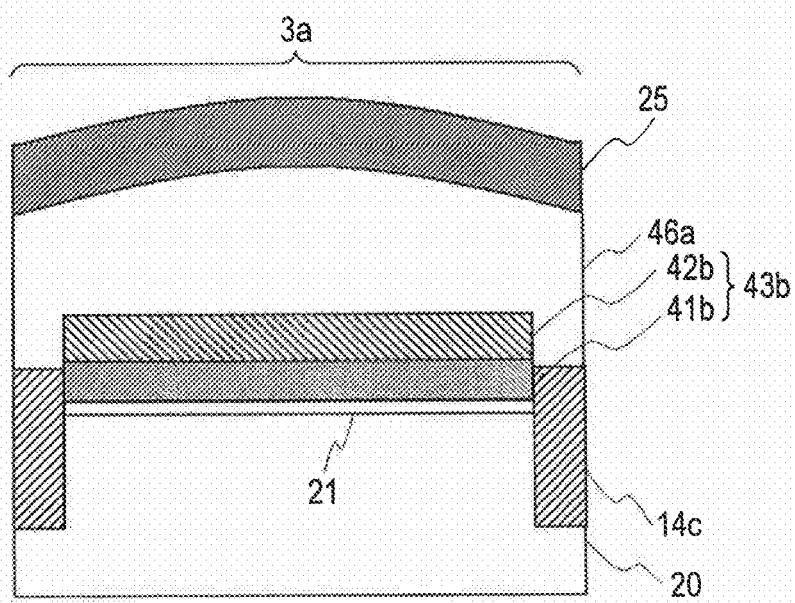
FIGS. 52A and 52B are sectional view schematically showing the fabrication process steps of the NAND-type nonvolatile memory according to the fourth embodiment, subsequent to those shown in FIGS. 50A and 50B.
Figure 52B:
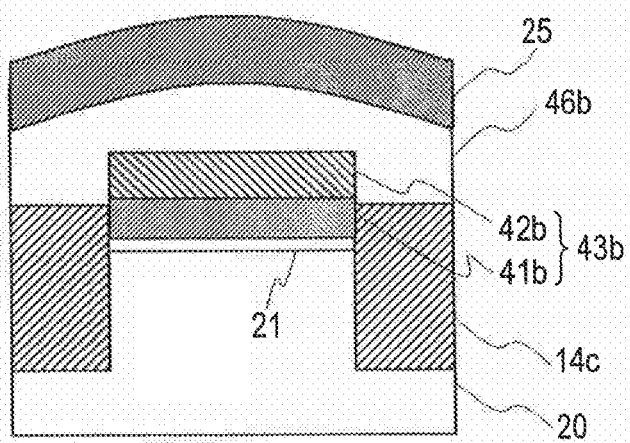
Figure 53A:
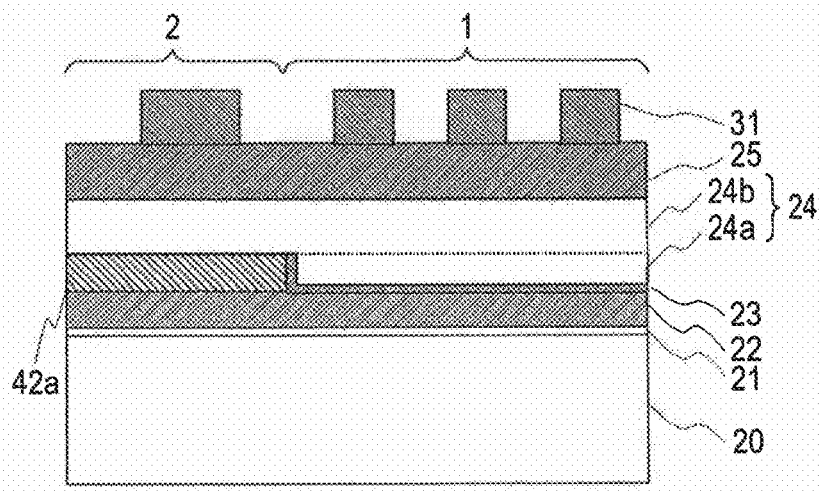
FIGS. 53A to 53C are sectional views schematically showing the fabrication process steps of the NAND-type nonvolatile memory according to the fourth embodiment, subsequent to those shown in FIGS. 51A to 51C.
Figure 53B:
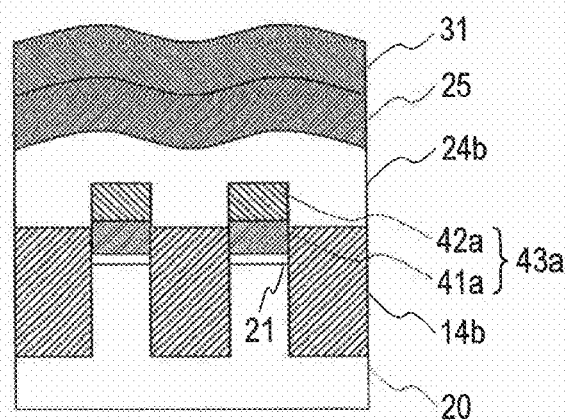
Figure 53C:
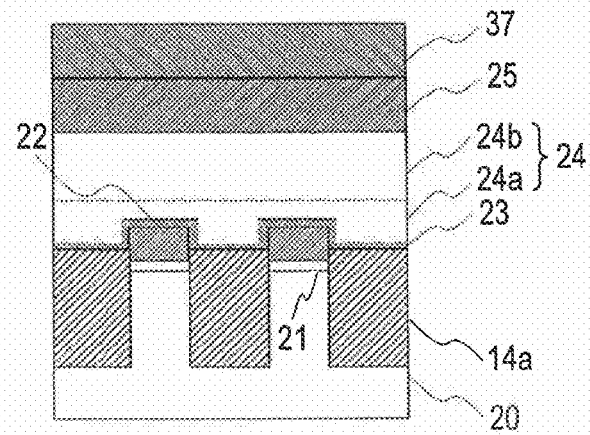
Figure 54A:
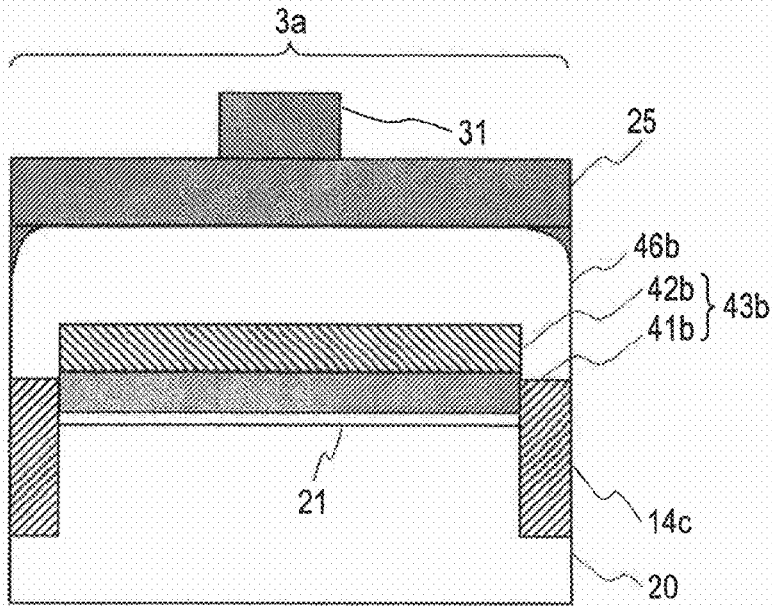
FIGS. 54A and 54B are sectional view schematically showing the fabrication process steps of the NAND-type nonvolatile memory according to the fourth embodiment, subsequent to those shown in FIGS. 52A and 52B.
Figure 54B:
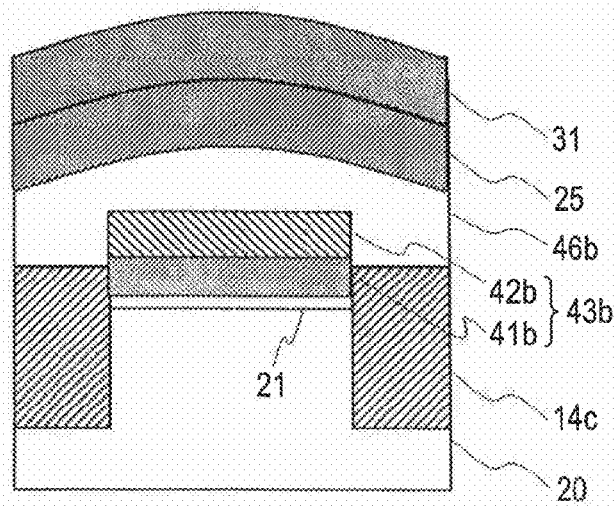
Figure 55A:
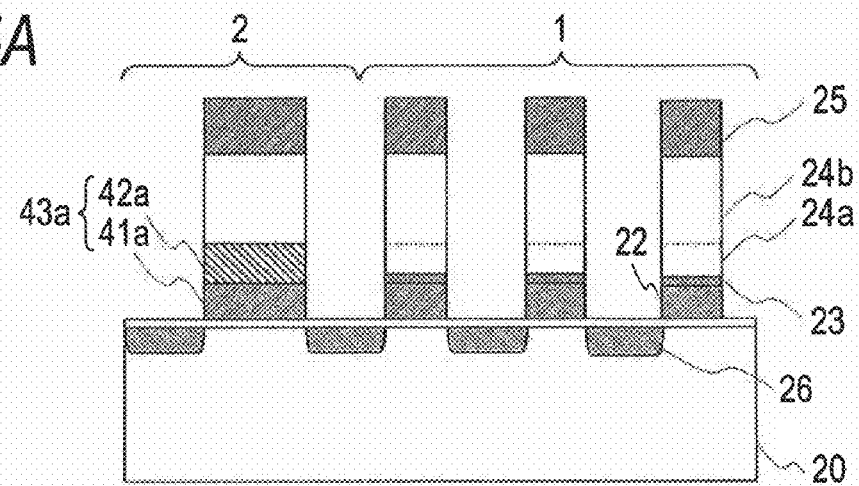
FIGS. 55A to 55C are sectional views schematically showing the fabrication process steps of the NAND-type nonvolatile memory according to the fourth embodiment, subsequent to those shown in FIGS. 53A to 53C.
Figure 55B:
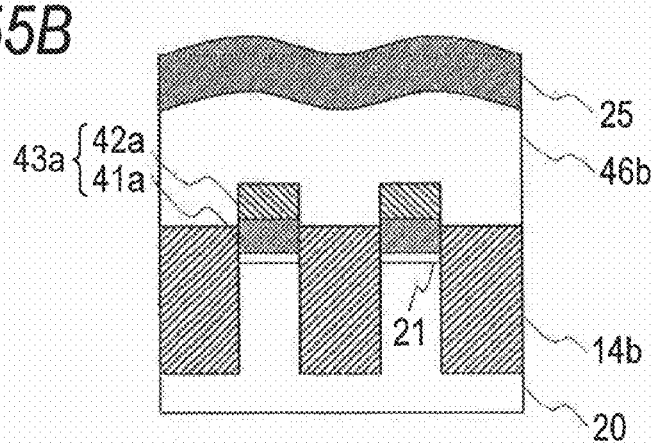
Figure 55C:
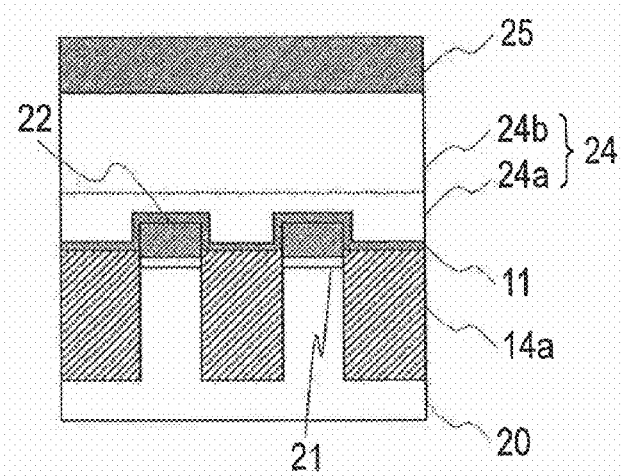
Figure 56A:
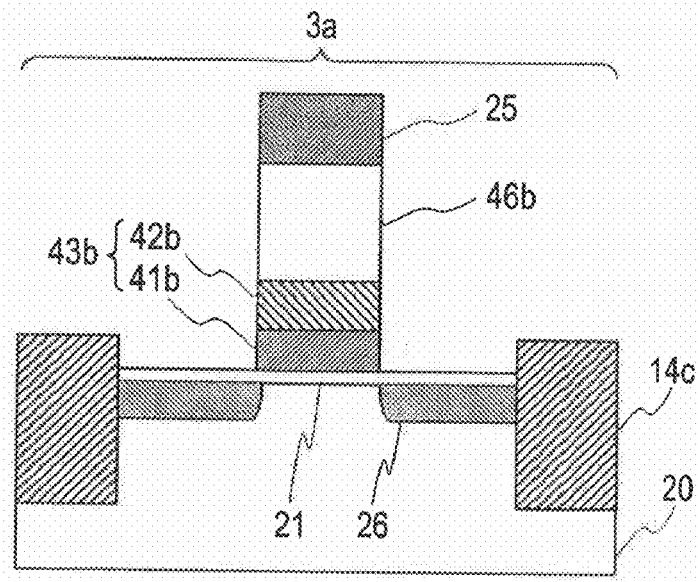
FIGS. 56A and 56B are sectional view schematically showing the fabrication process steps of the NAND-type nonvolatile memory according to the fourth embodiment, subsequent to those shown in FIGS. 54A and 54B.
Figure 56B:
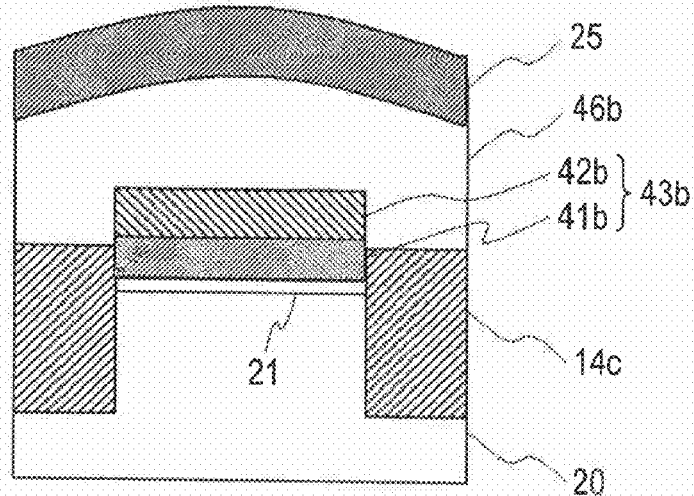

As shown in FIGS. 49A to 49C and 50A to SOB, in order to remove a natural oxide film (not shown) formed on the surfaces of the lower gate electrode layers 43a and 43b exposed by the CMP process, a cleaning treatment is performed using a hydrofluoric acid-based solution such as a solution of hydrogen fluoride or fluorinated acid. In this case, as shown in FIGS. 49B and 50B, the upper portion of the surfaces of the second element isolation insulating films 14b and 14c formed of SiO₂, exposed by the CMP process are also removed by about 30 nm by the cleaning treatment using the hydrofluoric acid-based solution. However, the height of the upper surfaces of the element isolation insulating films 14b and 14c from the upper surface of the semiconductor substrate 20 is at least 10 nm and is higher than the height of the upper surface of the semiconductor substrate 20. The height of the upper surfaces of the second element isolation insulating films 14b and 14c as observed from the upper surface of the semiconductor substrate 20 may be lower than the height of the upper surface of the first gate electrode layer 22 as long as it is higher than the height of the upper surface of the semiconductor substrate 20.

As shown in FIGS. 51A to 51C and 52A to 52B, on the surface of the second gate electrode lower layer 24a, the surfaces of the lower gate electrode layers 43a and 43b, and the surfaces of the second element isolation insulating films 14b and 14c, the second gate electrode upper layer 24b and the upper gate electrode layers 46a and 46b are formed to a thickness of about 80 nm to about 200 nm. Subsequently, on the second gate electrode upper layer 24b and the upper gate electrode layers 46a and 46b, the insulating film 25 formed of, for example, SiN is formed to a thickness of about 50 nm to about 150 nm.

As shown in FIGS. 53A to 53C and 54A to 54B, the third mask material 31 formed of, for example, a silicon oxide film (SiO₂) is formed on the insulating film 25. Thereafter, the third mask material 31 is lithographically patterned. As shown in FIGS. 55A to 55C and 56A to 56B, using the third mask material 31 as a mask, the insulating film 25, the second gate electrode upper layer 24b, the upper gate electrode layers 46a and 46b, the first inter-electrode insulating film 23, the first gate electrode layer 22, and the lower gate electrode layers 43a and 43b are removed by an anisotropic etching process, thereby forming the gate electrodes 30, 40, 50 of the memory cell transistors 6, the select gate transistors 7, and the MOS transistor 8, respectively. Thereafter, using the gate electrodes 30, 40 and 50 as a mask, the impurity diffusion layer regions 26 are formed by an ion implantation method. In some cases, the third mask material 31 may be completely removed by an anisotropic etching process subsequent to the anisotropic etching of the insulating film 25 when forming the gate electrodes 30, 40 and 50. The subsequent process steps are the same as those of the first embodiment and thus descriptions thereof will be omitted.

According to this embodiment, the lower gate electrode layers 43a and 43b of the select gate region 2 and the peripheral circuit region 3a are constructed in a laminated structure in which the second lower gate electrode layers 42a and 42b are stacked on the first lower gate electrode layers 41a and 41b having the same thickness as the first gate electrode layer 22 of the memory cell region 1. In addition, the height of the upper surfaces of the second element isolation insulating films 14b and 14c as observed from the upper surface of the semiconductor substrate 20 is substantially the same as the height of the upper surfaces of the lower gate electrode layers 43a and 43b. Accordingly, it is possible to provide a NAND-type nonvolatile memory having the same advantages as provided by the first embodiment.

Since the second inter-electrode insulating films 44a and 44b between the lower gate electrode layers 43a and 43b and the upper gate electrode layers 46a and 46b of the select gate transistors 7 and the MOS transistor 8 are completely removed, it is possible to decrease the resistance of the gate electrode layers. Accordingly, it is possible to increase the operating speed of the MOS transistor and to decrease the influence of the gate leakage on the potential drop.

Since it is not necessary to perform the lithography and patterning processes for forming the openings 45a and 45b of the second inter-electrode insulating films 44a and 44b, it is possible to decrease the number of process steps required.

It goes without saying that the resistor element and the capacitor element of the second and third embodiments may be applied to this embodiment.

Fifth Embodiment

A fifth embodiment is directed to, as similarly to the first embodiment, the NAND-type nonvolatile memory in which the width of the second lower gate electrode layer of the lower gate electrode layer is smaller than the width of the first lower gate electrode layer.

Figure 57A:
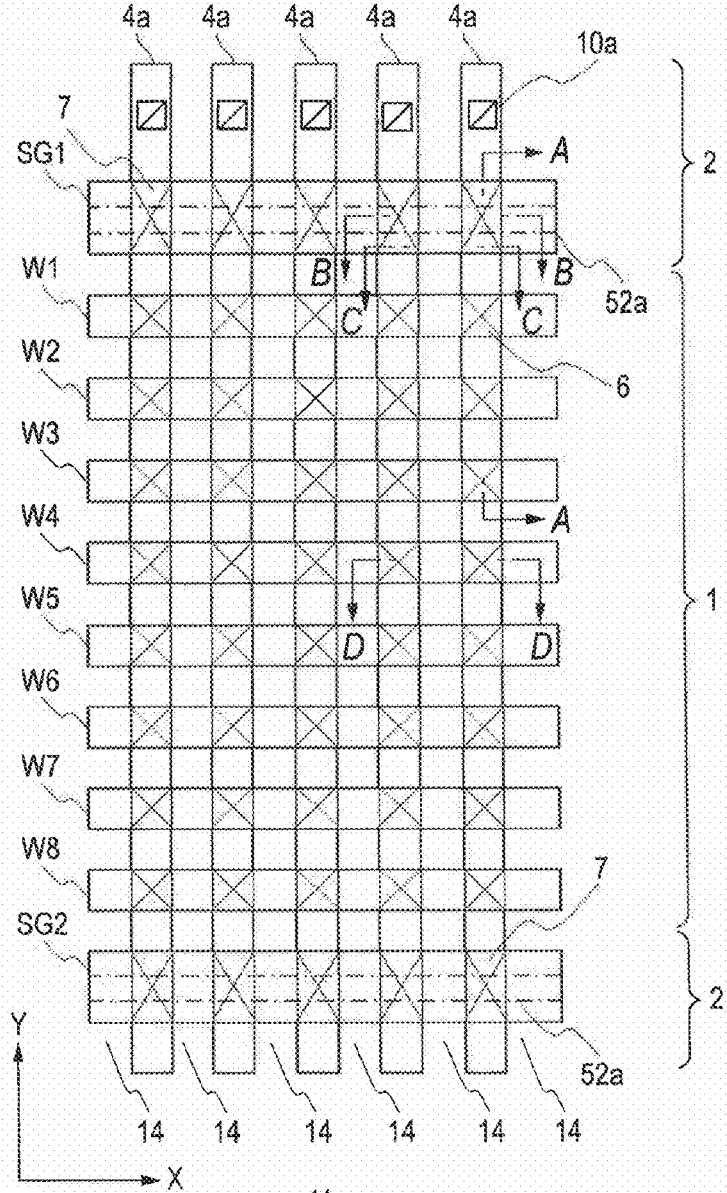
FIG. 57A is a top view schematically showing the structure of a memory cell region and a select gate region of a NAND-type nonvolatile memory according to a fifth embodiment.
Figure 57B:
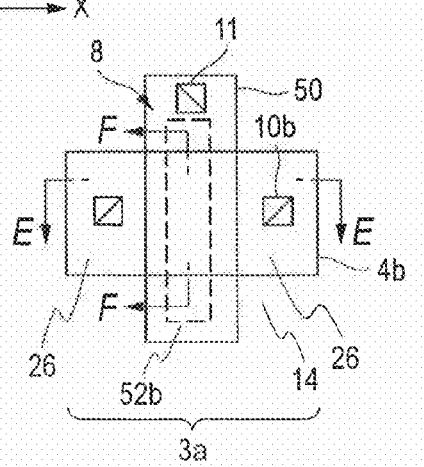
FIG. 57B is a top view schematically showing the structure of a MOS transistor of a peripheral circuit region of the NAND-type nonvolatile memory according to the fifth embodiment.
Figure 58A:
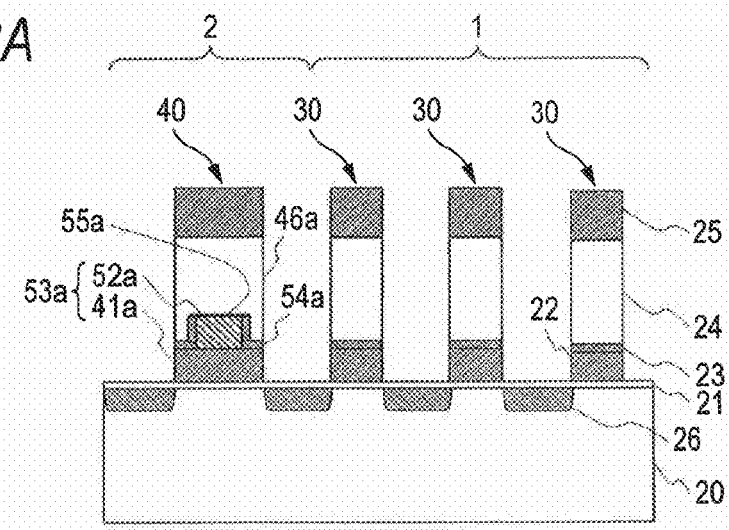
FIG. 58A is a sectional view taken along the line A-A in FIG. 57A.
Figure 58B:
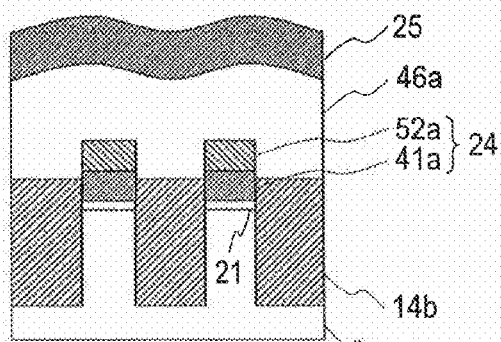
FIG. 58B is a sectional view taken along the line B-B in FIG. 57A.
Figure 58C:
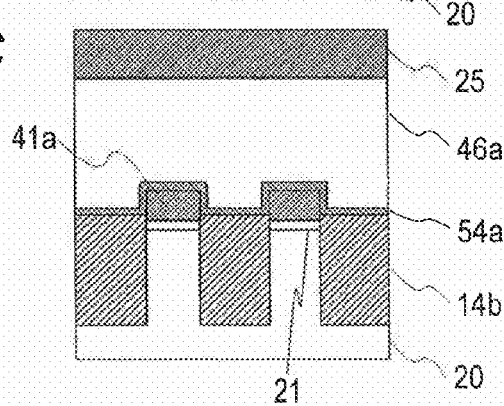
FIG. 58C is a sectional view taken along the line C-C in FIG. 57A.
Figure 58D:
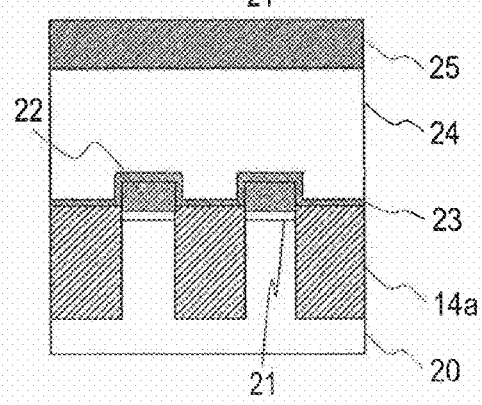
FIG. 58D is a sectional view taken along the line D-D in FIG. 57A.
Figure 59A:
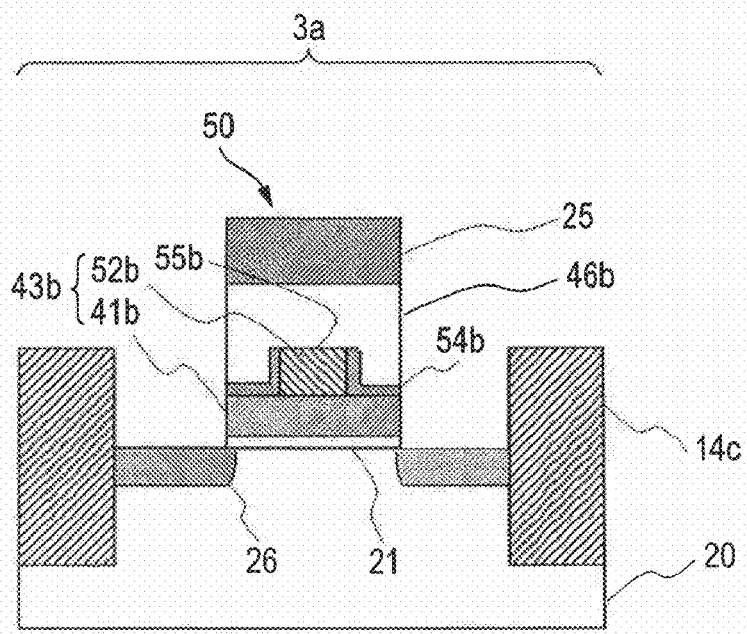
FIG. 59A is a sectional view taken along the line E-E in FIG. 57B.
Figure 59B:
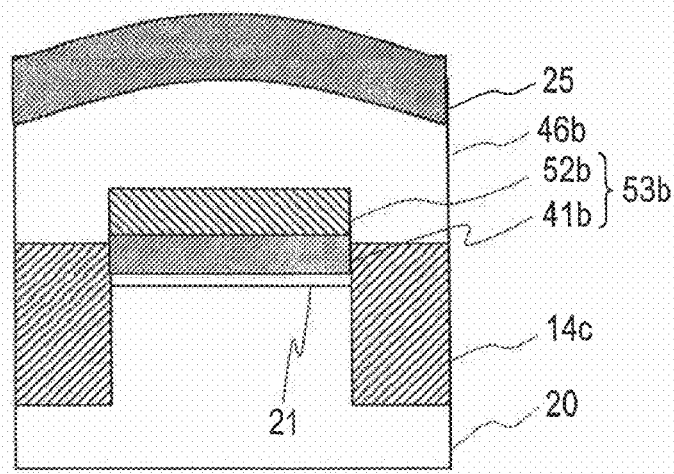
FIG. 59B is a sectional view taken along the line F-F in FIG. 57B.
Figure 60A:
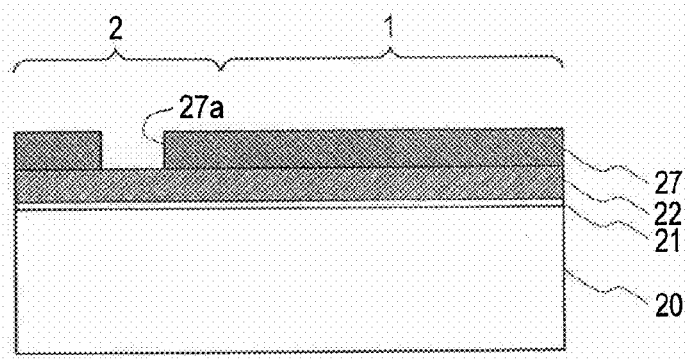
FIGS. 60A to 60D are sectional views schematically showing the fabrication process steps of the NAND-type nonvolatile memory according to the fifth embodiment.
Figure 60B:
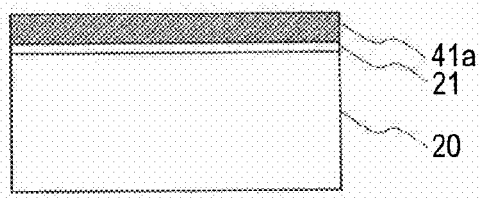
Figure 60C:
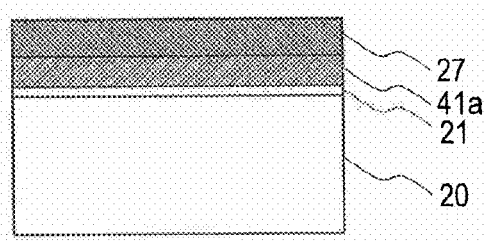
Figure 60D:
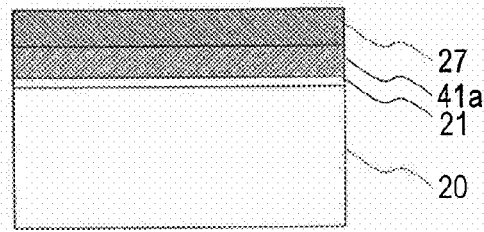
Figure 61A:
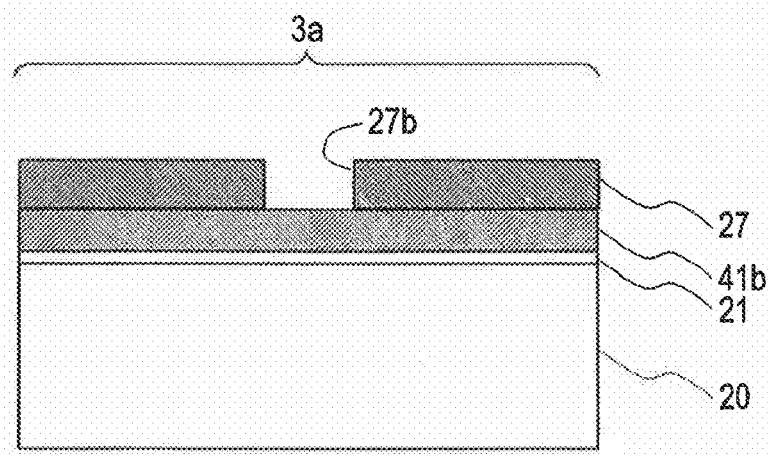
FIGS. 61A and 61B are sectional view schematically showing the fabrication process steps of the NAND-type nonvolatile memory according to the fifth embodiment.
Figure 61B:
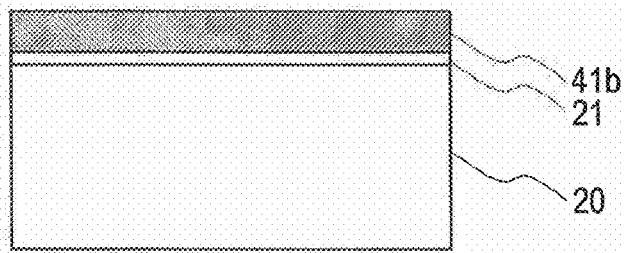
Figure 62A:
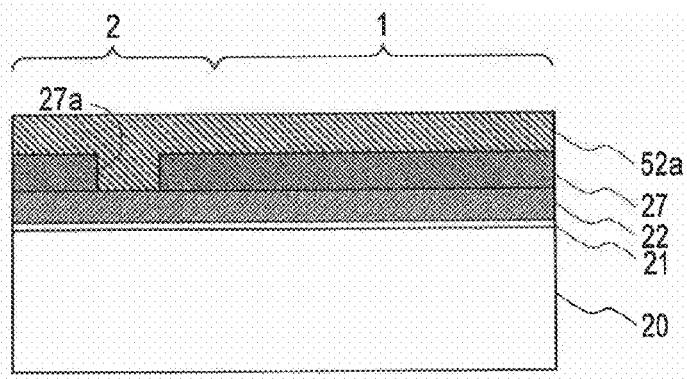
FIGS. 62A to 62D are sectional views schematically showing the fabrication process steps of the NAND-type nonvolatile memory according to the fifth embodiment, subsequent to those shown in FIGS. 60A to 60D.
Figure 62B:
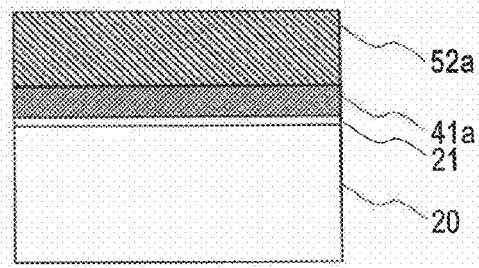
Figure 62C:
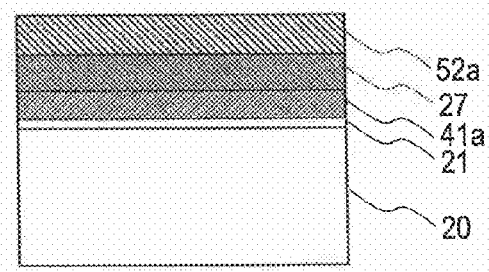
Figure 62D:
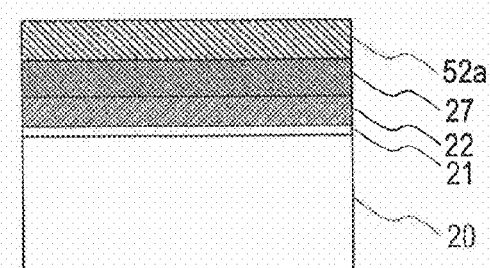
Figure 63A:
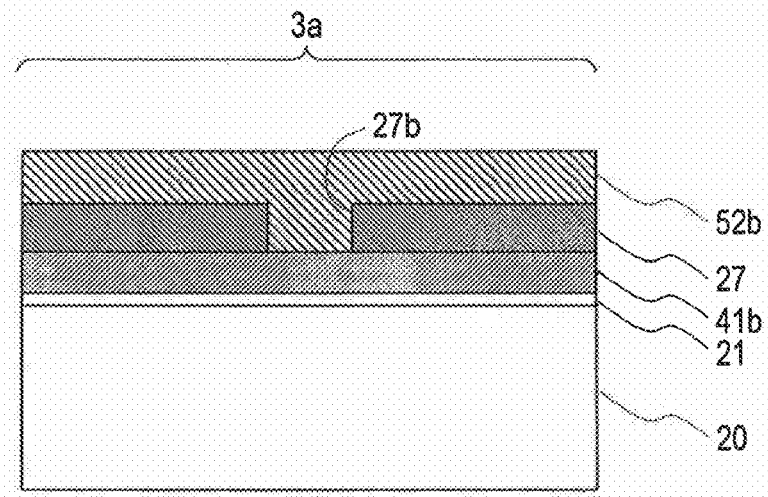
FIGS. 63A and 63B are sectional view schematically showing the fabrication process steps of the NAND-type nonvolatile memory according to the fifth embodiment, subsequent to those shown in FIGS. 61A and 61B.
Figure 63B:
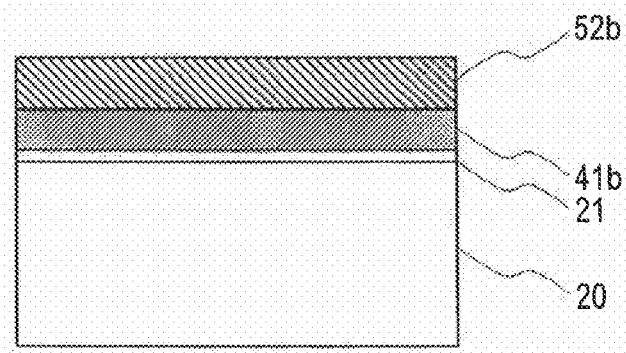
Figure 64A:
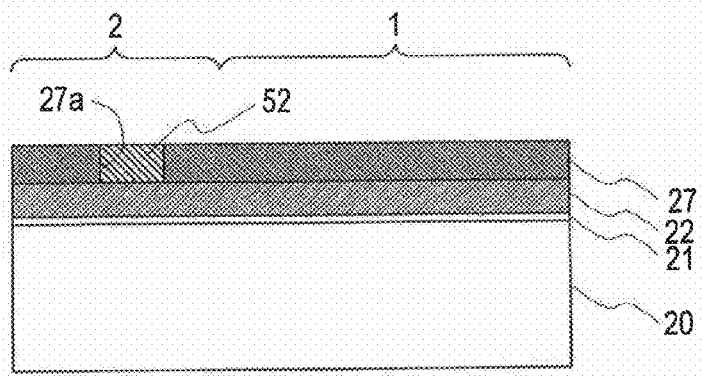
FIGS. 64A to 64D are sectional views schematically showing the fabrication process steps of the NAND-type nonvolatile memory according to the fifth embodiment, subsequent to those shown in FIGS. 62A to 62D.
Figure 64B:
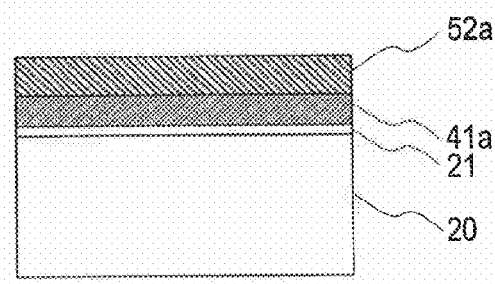
Figure 64C:
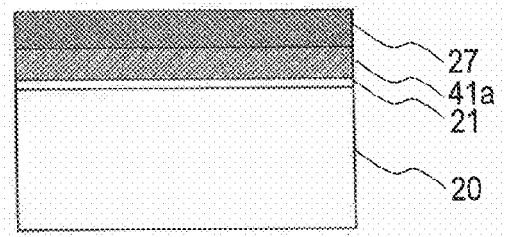
Figure 64D:
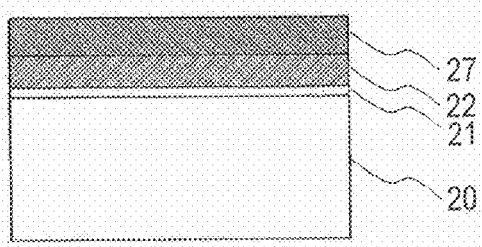
Figure 65A:
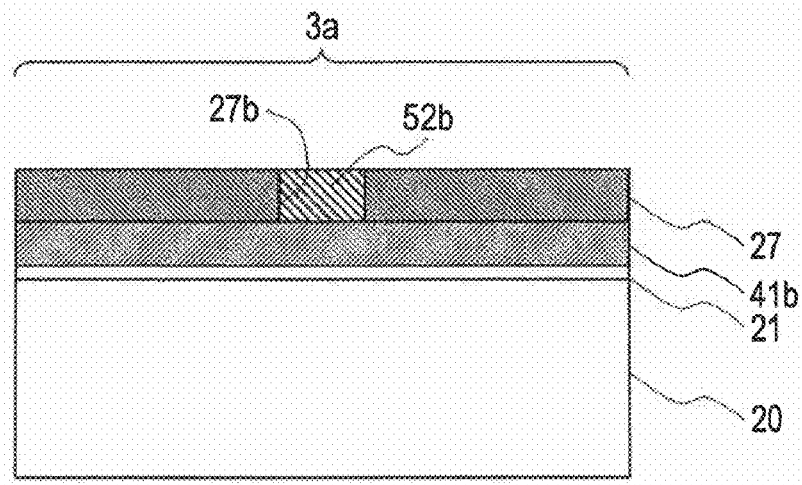
FIGS. 65A and 65B are sectional view schematically showing the fabrication process steps of the NAND-type nonvolatile memory according to the fifth embodiment, subsequent to those shown in FIGS. 63A and 63B.
Figure 65B:
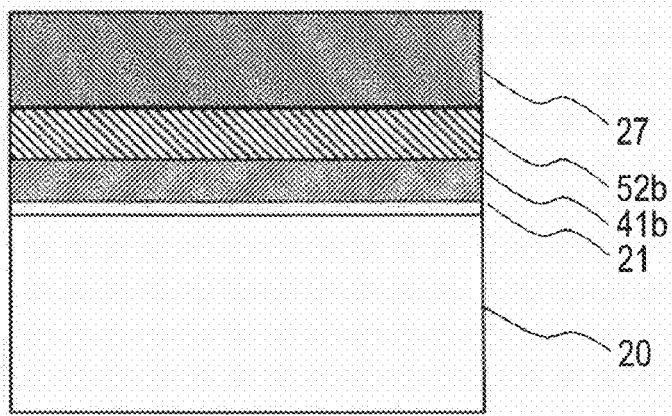
Figure 66A:
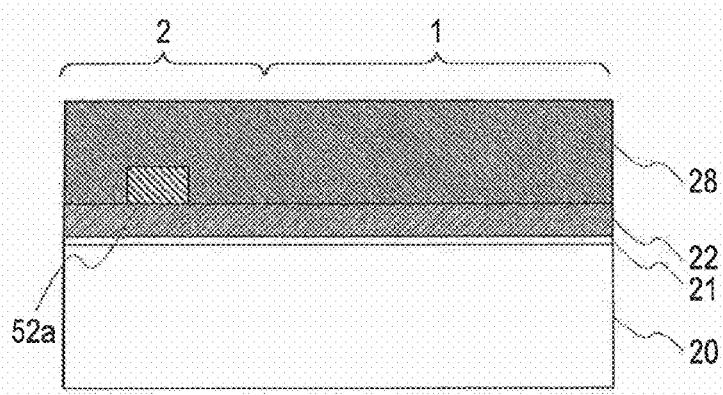
FIGS. 66A to 66D are sectional views schematically showing the fabrication process steps of the NAND-type nonvolatile memory according to the fifth embodiment, subsequent to those shown in FIGS. 64A to 64D.
Figure 66B:
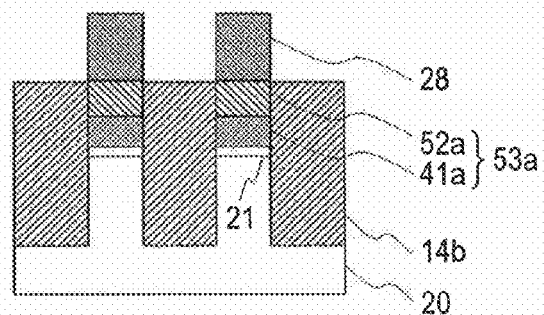
Figure 66C:
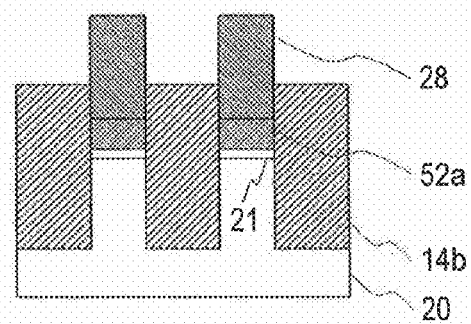
Figure 66D:
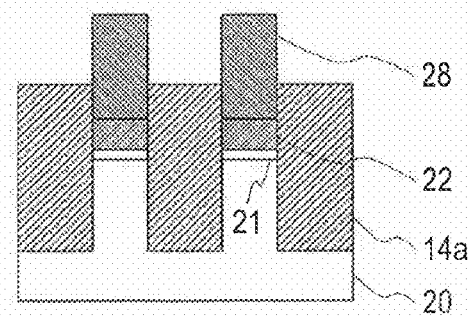
Figure 67A:
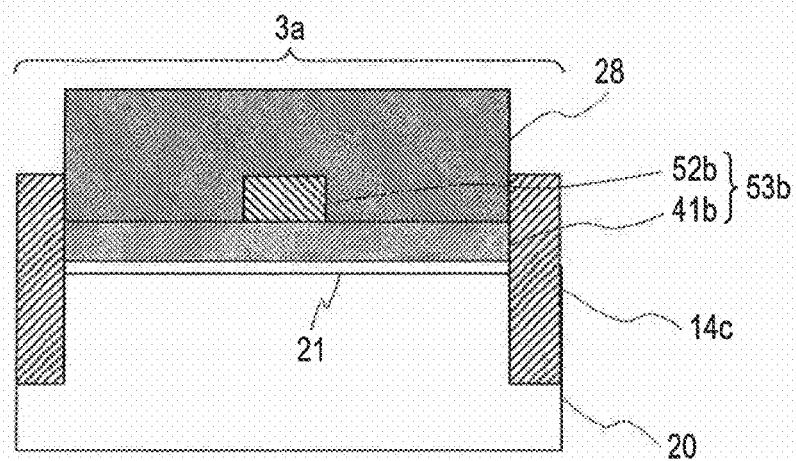
FIGS. 67A and 67B are sectional view schematically showing the fabrication process steps of the NAND-type nonvolatile memory according to the fifth embodiment, subsequent to those shown in FIGS. 65A and 65B.
Figure 67B:
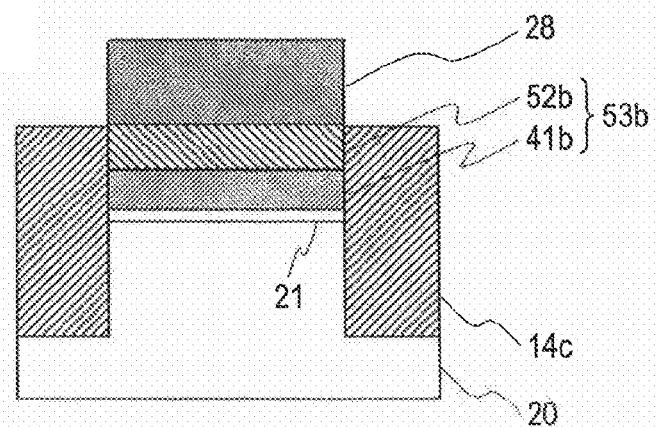

FIGS. 57A to 57B, 58A to 58D and 59A to 59B are views schematically showing the structure of a NAND-type nonvolatile memory according to the fifth embodiment, in which FIG. 57A is a top view of a memory cell region and a select gate region, FIG. 57B is a top view showing the structure of a MOS transistor of a peripheral circuit region, FIG. 58A is a sectional view taken along the line A-A in FIG. 57A, FIG. 58B is a sectional view taken along the line B-B in FIG. 57A, FIG. 58C is a sectional view taken along the line C-C in FIG. 57A, FIG. 58D is a sectional view taken along the line D-D in FIG. 57A, FIG. 59A is a sectional view taken along the line E-E in FIG. 57B, and FIG. 59B is a sectional view taken along the line F-F in FIG. 57B. Those parts identical or similar to those of the first embodiment will be denoted by the same or similar reference numerals, and thus only characteristic portions of this embodiment will be described.

As shown in FIGS. 58A to 58D and 59A and 59B, the lower gate electrode layers 43a and 43b of the select gate region 2 and the peripheral circuit region 3a include the first lower gate electrode layers 41a and 41b having the same thickness as the first gate electrode layer 22 and second lower gate electrode layers 52a and 52b formed on the first lower gate electrode layers 41a and 41b. However, in this embodiment, the widths of the second lower gate electrode layers 52a and 52b are smaller than the widths of the first lower gate electrode layers 41a and 41b. In addition, second inter-electrode insulating films 54a and 54b are formed on the upper surfaces of the first lower gate electrode layers 41a and 41b and on the side surfaces of the second lower gate electrode layers 52a and 52b, and openings 55a and 55b are formed on the upper surfaces of the second lower gate electrode layers 52a and 52b. Other structures are the same as those of the first embodiment.

Next, a fabrication method of the NAND-type nonvolatile memory will be described with reference to FIGS. 60A to 73B.

FIGS. 60A to 73B are sectional views showing the fabrication process steps of the NAND-type nonvolatile memory according to the fifth embodiment. FIGS. 60A to 60D, 62A to 62D, 64A to 64D, 66A to 66D, 68A to 68D, 70A to 70D, and 72A to 72D are sectional views taken along the lines A-A, B-B, C-C, and D-D in FIG. 57A, respectively, and FIGS. 61A and 61B, 63A and 63B, 65A and 65B, 67A and 67B, 69A and 69B, 71A and 71B, and 73A and 73B are sectional views taken along the lines E-E and F-F in FIG. 57B, respectively. Those parts identical or similar to those of the first embodiment will be denoted by the same or similar reference numerals and thus detailed descriptions thereof will be omitted.

In a manner similar to the first embodiment, a series of process steps from the step of forming the gate insulating film 21 on the semiconductor substrate 20 to the step of forming the first mask material 27 on the first gate electrode layer 22 are performed. Thereafter, as shown in FIGS. 60A to 60D and 61A to 61B, the first mask material 27 is lithographically patterned to form openings 27a and 27b that expose predetermined areas of the first lower gate electrode layers 41a and 41b.

As shown in FIGS. 62A to 62D and 63A to 63B, on the upper surfaces of the first lower gate electrode layers 41a and 41b exposed from the openings 27a and 27b and on the first mask material 27, second lower gate electrode layers 52a and 52b formed of, for example, polycrystalline silicon are formed. In this case, the upper surfaces of the second lower gate electrode layers 52a and 52b within the openings 27a and 27b are formed so as to be 20 nm or more higher than the upper surface of the first mask material 27.

As shown in FIGS. 64A to 64D and 65A to 65B, the second lower gate electrode layers 52a and 52b are polished by a CMP (Chemical Mechanical Polishing) process until the upper surface of the first mask material 27 is exposed. In this way, the second lower gate electrode layers 52a and 52b are formed in the select gate region 2 and the peripheral circuit region 3a. At this time, as a result of over-etching, the second lower gate electrode layers 52a and 52b are also removed by about 5 nm to about 10 nm.

As shown in FIGS. 66A to 66D and 67A to 67B, on the first mask material 27 and the second lower gate electrode layers 52a and 52b, a second mask material 28 formed of the same material as the first mask material 27 is formed to a thickness of about 40 nm. Subsequent process steps until the step of controlling the height of the upper surfaces of the first element isolation insulating film 14a and the second element isolation insulating films 14b and 14c as observed from the upper surface of the semiconductor substrate 20 so as to be higher than the height of the upper surfaces of the second lower gate electrode layers 52a and 52b are the same as those of the first embodiment, and thus descriptions thereof will be omitted.

Figure 68A:
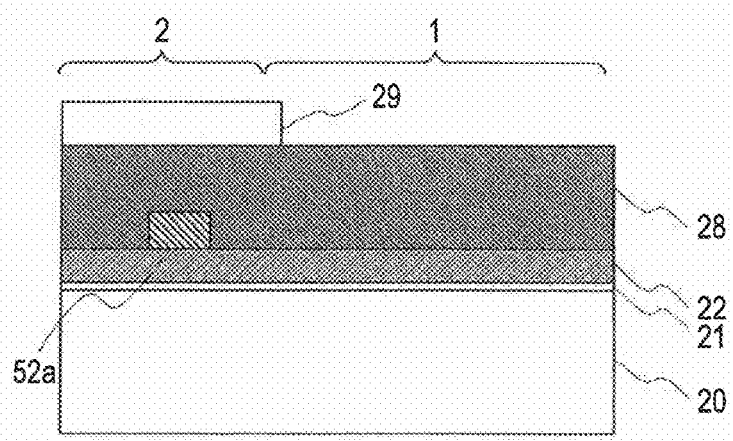
FIGS. 68A to 68D are sectional views schematically showing the fabrication process steps of the NAND-type nonvolatile memory according to the fifth embodiment, subsequent to those shown in FIGS. 66A to 66D.
Figure 68B:
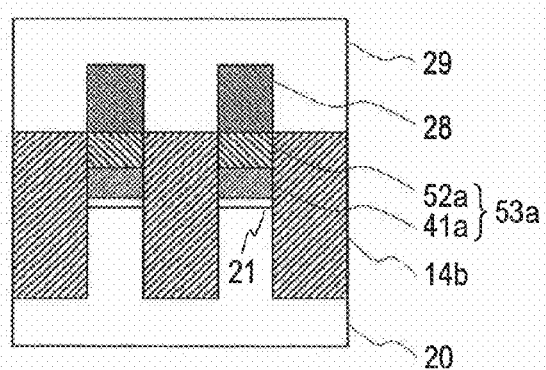
Figure 68C:
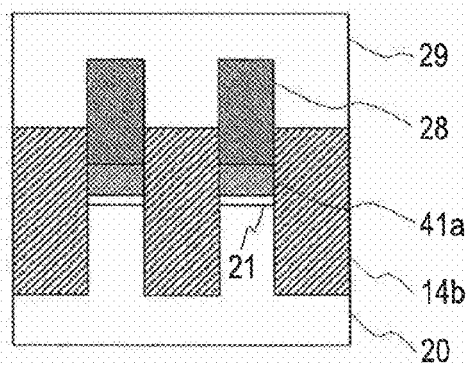
Figure 68D:
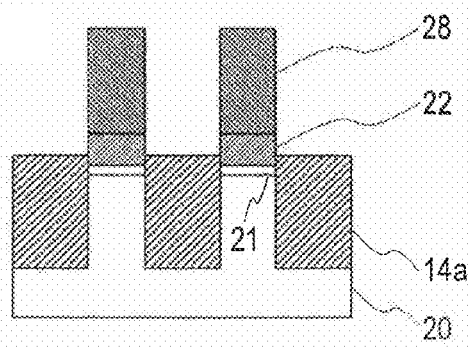
Figure 69A:
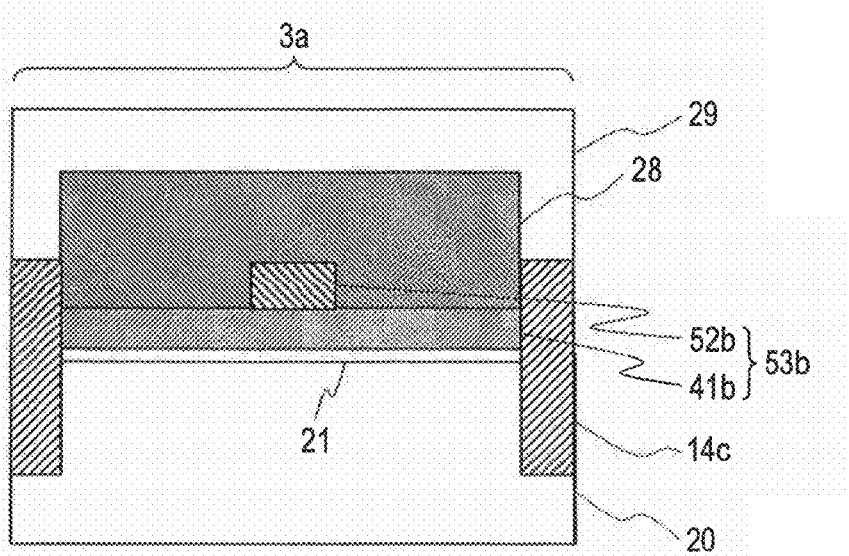
FIGS. 69A and 69B are sectional view schematically showing the fabrication process steps of the NAND-type nonvolatile memory according to the fifth embodiment, subsequent to those shown in FIGS. 67A and 67B.
Figure 69B:
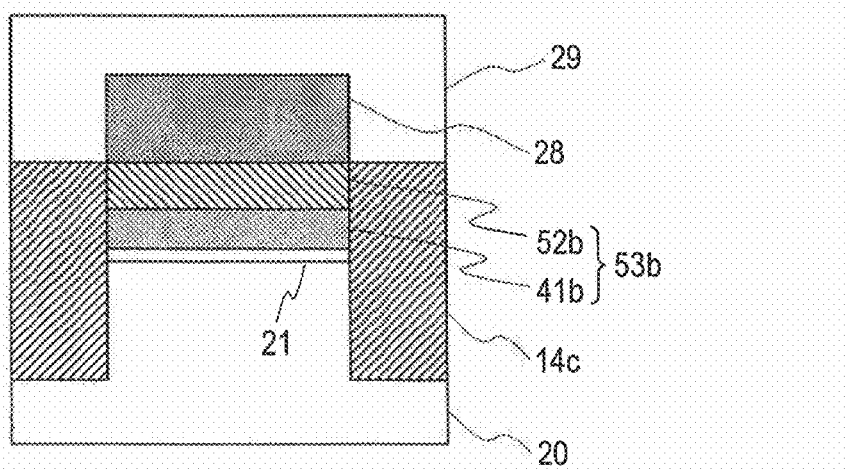
Figure 70A:
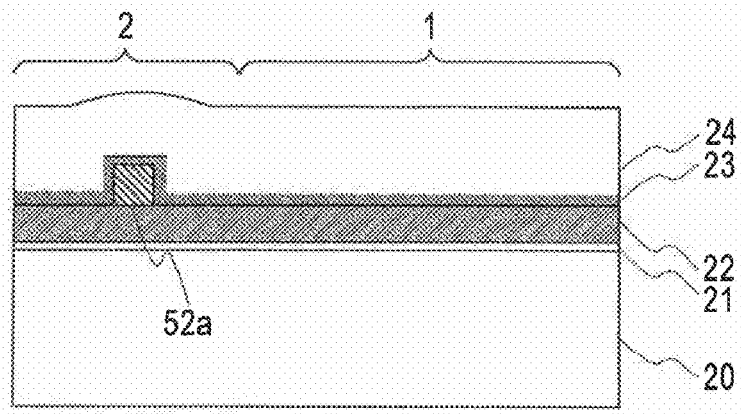
FIGS. 70A to 70D are sectional views schematically showing the fabrication process steps of the NAND-type nonvolatile memory according to the fifth embodiment, subsequent to those shown in FIGS. 68A to 68D.
Figure 70B:
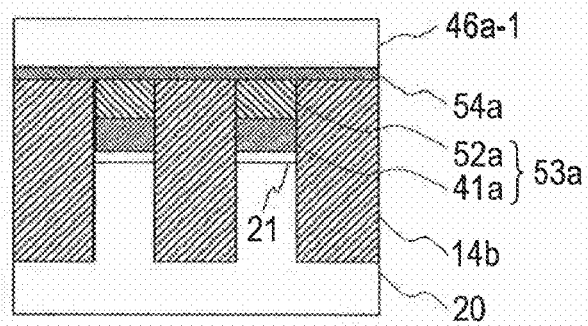
Figure 70C:
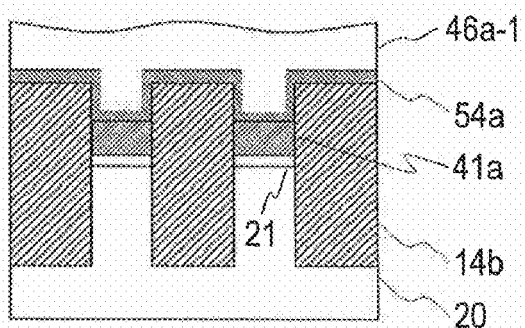
Figure 70D:
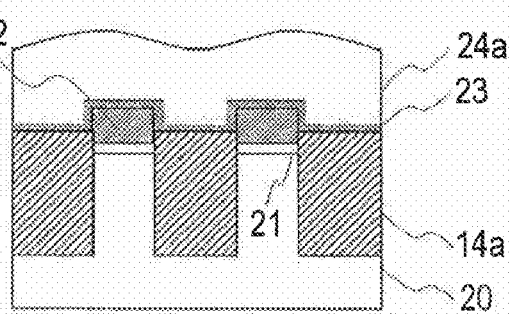
Figure 71A:
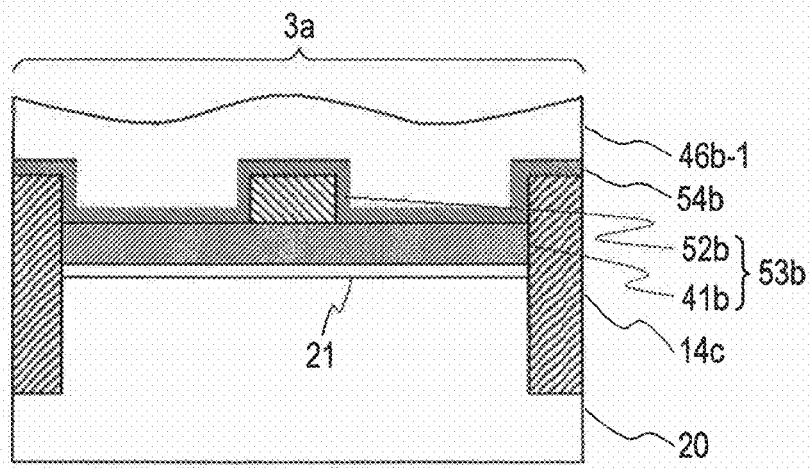
FIGS. 71A and 71B are sectional view schematically showing the fabrication process steps of the NAND-type nonvolatile memory according to the fifth embodiment, subsequent to those shown in FIGS. 69A and 69B.
Figure 71B:
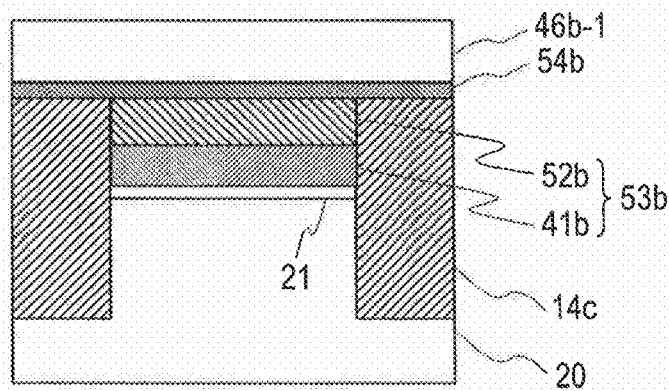

As shown in FIGS. 68A to 68D and 69A to 69B, in a state in which other areas outside the memory cell region 1 are masked with a photoresist 29, the height of the upper surface of the first element isolation insulating film 14a is made so as to be higher than the height of the upper surface of the semiconductor substrate 20 and lower than the height of the upper surface of the first gate electrode layer 22, as shown in FIG. 68D. In this case, since the second element isolation insulating films 14b and 14c are covered with the photoresist 29, their heights are not lowered.

As shown in FIGS. 70A to 70D and 71A to 71B, after removing the photoresist 29 and the second mask material 28, on the first element isolation insulating film 14a, the second element isolation insulating films 14b and 14c, the first gate electrode layer 22, and the second lower gate electrode layers 52a and 52b, the first inter-electrode insulating film 23 formed of, for example, an ONO (Oxide-Nitride-Oxide) film is formed to a thickness of about 12 nm to about 17 nm. Subsequently, on the first inter-electrode insulating film 23, the second gate electrode lower layer 24a formed of, for example, polycrystalline silicon is formed. In this case, the upper surface of the second gate electrode lower layer 24a is formed so as to be about 10 nm to about 50 nm higher than the upper surfaces of the lower gate electrode layers 53a and 53b.

Figure 72A:
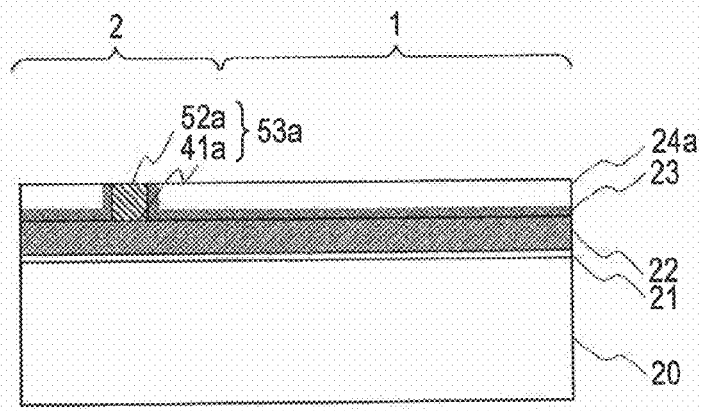
FIGS. 72A to 72D are sectional views schematically showing the fabrication process steps of the NAND-type nonvolatile memory according to the fifth embodiment, subsequent to those shown in FIGS. 70A to 70D.
Figure 72B:
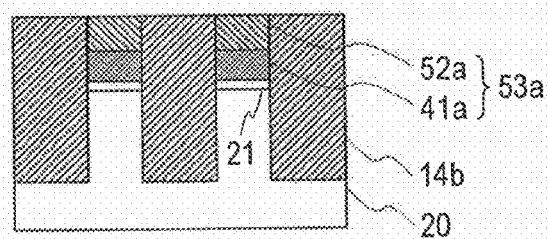
Figure 72C:
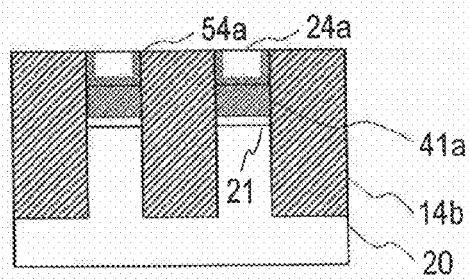
Figure 72D:
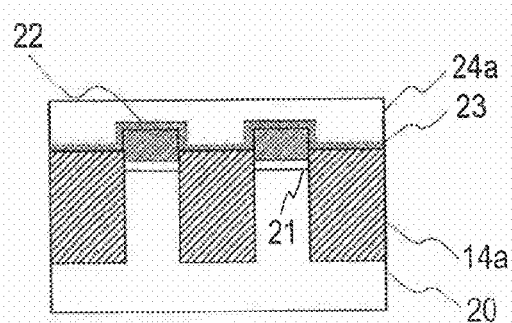
Figure 73A:
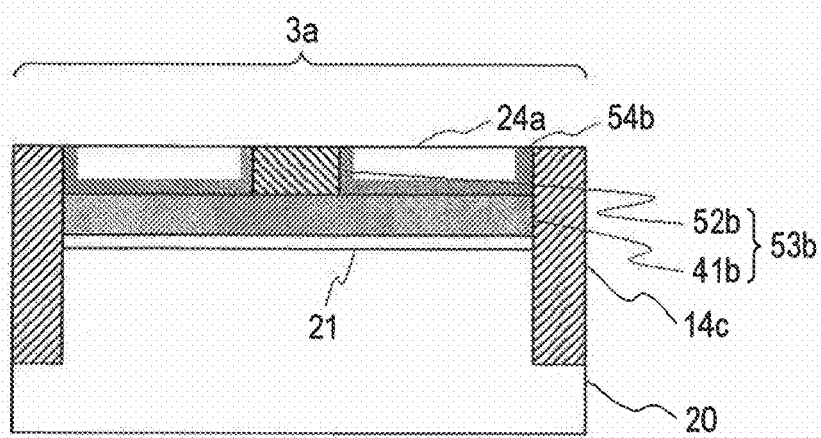
FIGS. 73A and 73B are sectional view schematically showing the fabrication process steps of the NAND-type nonvolatile memory according to the fifth embodiment, subsequent to those shown in FIGS. 71A and 71B.
Figure 73B:
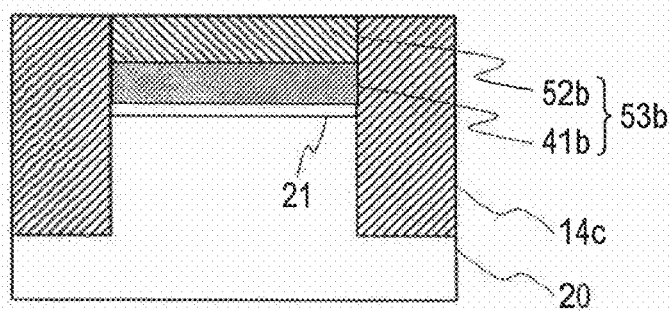

As shown in FIGS. 72A to 72D and 73A to 73B, using the second element isolation insulating films 14b and 14c as a stopper, the second gate electrode lower layer 24a and the second inter-electrode insulating films 44a and 44b formed on the upper surfaces of the second element isolation insulating films 14b and 14c of the select gate region 2 and the peripheral circuit region 3a are removed by a CMP process to expose the upper surfaces of the second element isolation insulating films 14b and 14c and the second lower gate electrode layers 52a and 52b. In this case, the first inter-electrode insulating film 23 of the memory cell region 1 shown in FIGS. 72A and 72C is not removed because the second gate electrode lower layer 24a functions as a protective film. The upper surface of the second gate electrode lower layer 24a other than the second lower gate electrode layers 42a and 42b 1 is planarized. Subsequent process steps are the same as those of the first embodiment, and thus descriptions thereof will be omitted.

In this embodiment, it is possible to provide a NAND-type nonvolatile memory having the same advantages as provided by the first embodiment.

In the etching of the second inter-electrode insulating films 54a and 54b during processing of the gate electrodes, since it is not necessary to etch the steps of the second inter-electrode insulating films 54a and 54b, it is possible to prevent etching residues of the second inter-electrode insulating films 54a and 54b.

It goes without saying that the resistor element and the capacitor element of the second and third embodiments may be applied to this embodiment.

In the select gate transistors 7, the widths of the second lower gate electrode layers 52a and 52b may be the same as the widths of the first lower gate electrode layers 41a and 41b. Moreover, in the MOS transistor, the resistor element, or the capacitor element of the peripheral circuit region, the widths of the second lower gate electrode layers 52a and 52b may be smaller than the widths of the first lower gate electrode layers 41a and 41b.

Sixth Embodiment

A sixth embodiment is directed to a NAND-type nonvolatile memory in which two MOS transistors are provided in different peripheral circuit regions, the respective gate insulating films of the MOS transistors being of different thicknesses.

Figure 74A:
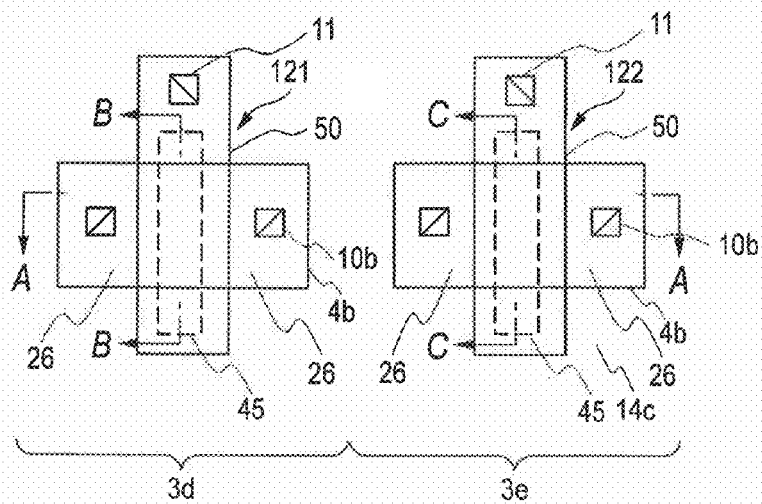
FIG. 74A is a top view schematically showing the structure of a MOS transistor according to a sixth embodiment.
Figure 74B:
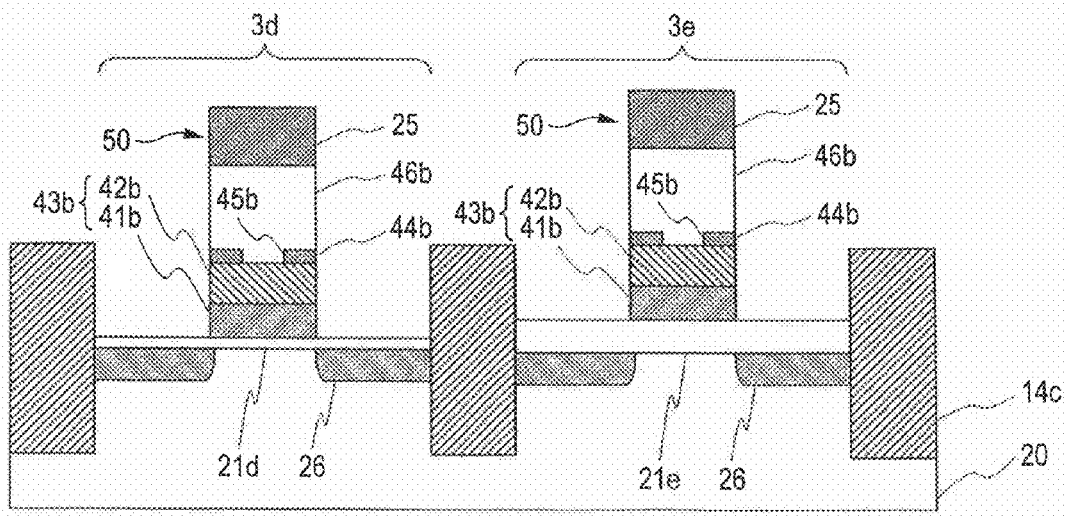
FIG. 74B is a sectional view taken along the line A-A in FIG. 74A.

FIGS. 74A and 74B are views schematically showing the structure of a MOS transistor of two different peripheral circuit regions of the NAND-type nonvolatile memory according to a sixth embodiment, in which FIG. 74A is a top view showing the structure of the MOS transistor, and FIG. 74B is a sectional view taken along the line A-A in FIG. 74A. Those parts identical or similar to those of the first embodiment will be denoted by the same or similar reference numerals, and thus only characteristic portions of this embodiment will be described.

As shown in FIG. 74A, a low-voltage MOS (LV-MOS) transistor 121 is formed in a first peripheral circuit region 3d, and a high-voltage MOS (HV-MOS) transistor 122 is formed in a second peripheral circuit region 3e. The gate insulating film 21d of the LV-MOS transistor 121 is formed to a thickness of about 50 Å to about 100 Å, which is the same as the gate insulating films 21a and 21b of the memory cell region 1 and the select gate region 3a. Meanwhile, the gate insulating film 21e of the HV-MOS transistor 122 is formed to a thickness of about 350 Å to about 450 Å, which is larger than that of the gate insulating film 21d of the LV-MOS transistor 121. Other structures are the same as those of the first embodiment.

Next, a fabrication method of the LV and HV MOS transistors in which the thickness of the gate insulating film is different will be described with reference to FIG. 75.

Figure 75A:
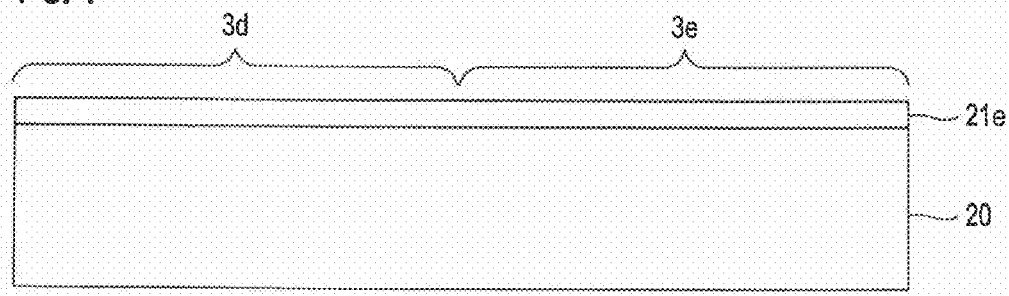
FIG. 75A is a sectional view schematically showing the fabrication process steps of the MOS transistor according to the sixth embodiment.
Figure 75B:
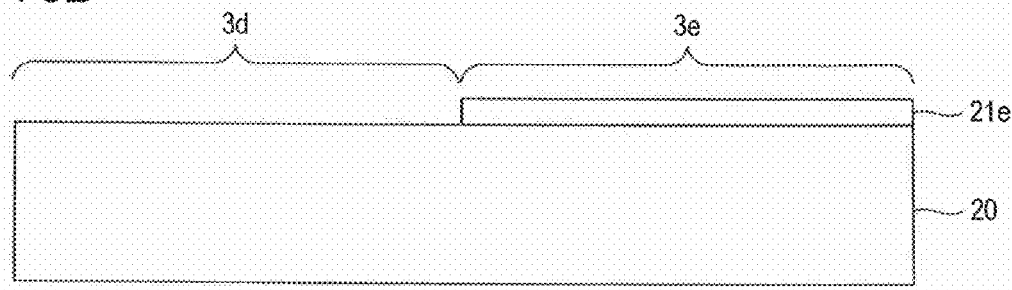
FIG. 75B is a sectional view schematically showing the fabrication process steps of the MOS transistor according to the sixth embodiment, subsequent to those shown in FIG. 75A.
Figure 75C:
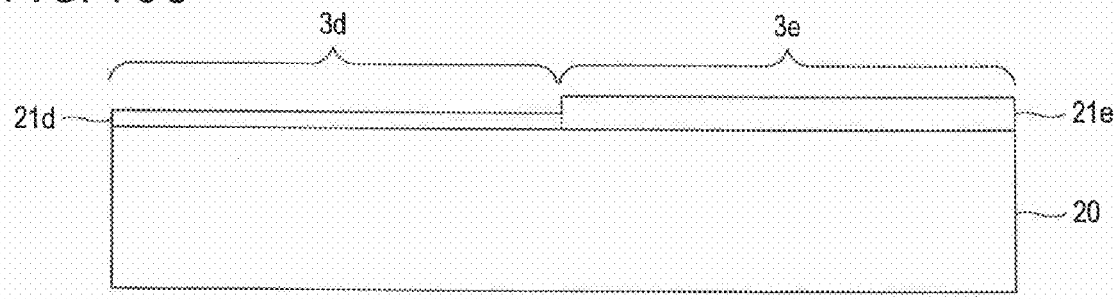
FIG. 75C is a sectional view schematically showing the fabrication process steps of the MOS transistor according to the sixth embodiment, subsequent to those shown in FIG. 75B.

FIGS. 75A to 75C are sectional views schematically showing the fabrication process steps of the LV- and HV-MOS transistors of the NAND-type nonvolatile memory according to this embodiment, taken along the line A-A in FIG. 74A. Those parts identical or similar to those of the first embodiment will be denoted by the same or similar reference numerals, and thus descriptions thereof will be omitted.

As shown in FIG. 75A, on the semiconductor substrate (for example, a silicon substrate) 20, the gate insulating film 21e formed of, for example, $SiO_2$ is formed to a thickness of about 300 Å to about 400 Å through a process such as thermal oxidation.

As shown in FIG. 75B, in a state in which the gate insulating film 21e of the peripheral circuit region 3e for forming the HV-MOS transistor 122 is covered with a photoresist (not shown), the gate insulating film 21e of the peripheral circuit region 3d for forming the LV-MOS transistor 121 is etched and removed. Thereafter, the photoresist is removed.

As shown in FIG. 75C, on the semiconductor substrate 20 of the peripheral circuit region 3d for forming the LV-MOS transistor 121, the gate insulating film 21d is formed to a thickness of about 50 Å to about 100 Å through a process such as thermal oxidation. At this time, since the peripheral circuit region 3e for forming the HV-MOS transistor 122 is also thermally oxidized, the thickness of the gate insulating film 21e of the peripheral circuit region 3e for forming the HV-MOS transistor 122 becomes about 350 Å to about 450 Å. The above-described process steps may be repeated when it is desired to form three or more different gate insulating films.

Subsequent process steps are the same as those of the first embodiment, and thus descriptions thereof will be omitted.

The height of the upper surface of the second lower gate electrode layer 42b of the HV-MOS transistor 122 as observed from the upper surface of the semiconductor substrate 20 is higher than the height of the upper surface of the second lower gate electrode layer 42b of the LV-MOS transistor 121 as observed from the upper surface of the semiconductor substrate 20. Therefore, it is preferable to control the upper surface of the second element isolation insulating film 14c of the LV-MOS transistor 121 to be aligned with the upper surface of the second lower gate electrode layer 42b of the HV-MOS transistor 122.

This embodiment can provide the same advantages as provided by the first embodiment. It goes without saying that the resistor element of the second embodiment or the capacitor element of the third embodiment may be applied to this embodiment.

The peripheral circuit region 3d for forming the LV-MOS transistor and the peripheral circuit region 3e for forming the HV-MOS transistor may be provided in a single active area, and additionally, a plurality of MOS transistors may be provided in the single active area.

The thickness of the gate insulating film of the memory cell transistors 6 may be different from the thickness of the gate insulating film of the select gate transistors 7.

The upper surface of the second element isolation insulating film 14c of the HV-MOS transistor may be aligned with the upper surface of the second lower gate electrode layer 42b of the LV-MOS transistor.

The second lower gate electrode layer may be formed in only one of the HV-MOS transistor and the LV-MOS transistor, and alternatively, the second lower gate electrode layer may be formed only in the select gate transistors.

Seventh Embodiment

A seventh embodiment is directed to the case in which the present invention is applied to a NOR-type nonvolatile memory.

Figure 76A:
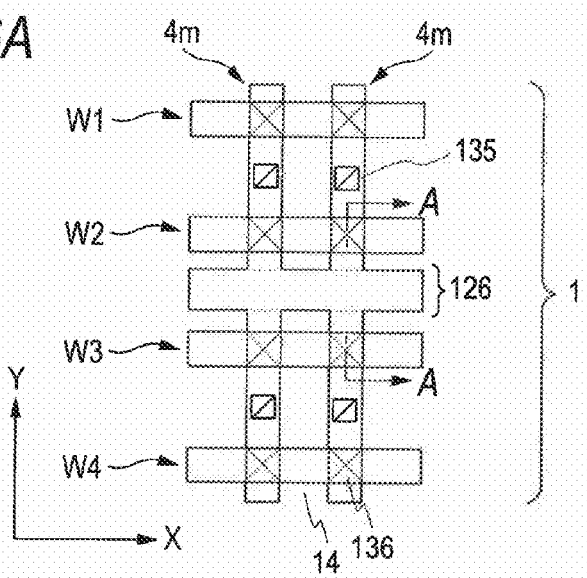
FIG. 76A is a top view schematically showing the structure of a memory cell region of a NOR-type nonvolatile memory according to a seventh embodiment.
Figure 76B:
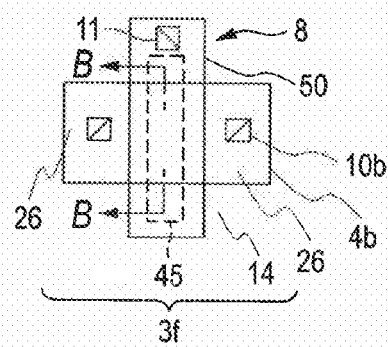
FIG. 76B is a top view schematically showing the structure of a MOS transistor having a single-layer gate structure of a peripheral circuit region of the NOR-type nonvolatile memory according to the seventh embodiment.
Figure 76C:
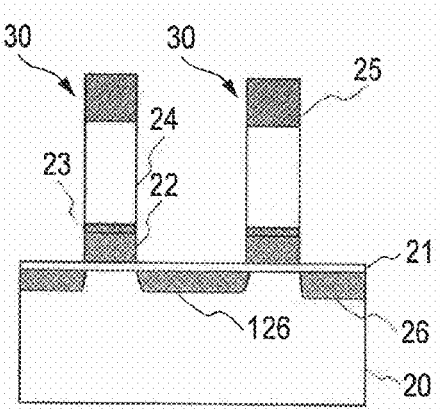
FIG. 76C is a sectional view taken along the line A-A in FIG. 76A.
Figure 76D:
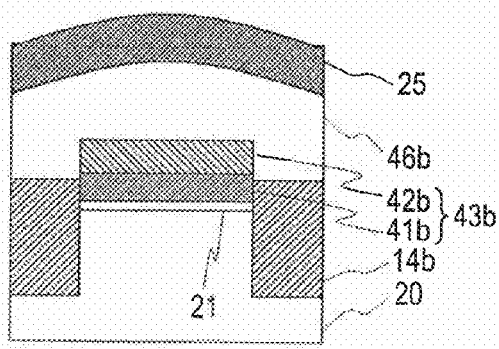
FIG. 76D is a sectional view taken along the line B-B in FIG. 76B.

FIGS. 76A to 76D are views schematically showing the structure of a memory cell region of the NOR-type nonvolatile memory according to the seventh embodiment, in which FIG. 76A is a top view of the memory cell, FIG. 76B is a top view showing the structure of a MOS transistor of a peripheral circuit region, FIG. 76C is a sectional view taken along the line A-A in FIG. 76A, and FIG. 76D is a sectional view taken along the line B-B in FIG. 76B. Those parts identical or similar to those of the first embodiment will be denoted by the same or similar reference numerals and thus detailed descriptions thereof will be omitted.

As shown in FIG. 76A, in the memory cell region 1, a plurality of lines of word lines W1, W2, . . . , and W4 is parallely arranged in stripes along the X direction in the drawing, and a plurality of lines of active areas 4m serving as an element forming region is parallely arranged along the Y direction in the drawing with an element isolation insulating film 14 interposed between adjacent lines. The active areas 4m are combine with each other at an area between the word line W2 and the word line W3; the area where the active areas 4m combine with each other is referred to as a source region 126. At each intersection of the active areas 4m and the word lines W1, W2, . . . , and W4, perpendicular to the Y direction, a memory cell transistor 136 is formed. Between the word lines W1 and W2, and between the word lines W3 and W4, contacts 135 that connect the memory cell transistors 136 to bit lines (not shown) are disposed.

Although this embodiment describes and illustrates four word lines, a larger number of word lines, for example, 16, 32, or more may be provided. Similarly, the number of active areas 4m may be larger than two.

As shown in FIGS. 76B and 76C, the structure of the MOS transistor 8 of a peripheral circuit region 3f is the same as that of the MOS transistor of the peripheral circuit region of the NAND-type nonvolatile memory according to the first embodiment, and thus descriptions thereof will be omitted.

As shown in FIGS. 76C and 76D, the memory cell transistor 136 of the NOR-type nonvolatile memory is constructed in a double-layer gate structure in the same manner as the memory cell transistor 6 of the NAND-type nonvolatile memory of the first embodiment. Meanwhile, the MOS transistor of the peripheral circuit region 3f is constructed in a single-layer gate structure in the same manner as the MOS transistor 8 of the peripheral circuit region 3a of the first embodiment.

According to the embodiment, the present invention may be applied to the NOR-type nonvolatile memory as well as the NAND-type nonvolatile memory. Similarly, the present invention may be applied to nonvolatile memories of various types such as AND or DiNOR.

It goes without saying that the resistor element of the second embodiment and the capacitor element of the second third embodiments may be applied to this embodiment.

According to an aspect of the present invention, it is possible to prevent the element isolation insulating film from being lower than the surface of the semiconductor substrate and to thus prevent short-circuiting of the gate electrode and the semiconductor substrate when removing the natural oxide film on the exposed surface of the lower gate electrode layer or when removing the floating gate electrode layer.

What is claimed is:

1. A semiconductor memory device comprising:
   a semiconductor substrate having:
      first device regions on which circuit elements having a double-layer gate structure is formed, and
      second device regions on which circuit elements having a single-layer gate structure is formed;
   first element isolation insulating films that divide the first device regions with one another;
   second element isolation insulating films that divide the second device regions with one another;
   a gate insulating film formed on the semiconductor substrate;
   a first circuit element including:
      a first gate electrode layer formed on the gate insulating film in the first device regions,
      a first inter-electrode insulating film formed on the first gate electrode layer and on the first element isolation insulating films, and
      a second gate electrode layer formed on the first inter-electrode insulating film; and
   a second circuit element including:
      a third gate electrode layer formed on the gate insulating film in the second device regions,
      a second inter-electrode insulating film formed on the third gate electrode layer, and
      a fourth gate electrode layer formed on the third gate electrode layer and on the second element isolation insulating films;
   wherein, in a direction perpendicular to a main surface of the semiconductor substrate, a thickness of the third gate electrode layer from the gate insulating film to the second inter-electrode insulating film is larger than a thickness of the first gate electrode layer from the gate insulating film to the first inter-electrode insulating film, and
   wherein the gate insulating film is formed completely on a single plane parallel to a surface of the semiconductor substrate between source/drain regions of the second circuit element.

2. The semiconductor memory device according to claim 1, wherein an upper surface of the second element isolation insulating films is higher than an upper surface of the semiconductor substrate in the second device regions.

3. The semiconductor memory device according to claim 1, wherein the second inter-electrode insulating film is formed on the second element isolation insulating films and underneath the fourth gate electrode layer and has an opening that exposes at least part of the third gate electrode layer and at least part of the second element isolation insulating films; and
   wherein the third gate electrode layer and the fourth gate electrode layer are electrically connected through the opening.

4. The semiconductor memory device according to claim 3, wherein an upper surface of the second element isolation insulating films is higher than an upper surface of the semiconductor substrate in the second device regions.

5. The semiconductor memory device according to claim 4, wherein an exposed surface of the second element isolation insulating films exposed through the opening is lower than an upper surface of the third gate electrode layer.

6. The semiconductor memory device according to claim 5, wherein the third gate electrode layer includes:
   a lower third gate electrode layer, and
   an upper third gate electrode layer formed on the lower third gate electrode layer.

7. The semiconductor memory device according to claim 3, wherein the third gate electrode layer includes:
   a lower third gate electrode layer, and
   an upper third gate electrode layer formed on the lower third gate electrode layer.

8. The semiconductor memory device according to claim 7, wherein a width of the upper third gate electrode layer is smaller than a width of the lower third gate electrode layer; and
   wherein the second inter-electrode insulating film is formed on upper surfaces of the lower third gate electrode layer and on side surfaces of the upper third gate electrode layer.

9. The semiconductor memory device according to claim 1, wherein the first circuit element forms a memory cell transistor of a NAND-type flash memory; and
   wherein the second circuit element forms a select gate transistor and a peripheral circuit element of the NAND-type flash memory.

10. The semiconductor memory device according to claim 1, wherein an upper surface of the third gate electrode layer is positioned higher than an upper surface of the first gate electrode layer.

11. The semiconductor memory device according to claim 1, wherein a bottom surface of the third gate electrode layer is positioned at substantially the same level with a bottom surface of the first gate electrode layer.

12. A semiconductor memory device comprising:
   a semiconductor substrate;
   a gate insulating film formed on the semiconductor substrate;
   a double-layer gate electrode including:
   a first gate electrode that has a first thickness in a direction perpendicular to a main surface of the semiconductor substrate, and that is formed on the gate insulating film, the first thickness being from the gate insulating film to a first inter-electrode insulating film,
   the first inter-electrode insulating film formed on the first gate electrode, and
   a second gate electrode formed on the first inter-electrode insulating film; and
   a single-layer gate electrode including:
   a third gate electrode that is formed on the gate insulating film and that has a second thickness in a direction perpendicular to a main surface of the semiconductor substrate, said second thickness being larger than the first thickness and being from the gate insulating film to a second inter-electrode insulating film,
   the second inter-electrode insulating film formed on the third gate electrode, and
   a fourth gate electrode formed on the third gate electrode,
   wherein the gate insulating film is formed completely on a single plane parallel to a surface of the semiconductor substrate between source/drain regions.

13. The semiconductor memory device according to claim 12, wherein the third gate electrode includes:
   a lower third gate electrode having the first thickness, and
   an upper third gate electrode formed on the lower third gate electrode.

14. The semiconductor memory device according to claim 12, wherein the second inter-electrode insulating film is formed between the third gate electrode and the fourth gate electrode and has an opening that exposes at least part of the third gate electrode; and
   wherein the third gate electrode and the fourth gate electrode are connected through the opening.

15. The semiconductor memory device according to claim 12, wherein the third gate electrode comprises:
   a lower third gate electrode, and
   an upper third gate electrode that is formed on the lower third gate electrode and that has a width smaller than that of the lower third gate electrode; and
   wherein the second inter-electrode insulating film is formed on upper surfaces of the lower third gate electrode layer and on side surfaces of the upper third gate electrode layer.

16. The semiconductor memory device according to claim 12 further comprising:
   an element isolation insulating film that is in contact with a side surface of the third gate electrode and that has an upper surface higher than an upper surface of the semiconductor substrate and lower than an upper surface of the third gate electrode.

* * * * *